United States Patent
Kim et al.

(10) Patent No.: US 9,832,056 B2
(45) Date of Patent: *Nov. 28, 2017

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG Electronics Inc., Seoul (KR)

(72) Inventors: Jinwoo Kim, Seoul (KR); Jaehyung Kim, Seoul (KR); Sungryong Hong, Seoul (KR); Jaeho Hwang, Seoul (KR); Jongwoong Shin, Seoul (KR); Woosuk Ko, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/379,150

(22) Filed: Dec. 14, 2016

(65) Prior Publication Data

US 2017/0099171 A1    Apr. 6, 2017

Related U.S. Application Data

(63) Continuation of application No. 15/041,865, filed on Feb. 11, 2016, now Pat. No. 9,559,807, which is a
(Continued)

(51) Int. Cl.
*H04L 27/26*     (2006.01)
*H04L 5/00*      (2006.01)
(Continued)

(52) U.S. Cl.
CPC ........ *H04L 27/2602* (2013.01); *H04L 1/0013* (2013.01); *H04L 1/0041* (2013.01);
(Continued)

(58) Field of Classification Search
CPC . H04L 5/0053; H04L 27/2601; H04L 1/0061; H04L 1/0013; H04L 1/0042
See application file for complete search history.

(56) References Cited

U.S. PATENT DOCUMENTS 9,049,003 B2    6/2015  Eriksson et al.
2007/0286066 A1  12/2007  Zhang et al.
(Continued)

FOREIGN PATENT DOCUMENTS

EP      2557717 A1        2/2013
JP      2007-150971 A     6/2007
(Continued)

*Primary Examiner* — Dac Ha
(74) *Attorney, Agent, or Firm* — Dentons US LLP

(57) ABSTRACT

A method and an apparatus for transmitting broadcast signals thereof are disclosed. The apparatus for transmitting broadcast signals comprises an encoder for encoding service data corresponding to each of a plurality of data transmission units, an encoder for encoding physical signaling data by a shortening scheme and a puncturing scheme, a mapper for mapping the encoded service data onto constellations, a frame builder for building at least one signal frame including preamble data, a modulator for modulating the at least one signal frame by an OFDM (Orthogonal Frequency Division Multiplex) scheme, a transmitter for transmitting the broadcast signals carrying the at least one modulated signal frame.

12 Claims, 43 Drawing Sheets

Related U.S. Application Data continuation of application No. 14/322,421, filed on Jul. 2, 2014, now Pat. No. 9,294,247.

(60) Provisional application No. 61/843,057, filed on Jul. 5, 2013, provisional application No. 61/843,855, filed on Jul. 8, 2013.

(51) Int. Cl.
| | |
|---|---|
| *H04L 1/00* | (2006.01) |
| *H03M 13/09* | (2006.01) |
| *H03M 13/11* | (2006.01) |
| *H03M 13/15* | (2006.01) |

(52) U.S. Cl.
CPC .......... *H04L 1/0071* (2013.01); *H04L 5/0023* (2013.01); *H04L 5/0053* (2013.01); *H03M 13/09* (2013.01); *H03M 13/1102* (2013.01); *H03M 13/152* (2013.01); *H04L 1/0058* (2013.01); *H04L 1/0061* (2013.01)

(56) References Cited

U.S. PATENT DOCUMENTS

| | | |
|---|---|---|
| 2008/0089408 A1 | 4/2008 | Choi et al. |
| 2009/0203326 A1 | 8/2009 | Vesma et al. |
| 2010/0226269 A1* | 9/2010 | Chakraborty ......... H04L 5/0007 370/252 |
| 2010/0226426 A1 | 9/2010 | Tupala et al. |
| 2010/0257570 A1 | 10/2010 | Song et al. |
| 2011/0131464 A1 | 6/2011 | Ko et al. |
| 2011/0274211 A1 | 11/2011 | Ko et al. |
| 2012/0089890 A1 | 4/2012 | Palanki et al. |
| 2012/0243600 A1 | 9/2012 | Jeong et al. |
| 2012/0290887 A1 | 11/2012 | Jeong et al. |
| 2012/0300690 A1 | 11/2012 | Vare et al. |
| 2013/0051372 A1 | 2/2013 | Gutierrez et al. |
| 2014/0269873 A1* | 9/2014 | Tahir .................. H04W 52/241 375/227 |
| 2016/0013831 A1 | 1/2016 | Lea et al. |

FOREIGN PATENT DOCUMENTS

| | | |
|---|---|---|
| JP | 2011-071990 A | 4/2011 |
| JP | 2013511237 A | 3/2013 |
| WO | 2012036429 A2 | 3/2012 |
| WO | 2012/157281 A1 | 11/2012 |
| WO | 2012152589 A1 | 11/2012 |
| WO | 2013032156 A1 | 3/2013 |

* cited by examiner

FIG. 38
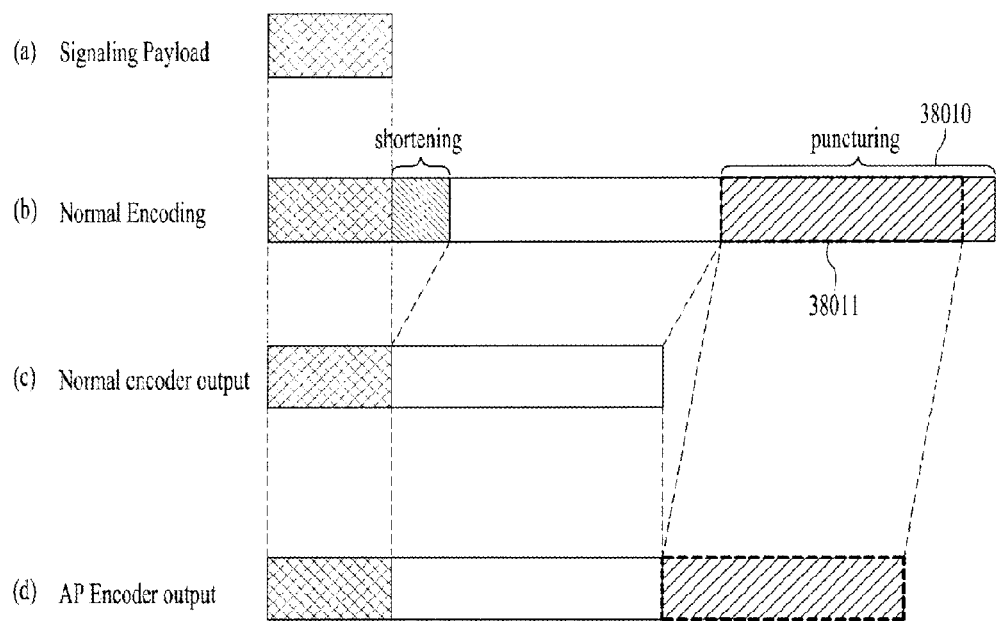
 Effective data portion in LDPC Code
 Shortening portion in LDPC Code
 Puncturing data portion in LDPC Code

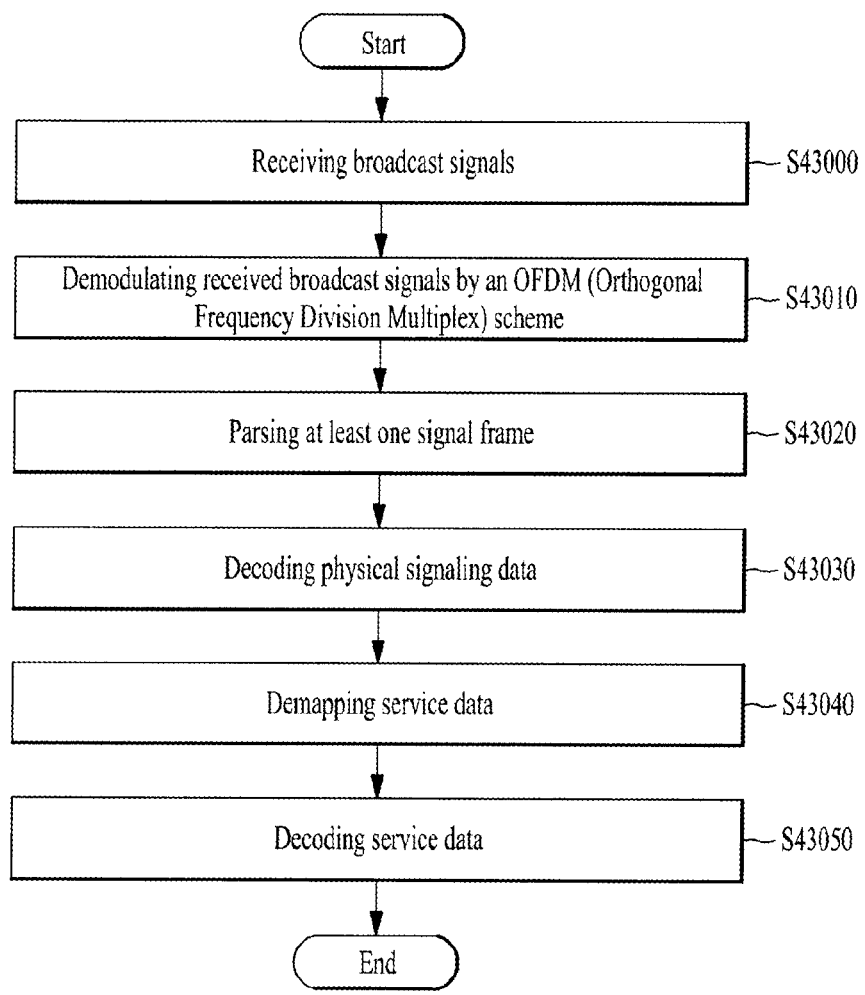

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application is a continuation of application Ser. No. 15/041,865, filed Feb. 11, 2016, which is a continuation of application Ser. No. 14/322,421, filed Jul. 2, 2014, now U.S. Pat. No. 9,294,247, issued Mar. 22, 2016, which claims the benefit of U.S. Provisional Application No. 61/843,057, filed on Jul. 5, 2013 and 61/843,855, filed on Jul. 8, 2013 in US the entire contents of which is hereby incorporated by reference in its entirety.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, a method for transmitting broadcast signals comprises encoding service data corresponding to each of a plurality of data transmission units, wherein each of the data transmission unit carries at least one service component, encoding physical signaling data by a shortening scheme and a puncturing scheme, wherein the physical signaling data is encoded based on a code rate and a value of the code rate is determined based on a size of the physical signaling data, mapping the encoded service data onto constellations, building at least one signal frame including preamble data, the encoded physical signaling data and the mapped service data, modulating the at least one signal frame by an OFDM (Orthogonal Frequency Division Multiplex) scheme, transmitting the broadcast signals carrying the at least one modulated signal frame.

Advantageous Effects

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

FIG. 38 illustrates a procedure for encoding adaptation parity according to another embodiment of the present invention.

FIG. 43 illustrates a flowchart of a broadcast signal reception method according to another embodiment of the present invention.

DETAILED DESCRIPTION OF THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The apparatuses and methods for transmitting according to an embodiment of the present invention may be categorized into a base profile for the terrestrial broadcast service, a handheld profile for the mobile broadcast service and an advanced profile for the UHDTV service. In this case, the base profile can be used as a profile for both the terrestrial broadcast service and the mobile broadcast service. That is, the base profile can be used to define a concept of a profile which includes the mobile profile. This can be changed according to intention of the designer.

The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 1:
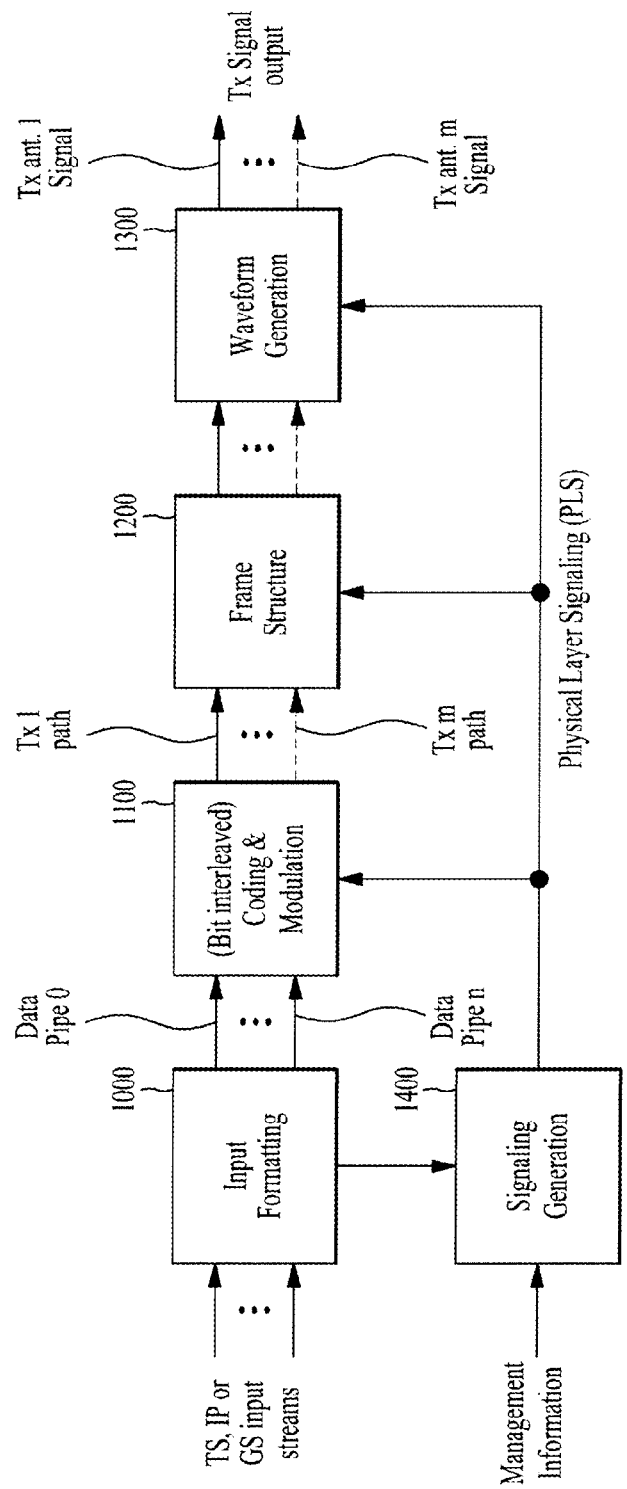
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component(s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 2:
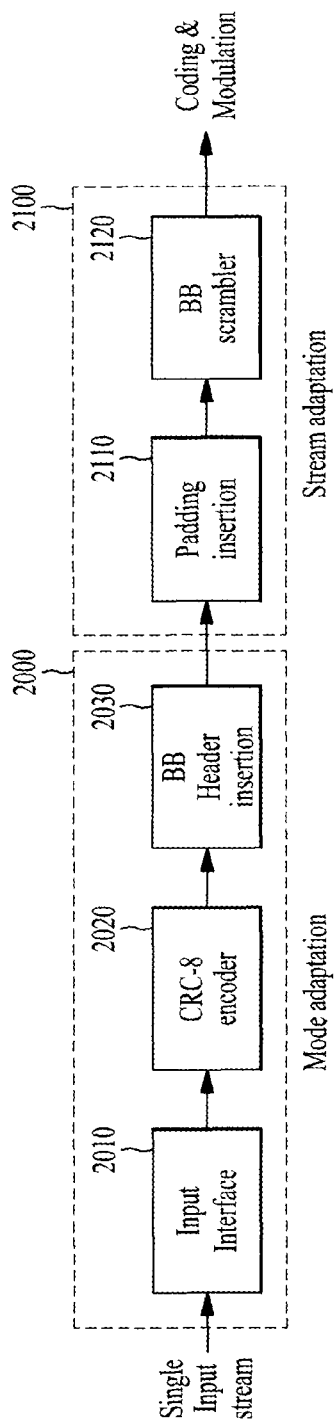
FIG. 2 illustrates an input formatting module according to an embodiment of the present invention.
Figure 3:
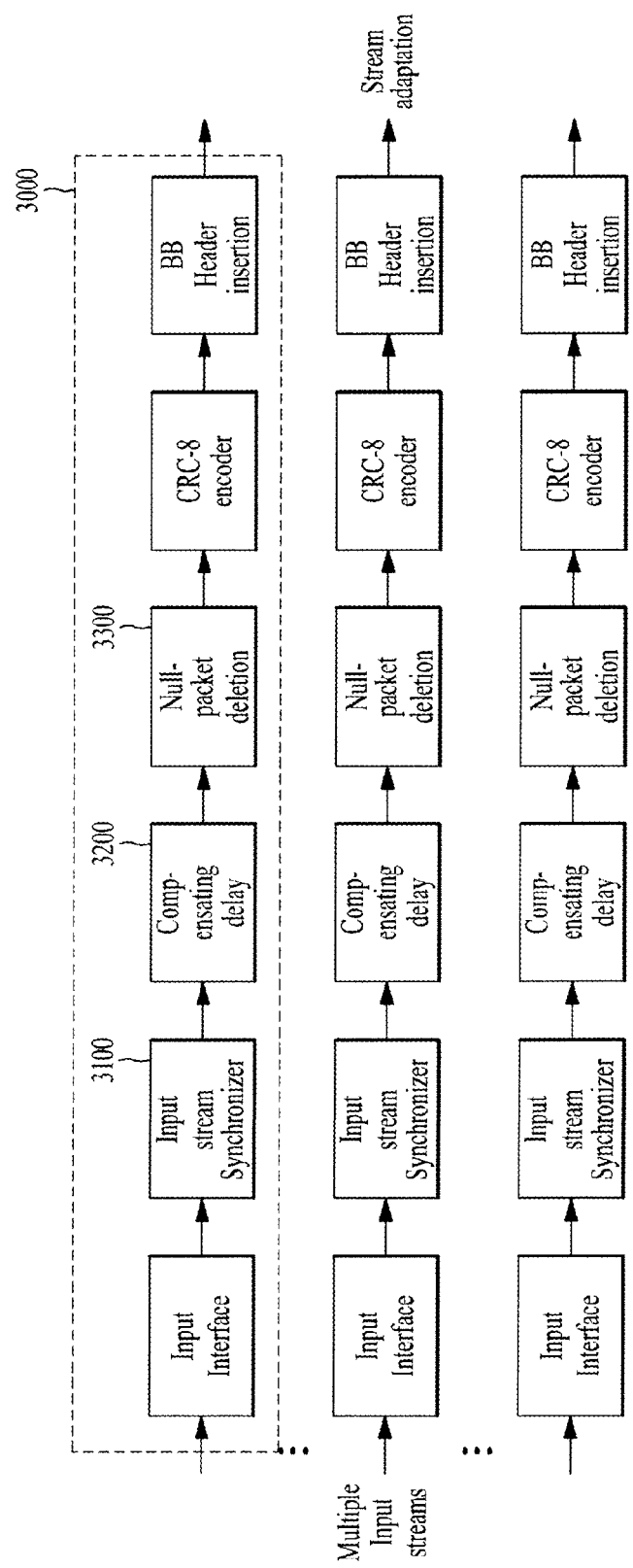
FIG. 3 illustrates an input formatting module according to another embodiment of the present invention.
Figure 4:
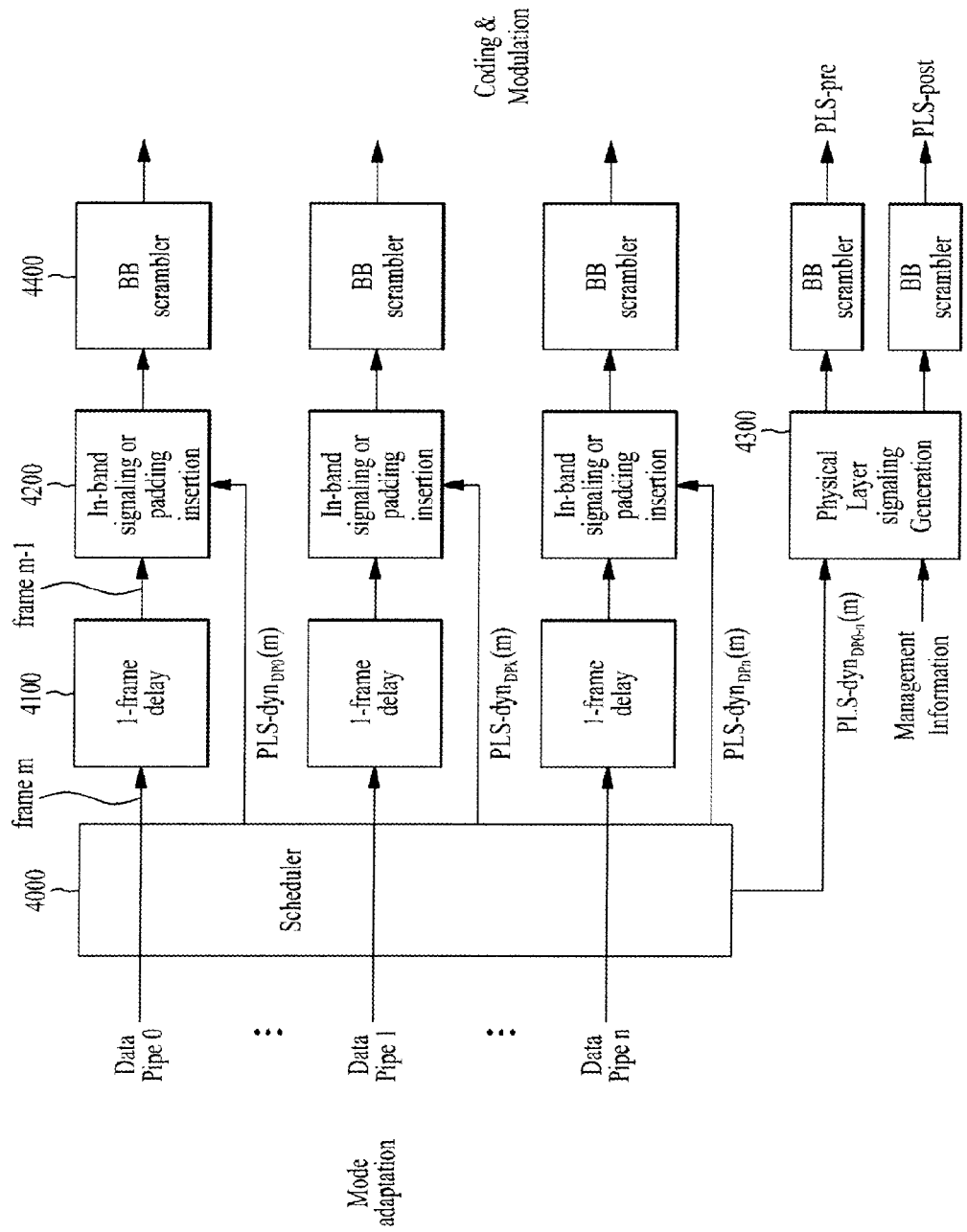
FIG. 4 illustrates an input formatting module according to another embodiment of the present invention.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

Figure 5:
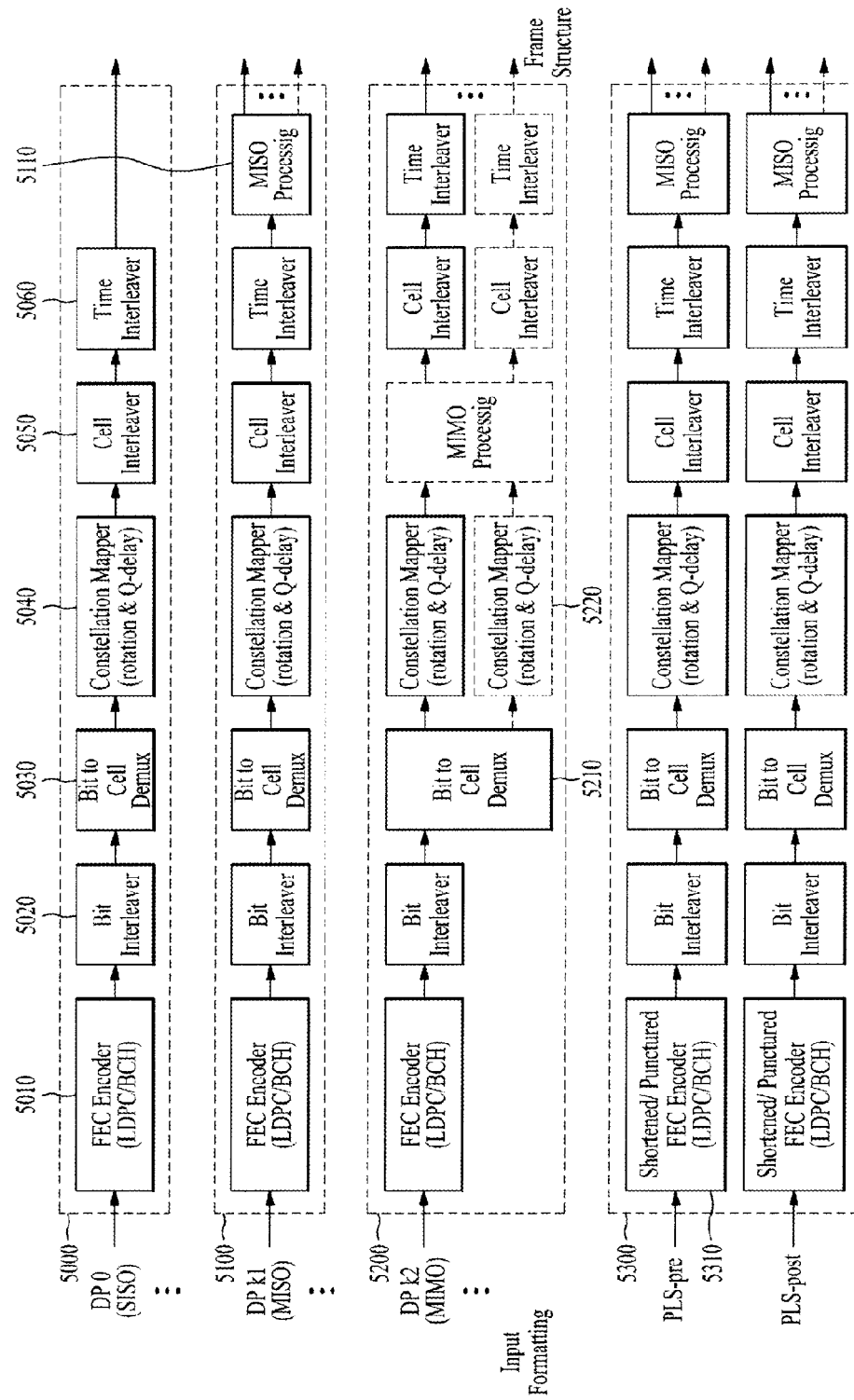
FIG. 5 illustrates a coding & modulation module according to an embodiment of the present invention.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design.

That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

In addition, the bit interleaver block 5020 is located between the FEC encoder block 5010 and the constellation mapper block 5040 and can connect output bits of LDPC encoding performed by the FEC encoder block 5010 to bit positions having different reliability values and optimal values of the constellation mapper in consideration of LDPC decoding of the apparatus for receiving broadcast signals. Accordingly, the hit-to-cell demux block 5030 can be replaced by a block having a similar or equal function.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

In addition, the constellation mapper block 5040 can move constellation points on a two-dimensional plane in order to find optimal constellation points. Through this process, capacity of the coding & modulation module 1100 can be optimized. Furthermore, the constellation mapper block 5040 can perform the above-described operation using IQ-balanced constellation points and rotation. The constellation mapper block 5040 can be replaced by a block having a similar or equal function.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

Figure 6:
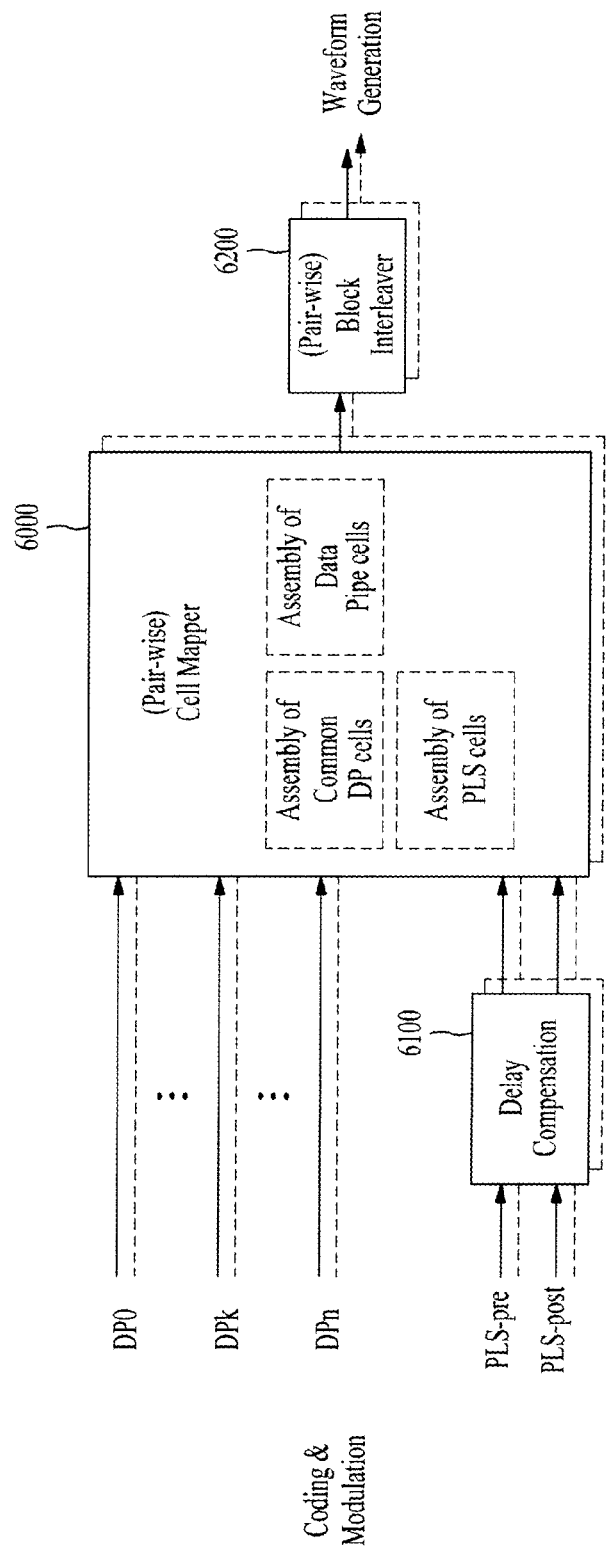
FIG. 6 illustrates a frame structure module according to an embodiment of the present invention.

FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map the unit to a frame. Accordingly, paired cells in an input path corresponding to an output path of each antenna can be allocated to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

As illustrated in FIG. 6, the frame structure module can output at least one signal frame to the waveform generation module.

Figure 7:
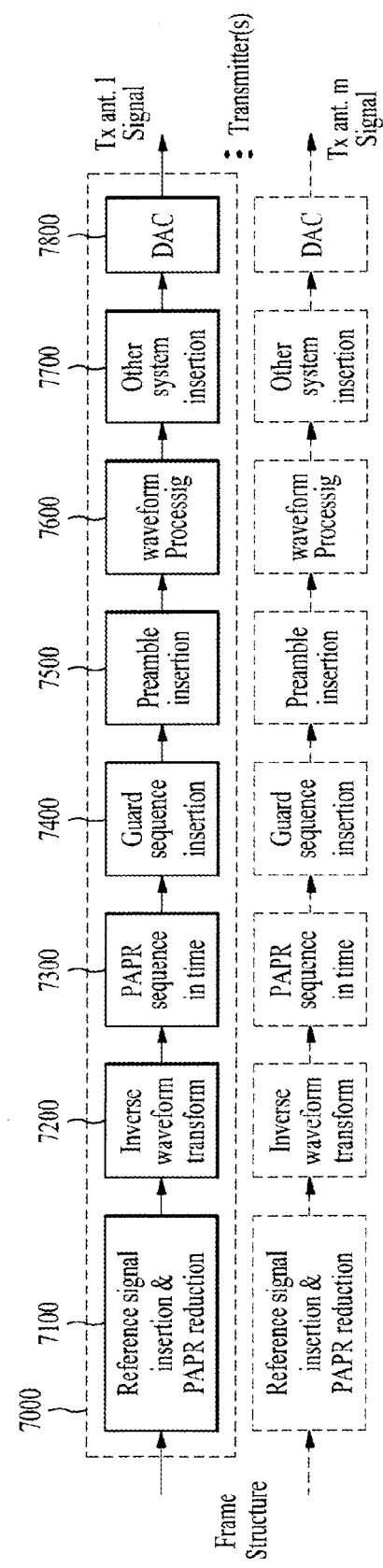
FIG. 7 illustrates a waveform generation module according to an embodiment of the present invention.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 8:
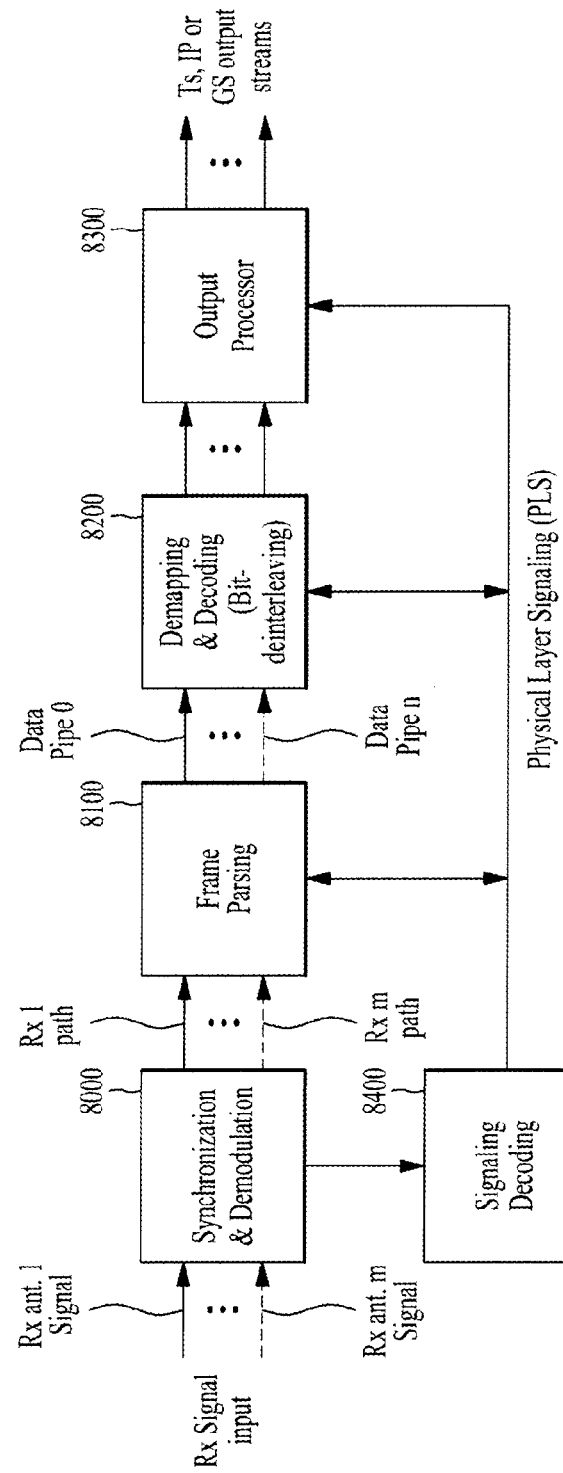
FIG. 8 illustrates a structure of an apparatus for receiving broadcast signals for future broadcast services according to an embodiment of the present invention.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 9:
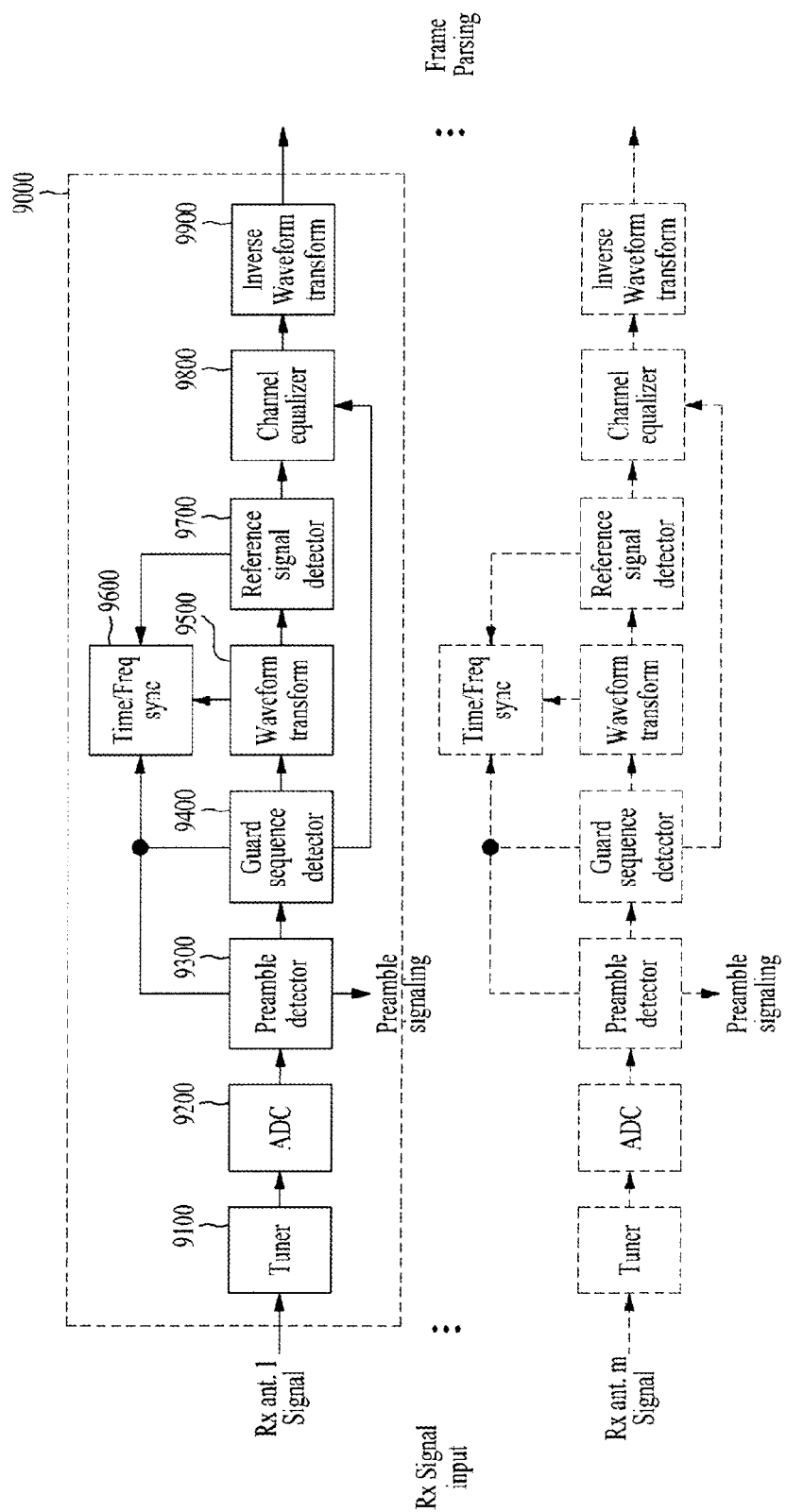
FIG. 9 illustrates a synchronization & demodulation module according to an embodiment of the present invention.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 10:
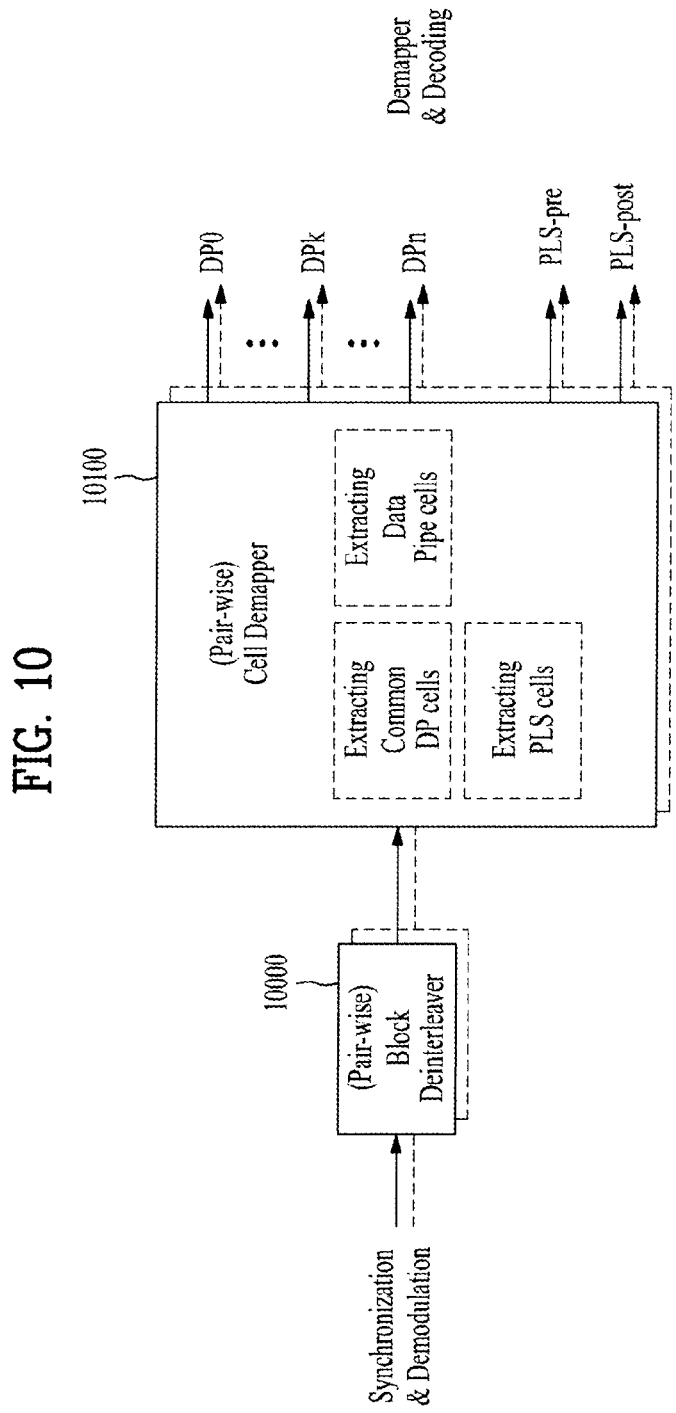
FIG. 10 illustrates a frame parsing module according to an embodiment of the present invention.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As shown in FIG. 10, the frame parsing module according to an embodiment of the present invention can include at least one block deinterleaver 10000 and at least one cell demapper 10100.

The block deinterleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 8, the block deinterleaver 10000 can process two consecutive pieces of data as a pair for each input path. Accordingly, the block interleaver 10000 can output two consecutive pieces of data even when deinterleaving has been performed. Furthermore, the block deinterleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 11:
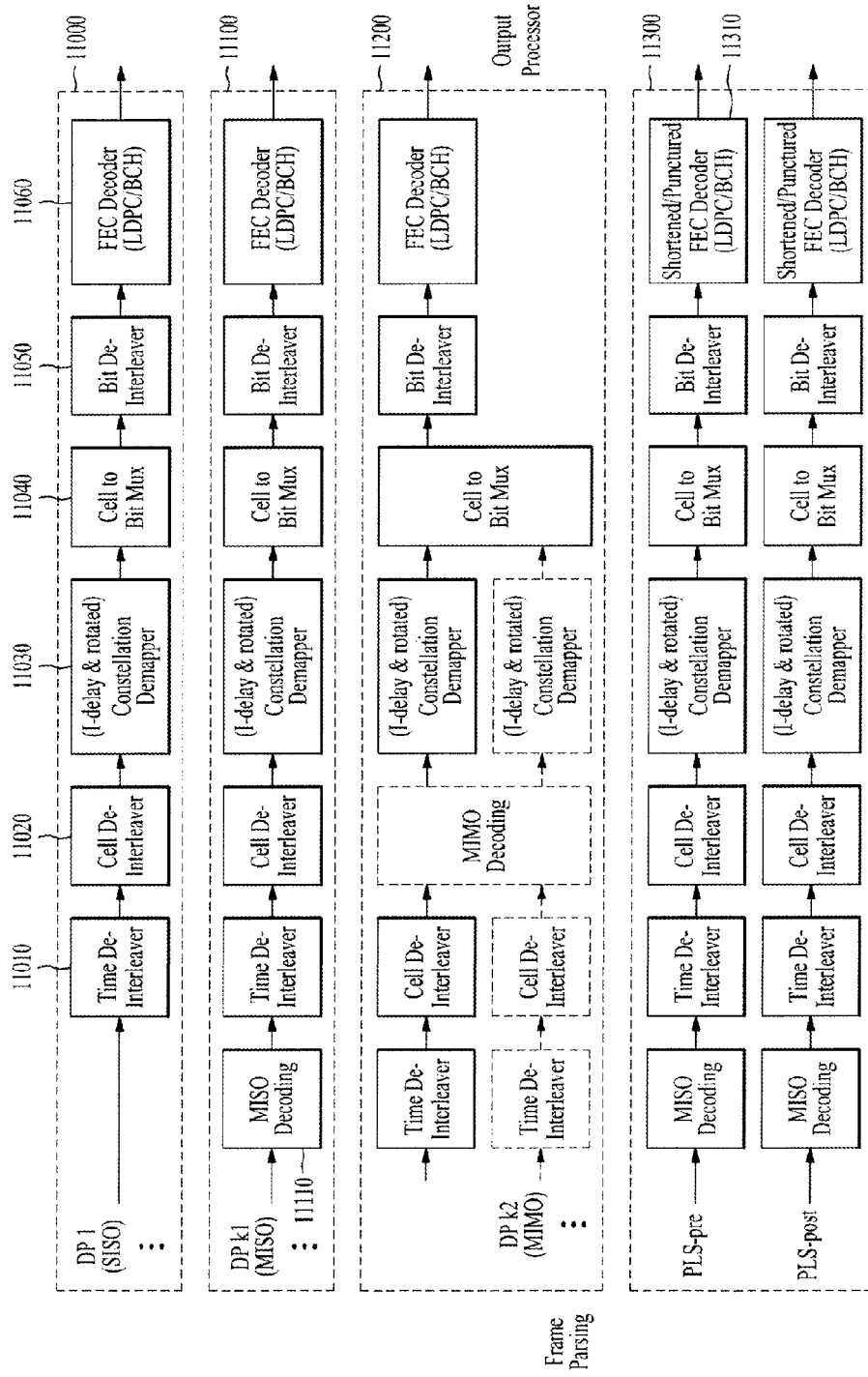
FIG. 11 illustrates a demapping & decoding module according to an embodiment of the present invention.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

Figure 12:
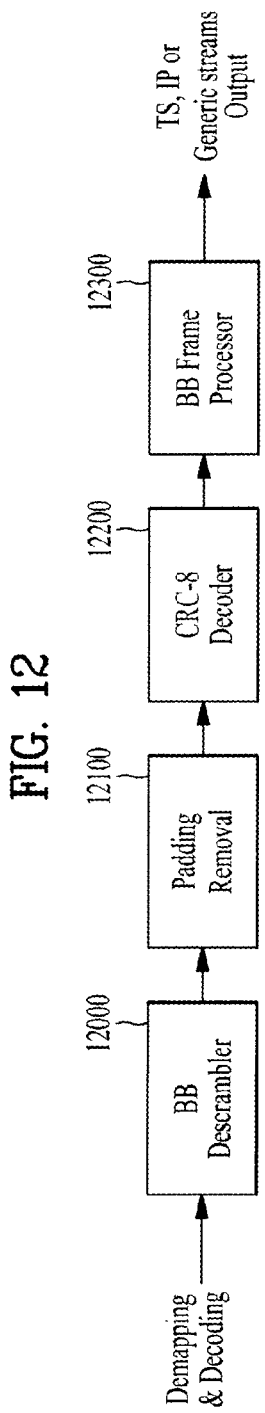
FIG. 12 illustrates an output processor according to an embodiment of the present invention.
Figure 13:
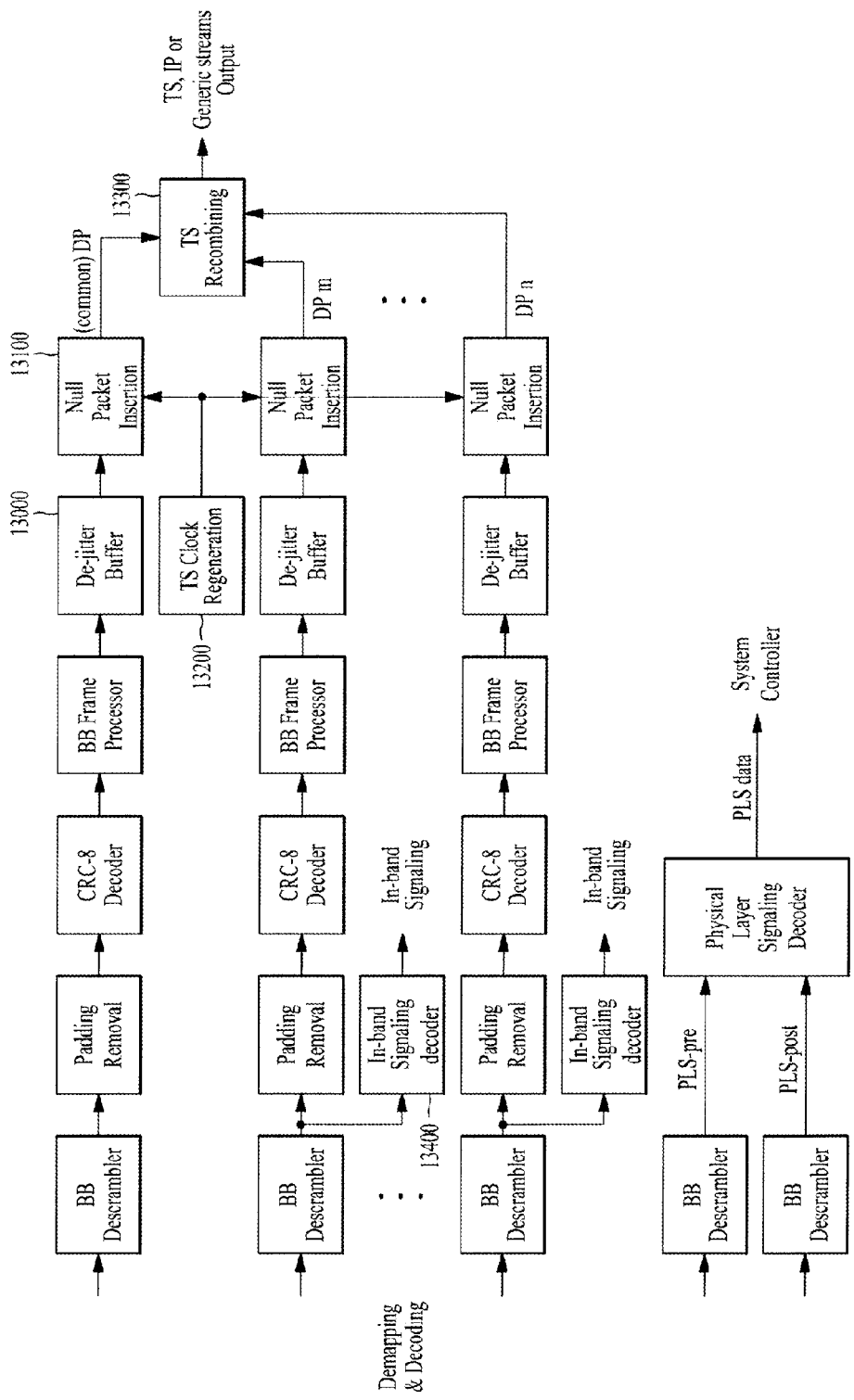
FIG. 13 illustrates an output processor according to another embodiment of the present invention.

FIGS. 12 and 13 illustrate output processors according to embodiments of the present invention.

FIG. 12 illustrates an output processor according to an embodiment of the present invention. The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention. The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de-jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding hit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 14:
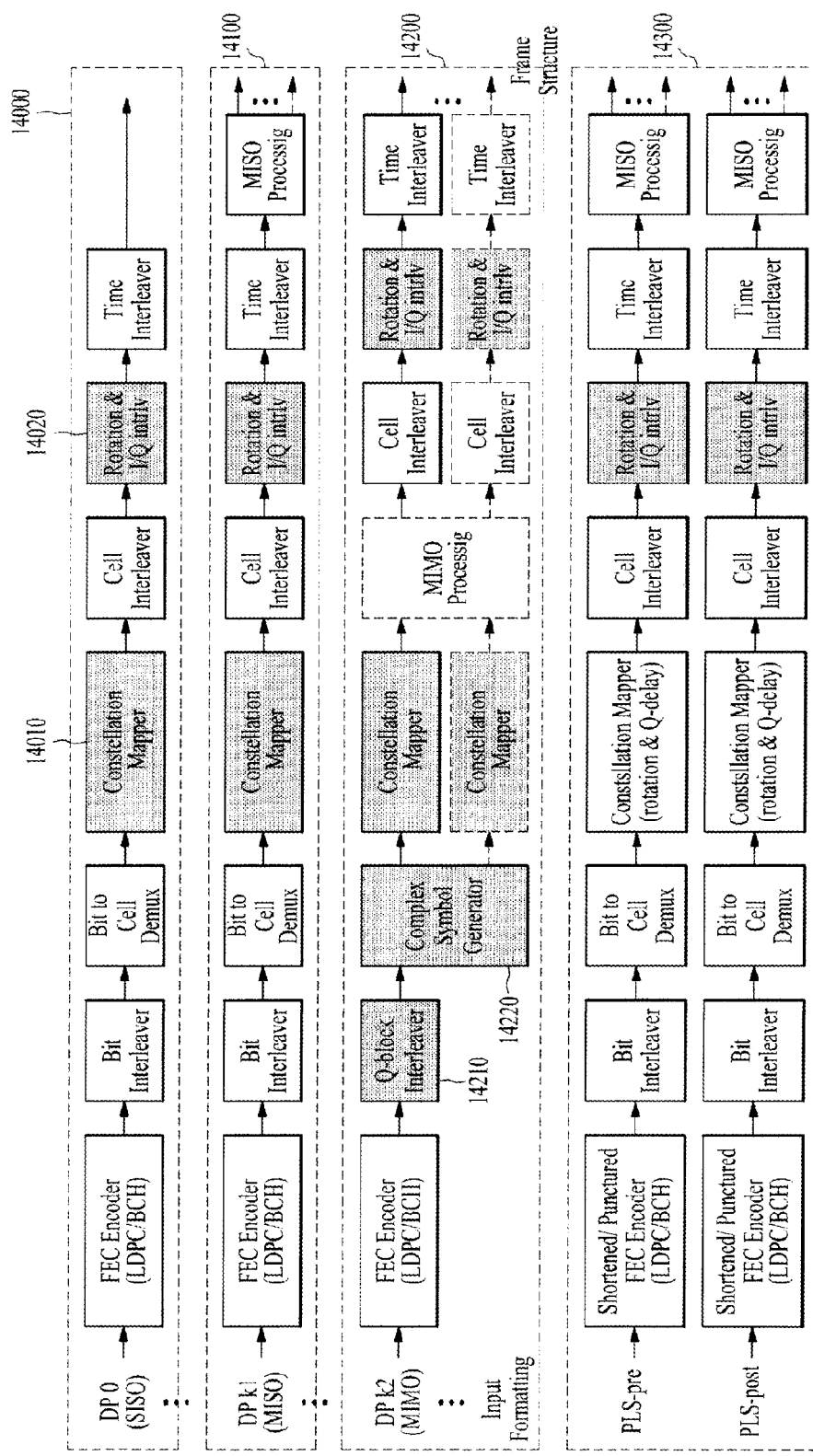
FIG. 14 illustrates a coding & modulation module according to another embodiment of the present invention.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & PQ interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

Figure 15:
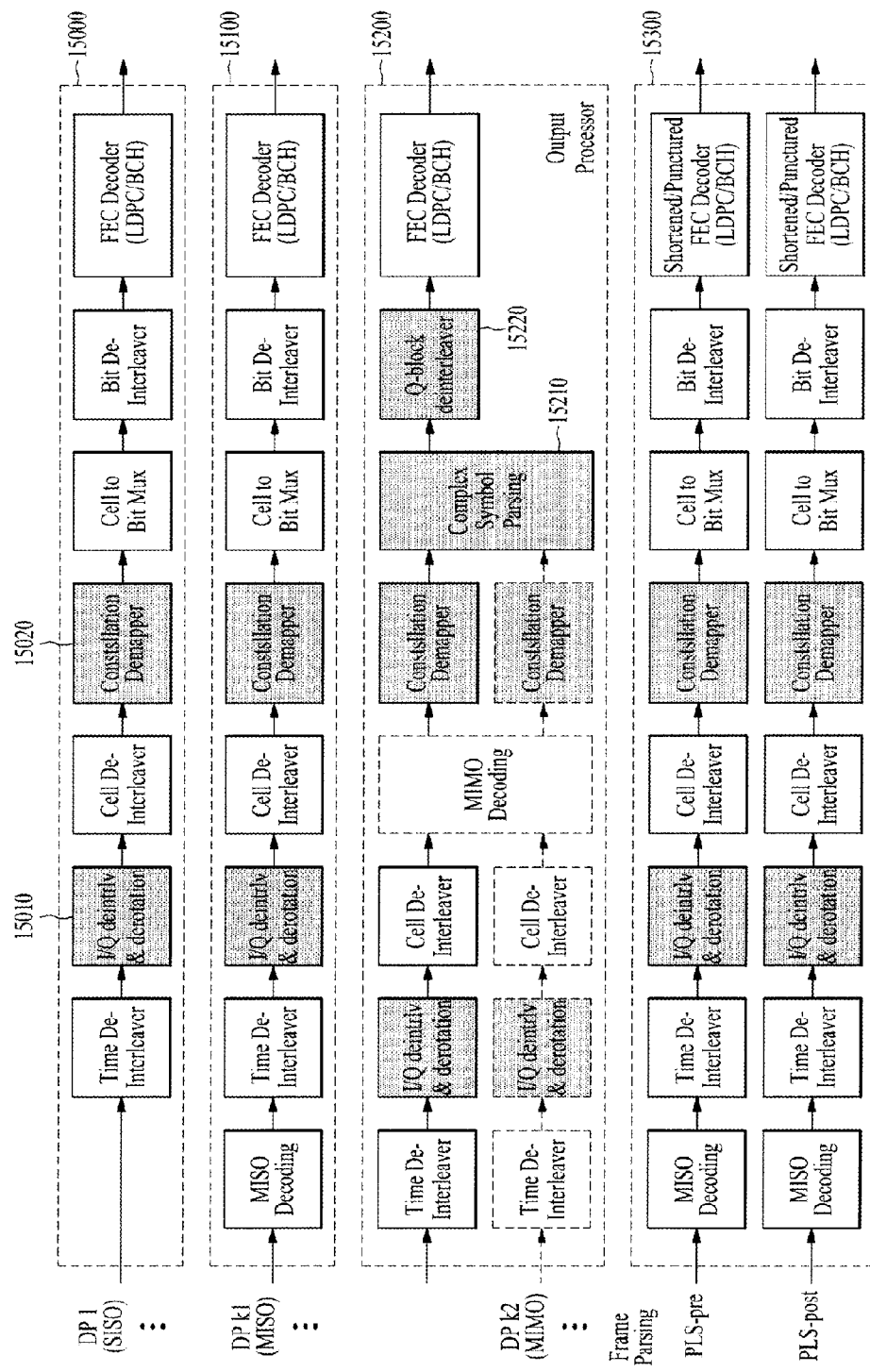
FIG. 15 illustrates a demapping & decoding module according to another embodiment of the present invention.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

As described above, the apparatus and method for transmitting broadcast signals according to an embodiment of the present invention can multiplex signals of different broadcast transmission/reception systems within the same RF channel and transmit the multiplexed signals and the apparatus and method for receiving broadcast signals according to an embodiment of the present invention can process the signals in response to the broadcast signal transmission operation. Accordingly, it is possible to provide a flexible broadcast transmission and reception system.

Figure 16:
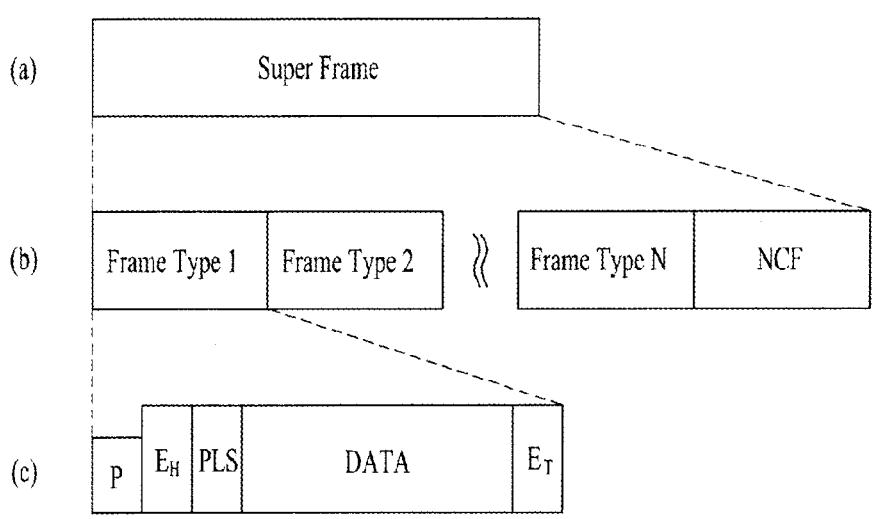
FIG. 16 illustrates a frame structure of a broadcast system according to an embodiment of the present invention.

FIG. 16 is a view illustrating a frame structure of a broadcast system according to an embodiment of the present invention.

The above-described cell mapper included in the frame structure module may locate cells for transmitting input SISO, MISO or MIMO processed DP data, cells for transmitting common DP data, and cells for transmitting PLS data in a signal frame according to scheduling information. Then, the generated signal frames may be sequentially transmitted.

A broadcast signal transmission apparatus and transmission method according to an embodiment of the present invention may multiplex and transmit signals of different broadcast transception systems within the same RF channel, and a broadcast signal reception apparatus and reception method according to an embodiment of the present invention may correspondingly process the signals. Thus, a broadcast signal transception system according to an embodiment of the present invention may provide a flexible broadcast transception system.

Therefore, the broadcast signal transmission apparatus according to an embodiment of the present invention may sequentially transmit a plurality of superframes delivering data related to broadcast service.

FIG. 16(a) illustrates a superframe according to an embodiment of the present invention, and FIG. 16(b) illustrates the configuration of the superframe according to an embodiment of the present invention. As illustrated in FIG. 16(b), the superframe may include a plurality of signal frames and a non-compatible frame (NCF). According to an embodiment of the present invention, the signal frames are time division multiplexing (TDM) signal frames of a physical layer end, which are generated by the above-described frame structure module, and the NCF is a frame which is usable for a new broadcast service system in the future.

The broadcast signal transmission apparatus according to an embodiment of the present invention may multiplex and transmit various services, e.g., UHD, Mobile and MISO/MIMO, on a frame basis to simultaneously provide the services in an RF. Different broadcast services may require different reception environments, transmission processes, etc. according to characteristics and purposes of the broadcast services.

Accordingly, different services may be transmitted on a signal frame basis, and the signal frames can be defined as different frame types according to services transmitted therein. Further, data included in the signal frames can be processed using different transmission parameters, and the signal frames can have different FFT sizes and guard intervals according to broadcast services transmitted therein.

Accordingly, as illustrated in FIG. 16(b), the different-type signal frames for transmitting different services may be multiplexed using TDM and transmitted within a superframe.

According to an embodiment of the present invention, a frame type may be defined as a combination of an FFT mode, a guard interval mode and a pilot pattern, and information about the frame type may be transmitted using a preamble portion within a signal frame. A detailed description thereof will be given below.

Further, configuration information of the signal frames included in the superframe may be signaled through the above-described PLS, and may vary on a superframe basis.

FIG. 16(c) is a view illustrating the configuration of each signal frame. The signal frame may include a preamble, head/tail edge symbols EH/ET, one or more PLS symbols and a plurality of data symbols. This configuration is variable according to the intention of a designer.

The preamble is located at the very front of the signal frame and may transmit a basic transmission parameter for identifying a broadcast system and the type of signal frame, information for synchronization, etc. Thus, the broadcast signal reception apparatus according to an embodiment of the present invention may initially detect the preamble of the signal frame, identify the broadcast system and the frame type, and selectively receive and decode a broadcast signal corresponding to a receiver type.

The head/tail edge symbols may be located after the preamble of the signal frame or at the end of the signal frame. In the present invention, an edge symbol located after the preamble may be called a head edge symbol and an edge symbol located at the end of the signal frame may be called a tail edge symbol. The names, locations or numbers of the edge symbols are variable according to the intention of a designer. The head/tail edge symbols may be inserted into the signal frame to support the degree of freedom in design of the preamble and multiplexing of signal frames having different frame types. The edge symbols may include a larger number of pilots compared to the data symbols to enable frequency-only interpolation and time interpolation between the data symbols. Accordingly, a pilot pattern of the edge symbols has a higher density than that of the pilot pattern of the data symbols.

The PLS symbols are used to transmit the above-described PLS data and may include additional system information (e.g., network topology/configuration, PAPR use, etc.), frame type ID/configuration information, and information necessary to extract and decode DPs.

The data symbols are used to transmit DP data, and the above-described cell mapper may locate a plurality of DPs in the data symbols.

A description is now given of DPs according to an embodiment of the present invention.

Figure 17:
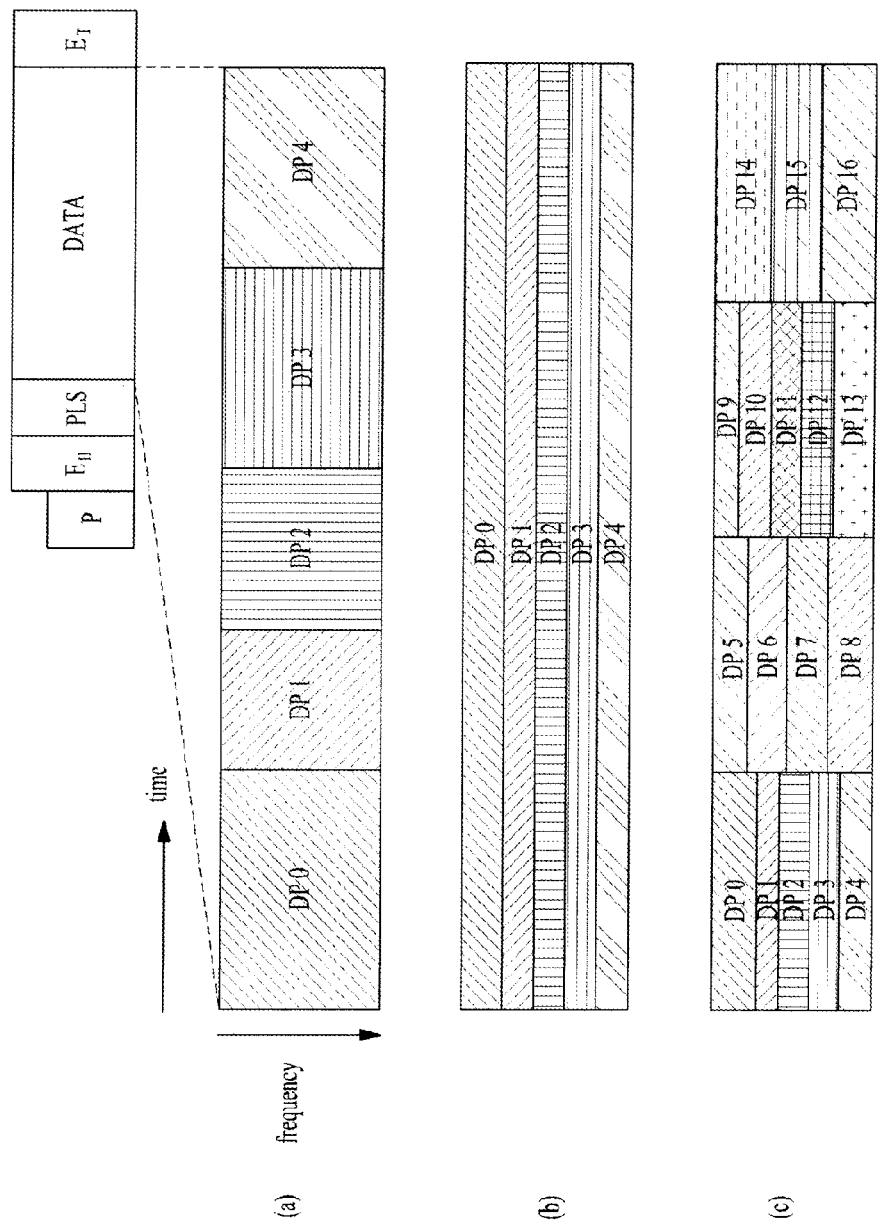
FIG. 17 illustrates DPs according to an embodiment of the present invention.

FIG. 17 is a view illustrating DPs according to an embodiment of the present invention.

As described above, data symbols of a signal frame may include a plurality of DPs. According to an embodiment of the present invention, the DPs may be divided into type 1 to type 3 according to mapping modes (or locating modes) in the signal frame.

FIG. 17(a) illustrates type1 DPs mapped to the data symbols of the signal frame, FIG. 17(b) illustrates type2 DPs mapped to the data symbols of the signal frame, and FIG. 17(c) illustrates type3 DPs mapped to the data symbols of the signal frame. FIGS. 17(a) to 17(c) illustrate only a data symbol portion of the signal frame, and a horizontal axis refers to a time axis while a vertical axis refers to a frequency axis. A description is now given of the type1 to type3 DPs.

As illustrated in FIG. 17(a), the type1 DPs refer to DPs mapped using TDM in the signal frame.

That is, when the type1 DPs are mapped to the signal frame, a frame structure module (or cell mapper) according to an embodiment of the present invention may map corresponding DP cells in a frequency axis direction. Specifically, the frame structure module (or cell mapper) according to an embodiment of the present invention may map cells of DP0 in a frequency axis direction and, if an OFDM symbol is completely filled, move to a next OFDM symbol to continuously map the cells of DP0 in a frequency axis direction. After the cells of DP0 are completely mapped, cells of DP1 and DP2 may also be mapped to the signal frame in the same manner. In this case, the frame structure module (or cell mapper) according to an embodiment of the present invention may map the cells with an arbitrary interval between DPs.

Since the cells of the type1 DPs are mapped with the highest density on the time axis, compared to other-type DPs, the type1 DPs may minimize an operation time of a receiver. Accordingly, the type1 DPs are appropriate to provide a corresponding service to a broadcast signal reception apparatus which should preferentially consider power saving, e.g., a handheld or portable device which operates using a battery.

As illustrated in FIG. 17(b), the type2 DPs refer to DPs mapped using frequency division multiplexing (FDM) in the signal frame.

That is, when the type2 DPs are mapped to the signal frame, the frame structure module (or cell mapper) according to an embodiment of the present invention may map corresponding DP cells in a time axis direction. Specifically, the frame structure module (or cell mapper) according to an embodiment of the present invention may preferentially map cells of DP0 on the time axis at a first frequency of an OFDM symbol. Then, if the cells of DP0 are mapped to the last OFDM symbol of the signal frame on the time axis, the frame structure module (or cell mapper) according to an embodiment of the present invention may continuously map the cells of DP0 in the same manner from a second frequency of a first OFDM symbol.

Since the cells of the type2 DPs are transmitted with the widest distribution in time, compared to other-type DPs, the type2 DPs are appropriate to achieve time diversity. However, since an operation time of a receiver to extract the type2 DPs is longer than that to extract the type1 DPs, the type2 DPs may not easily achieve power saving. Accordingly, the type2 DPs are appropriate to provide a corresponding service to a fixed broadcast signal reception apparatus which stably receives power supply.

Since cells of each type2 DP are concentrated on a specific frequency, a receiver in a frequency selective channel environment may have problem to receive a specific DP. Accordingly, after cell mapping, if frequency interleaving is applied on a symbol basis, frequency diversity may be additionally achieved and thus the above-described problem may be solved.

As illustrated in FIG. 17(c), the type3 DPs correspond to an intermediate form between the type1 DPs and the type2 DPs and refer to DPs mapped using time & frequency division multiplexing (TFDM) in the signal frame.

When the type3 DPs are mapped to the signal frame, the frame structure module (or cell mapper) according to an embodiment of the present invention may equally partition the signal frame, define each partition as a slot, and map cells of corresponding DPs in a time axis direction along the time axis only within the slot.

Specifically, the frame structure module (or cell mapper) according to an embodiment of the present invention may preferentially map cells of DP0 on the time axis at a first frequency of a first OFDM symbol. Then, if the cells of DP0 are mapped to the last OFDM symbol of the slot on the time axis, the frame structure module (or cell mapper) according to an embodiment of the present invention may continuously map the cells of DP0 in the same manner from a second frequency of the first OFDM symbol.

In this case, a trade-off between time diversity and power saving is possible according to the number and length of slots partitioned from the signal frame. For example, if the signal frame is partitioned into a small number of slots, the slots have a large length and thus time diversity may be achieved as in the type2 DPs. If the signal frame is partitioned into a large number of slots, the slots have a small length and thus power saving may be achieved as in the type1 DPs.

Figure 18:
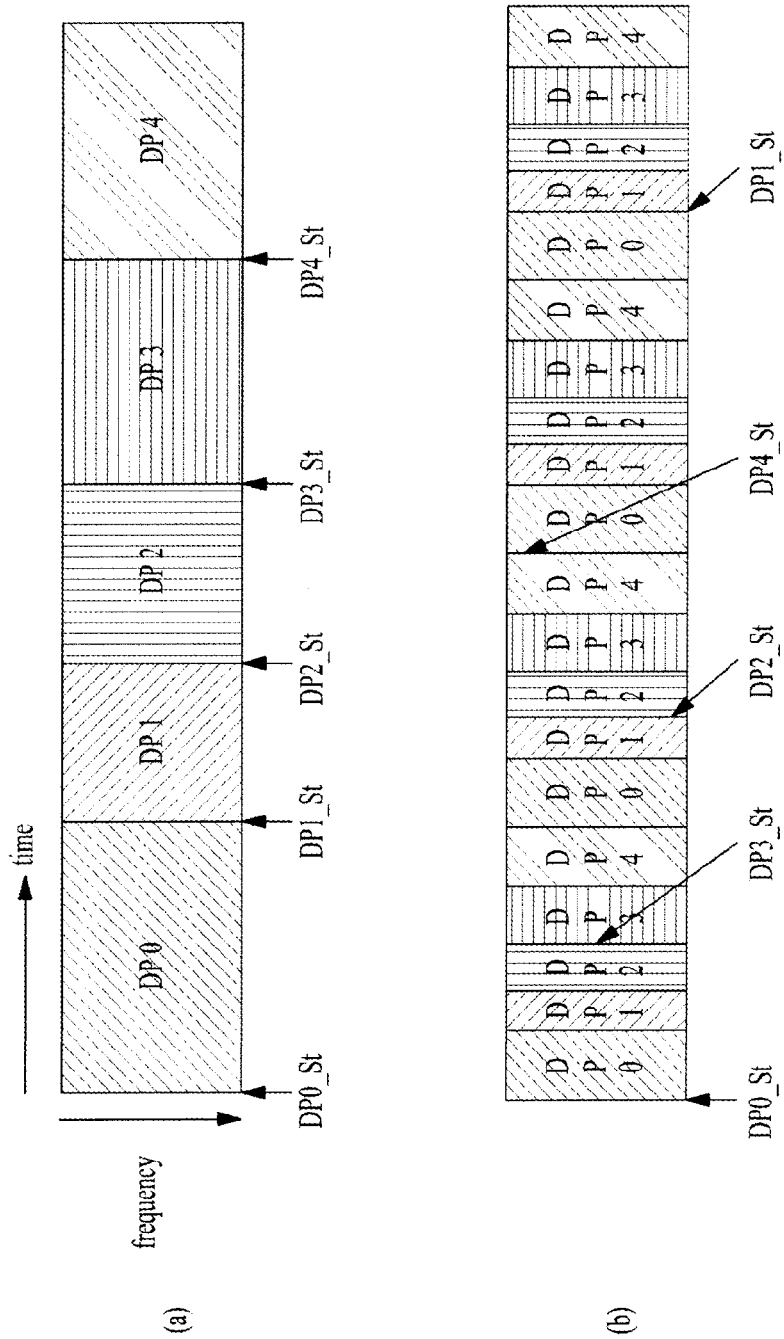
FIG. 18 illustrates type1 DPs according to an embodiment of the present invention.

FIG. 18 is a view illustrating type1 DPs according to an embodiment of the present invention.

FIG. 18 illustrates an embodiment in which the type1 DPs are mapped to a signal frame according to the number of slots. Specifically, FIG. 18(a) shows a result of mapping the type1 DPs when the number of slots is 1, and FIG. 18(b) shows a result of mapping the type1 DPs when the number of slots is 4.

To extract cells of each DP mapped in the signal frame, the broadcast signal reception apparatus according to an embodiment of the present invention needs type information of each DP and signaling information, e.g., DP start address information indicating an address to which a first cell of each DP is mapped, and FEC block number information of each DP allocated to a signal frame.

Accordingly, as illustrated in FIG. 18(a), the broadcast signal transmission apparatus according to an embodiment of the present invention may transmit signaling information including DP start address information indicating an address to which a first cell of each DP is mapped (e.g., DP0_St, DP1_St, DP2_St, DP3_St, DP4_St), etc.

FIG. 18(b) shows a result of mapping the type1 DPs when the signal frame is partitioned into 4 slots. Cells of DPs mapped to each slot may be mapped in a frequency direction. As described above, if the number of slots is large, since cells corresponding to a DP are mapped and distributed with a certain interval, time diversity may be achieved. However, since the number of cells of a DP mapped to a single signal frame is not always divided by the number of slots, the number of cells of a DP mapped to each slot may vary. Accordingly, if a mapping rule is established in consideration of this, an address to which a first cell of each DP is mapped may be an arbitrary location in the signal frame. A detailed description of the mapping method will be given below. Further, when the signal frame is partitioned into a plurality of slots, the broadcast signal reception apparatus needs information indicating the number of slots to obtain cells of a corresponding DP. In the present invention, the information indicating the number of slots may be expressed as N_Slot. Accordingly, the number of slots of the signal frame of FIG. 18(a) may be expressed as N_Slot=1 and the number of slots of the signal frame of FIG. 18(b) may be expressed as N_Slot=4.

Figure 19:
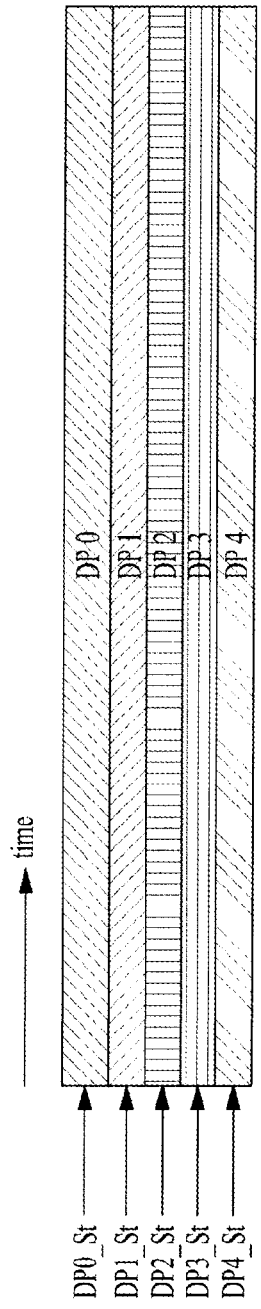
FIG. 19 illustrates type2 DPs according to an embodiment of the present invention.

FIG. 19 is a view illustrating type2 DPs according to an embodiment of the present invention.

As described above, cells of a type2 DP are mapped in a time axis direction and, if the cells of the DP are mapped to the last OFDM symbol of a signal frame on a time axis, the cells of the DP may be continuously mapped in the same manner from a second frequency of a first OFDM symbol.

As described above in relation to FIG. 18, even in the case of the type2 DPs, to extract cells of each DP mapped in the signal frame, the broadcast signal reception apparatus according to an embodiment of the present invention needs type information of each DP and signaling information, e.g., DP start address information indicating an address to which a first cell of each DP is mapped, and FEC block number information of each DP allocated to a signal frame.

Accordingly, as illustrated in FIG. 19, the broadcast signal transmission apparatus according to an embodiment of the present invention may transmit DP start address information indicating an address to which a first cell of each DP is mapped (e.g., DP0_St, DP1_St, DP2_St, DP3_St, DP4_St). Further, FIG. 19 illustrates a case in which the number of slots is 1, and the number of slots of the signal frame of FIG. 19 may be expressed as N_Slot=1.

Figure 20:
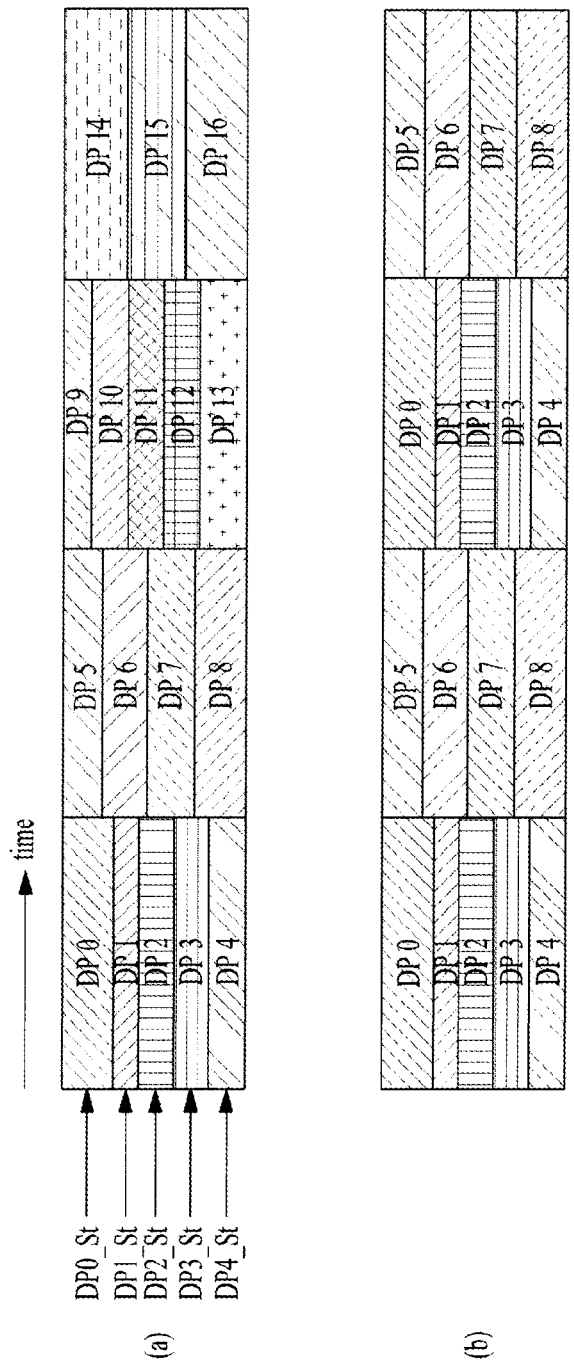
FIG. 20 illustrates type3 DPs according to an embodiment of the present invention.

FIG. 20 is a view illustrating type3 DPs according to an embodiment of the present invention.

The type3 DPs refer to DPs mapped using TFDM in a signal frame as described above, and may be used when power saving is required while restricting or providing time diversity to a desired level. Like the type2 DPs, the type3

DPs may achieve frequency diversity by applying frequency interleaving on an OFDM symbol basis.

FIG. 20(a) illustrates a signal frame in a case when a DP is mapped to a slot, and FIG. 20(b) illustrates a signal frame in a case when a DP is mapped to two or more slots. Both FIGS. 20(a) and 20(b) illustrate a case in which the number of slots is 4, and the number of slots of the signal frame may be expressed as N_Slot=4.

Further, as illustrated in FIGS. 18 and 19, the broadcast signal transmission apparatus according to an embodiment of the present invention may transmit DP start address information indicating an address to which a first cell of each DP is mapped (e.g., DP0_St, DP1_St, DP2_St, DP3_St, DP4_St).

In FIG. 20(b), time diversity different from that achieved in FIG. 20(a) may be achieved. In this case, additional signaling information may be needed.

As described above in relation to FIGS. 18 to 20, the broadcast signal transmission apparatus according to an embodiment of the present invention may transmit signaling information including DP start address information indicating an address to which a first cell of each DP is mapped (e.g., DP0_St, DP1_St, DP2_St, DP3_St, DP4_St), etc. In this case, the broadcast signal transmission apparatus according to an embodiment of the present invention may transmit only the start address information of DP0 which is initially mapped, and transmit an offset value based on the start address information of DP0 for the other DPs. If the DPs are equally mapped, since mapping intervals of the DPs are the same, a receiver may achieve start locations of the DPs using information about a start location of an initial DP, and an offset value. Specifically, when the broadcast signal transmission apparatus according to an embodiment of the present invention transmits offset information having a certain size based on the start address information of DP0, the broadcast signal reception apparatus according to an embodiment of the present invention may calculate a start location of DP1 by adding the above-described offset information to the start address information of DP0. In the same manner, the broadcast signal reception apparatus according to an embodiment of the present invention may calculate a start location of DP2 by adding the above-described offset information twice to the start address information of DP0. If the DPs are not equally mapped, the broadcast signal transmission apparatus according to an embodiment of the present invention may transmit the start address information of DP0 and offset values (OFFSET 1, OFFSET 2, . . . ) indicating intervals of the other DPs based on the start location of DP0. In this case, the offset values may be the same or different. Further, the offset value(s) may be included and transmitted in PLS signaling information or in-band signaling information to be described below with reference to FIG. 33. This is variable according to the intention of a designer.

A description is now given of a method for mapping a DP using resource blocks (RBs) according to an embodiment of the present invention.

An RB is a certain unit block for mapping a DP and may be called a data mapping unit in the present invention. RB based resource allocation is advantageous in intuitively and easily processing DP scheduling and power saving control. According to an embodiment of the present invention, the name of the RB is variable according to the intention of a designer and the size of RB may be freely set within a range which does not cause a problem in bit-rate granularity.

The present invention may exemplarily describe a case in which the size of RB is a value obtained by multiplying or dividing the number of active carriers (NoA) capable of transmitting actual data in an OFDM symbol, by an integer. This is variable according to the intention of a designer. If the RB has a large size, resource allocation may be simplified. However, the size of RB indicates a minimum unit of an actually supportable bit rate and thus should be determined with appropriate consideration.

Figure 21:
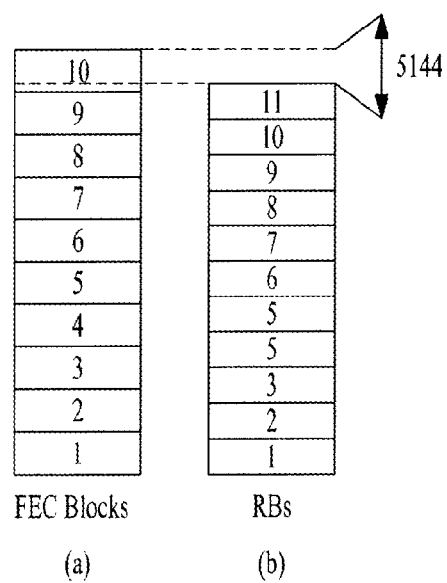
FIG. 21 illustrates RBs according to an embodiment of the present invention.

FIG. 21 is a view illustrating RBs according to an embodiment of the present invention.

FIG. 21 illustrates an embodiment in which DP0 is mapped to a signal frame using RBs when the number of FEC blocks of DP0 is 10. A case in which the length of LDPC blocks is 64K and a QAM modulation value is 256QAM as transmission parameters of DP0, a FFT mode of the signal frame is 32K, and a scattered pilot pattern is PP32-2 (i.e., the interval of pilots delivering carriers is Dx=32, and the number of symbols included in a scattered pilot sequence is Dy=2) is described as an example. In this case, the size of FEC block corresponds to 8100 cells, and NoA can be assumed as 27584. Assuming that the size of RB is a value obtained by dividing NoA by 4, the size of RB corresponds to 6896 cells and may be expressed as L_RB=NoA/4.

In this case, when the size of FEC blocks and the size of RBs are compared on a cell basis, a relationship of the size of 10×FEC blocks=the size of 11×RBs+5144 cells is established. Accordingly, to map the 10 FEC blocks to a single signal frame on an RB basis, the frame structure module (or cell mapper) according to an embodiment of the present invention may map data of the 10 FEC blocks sequentially to the 11 RBs to map the 11 RBs to a current signal frame, and map the remaining data corresponding to the 5144 cells to a next signal frame together with next FEC blocks.

Figure 22:
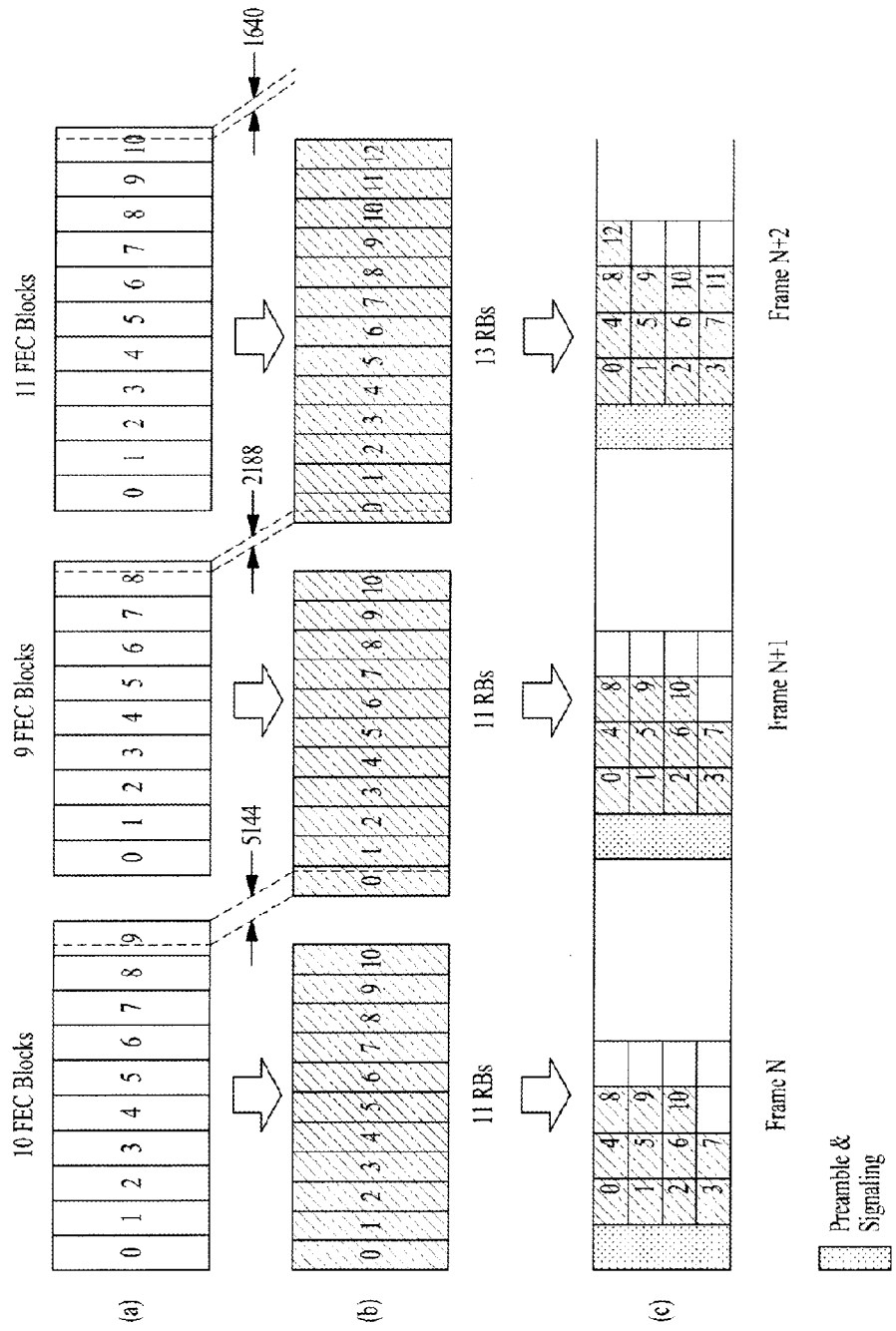
FIG. 22 illustrates a procedure for mapping RBs to frames according to an embodiment of the present invention.

FIG. 22 is a view illustrating a procedure for mapping RBs to frames according to an embodiment of the present invention.

Specifically, FIG. 22 illustrates a case in which contiguous signal frames are transmitted.

When a variable bit rate is supported, each signal frame may have a different number of FEC blocks transmittable therein.

FIG. 22(a) illustrates a case in which the number of FEC blocks to be transmitted in signal frame N is 10, a case in which the number of FEC blocks to be transmitted in signal frame N+1 is 9, and a case in which the number of FEC blocks to be transmitted in signal frame N+2 is 11.

FIG. 22(b) illustrates a case in which the number of RB to be mapped to signal frame N is 11, a case in which the number of RB to be mapped to signal frame N+1 is 11, and a case in which the number of RB to be mapped to signal frame N+2 is 13.

FIG. 22(c) shows a result of mapping the RBs to signal frame N, signal frame N+1 and signal frame N+2.

As illustrated in FIGS. 22(a) and 22(b), when the number of FEC blocks to be transmitted in signal frame N is 10, since the size of 10 FEC blocks equals to a value obtained by adding 5144 cells to the size of 11 RBs, the 11 RBs may be mapped to and transmitted in signal frame N as illustrated in FIG. 22(c).

In addition, as illustrated in the center of FIG. 22(b), the remaining 5144 cells form an initial part of a first RB among 11 RB s to be mapped to signal frame N+1. Accordingly, since a relationship of 5144 cells+the size of 9 FEC blocks=the size of 11 RBs+2188 cells is established, 11 RBs are mapped to and transmitted in signal frame N+1 and the remaining 2188 cells form an initial part of a first RB among 13 RBs to be mapped to signal frame N+2. In the same manner, since a relationship of 2188 cells+the size of 11 FEC blocks=the size of 13 RBs+1640 cells is established, 13 RBs are mapped to and transmitted in signal frame N+2 and the remaining 1640 cells are mapped to and transmitted in a next signal frame. The size of FEC blocks is not the same as the size of NoA and thus dummy cells can be inserted. However, according to the method illustrated in FIG. 22, there is no need to insert dummy cells and thus actual data may be more efficiently transmitted. Further, time interleaving or processing similar thereto may be performed on RBs to be mapped to a signal frame before the RBs are mapped to the signal frame and This is variable according to the intention of a designer.

A description is now given of a method of mapping DPs to a signal frame on an RB basis according to the above-described types of the DPs.

Specifically, in the present invention, the RB mapping method is described by separating a case in which a plurality of DPs are allocated to all available RBs in a signal frame from a case in which the DPs are allocated to only some RBs. The present invention may exemplarily describe a case in which the number of DPs is 3, the number of RBs in a signal frame is 80, and the size of RB is a value obtained by dividing NoA by 4. This case may be expressed as follows.

Number of DPs, N_DP=3
Number of RBs in a signal frame, N_RB=80
Size of RB, L_RB=NoA/4

Further, the present invention may exemplarily describe a case in which DP0 fills 31 RBs, DP1 fills 15 RBs, and DP2 fills 34 RBs, as the case in which a plurality of DPs (DP0, DP1, DP2) are allocated to available RBs in a signal frame. This case may be expressed as follows.

{DP0,DP1,DP2}={31,15,34}

In addition, the present invention may exemplarily describe a case in which DP0 fills 7 RBs, DP1 fills 5 RBs, and DP2 fills 6 RBs, as the case in which a plurality of DPs (DP0, DP1, DP2) are allocated to only some RBs in a signal frame. This case may be expressed as follows.

{DP0,DP1,DP2}={7,5,6}

Figure 23:
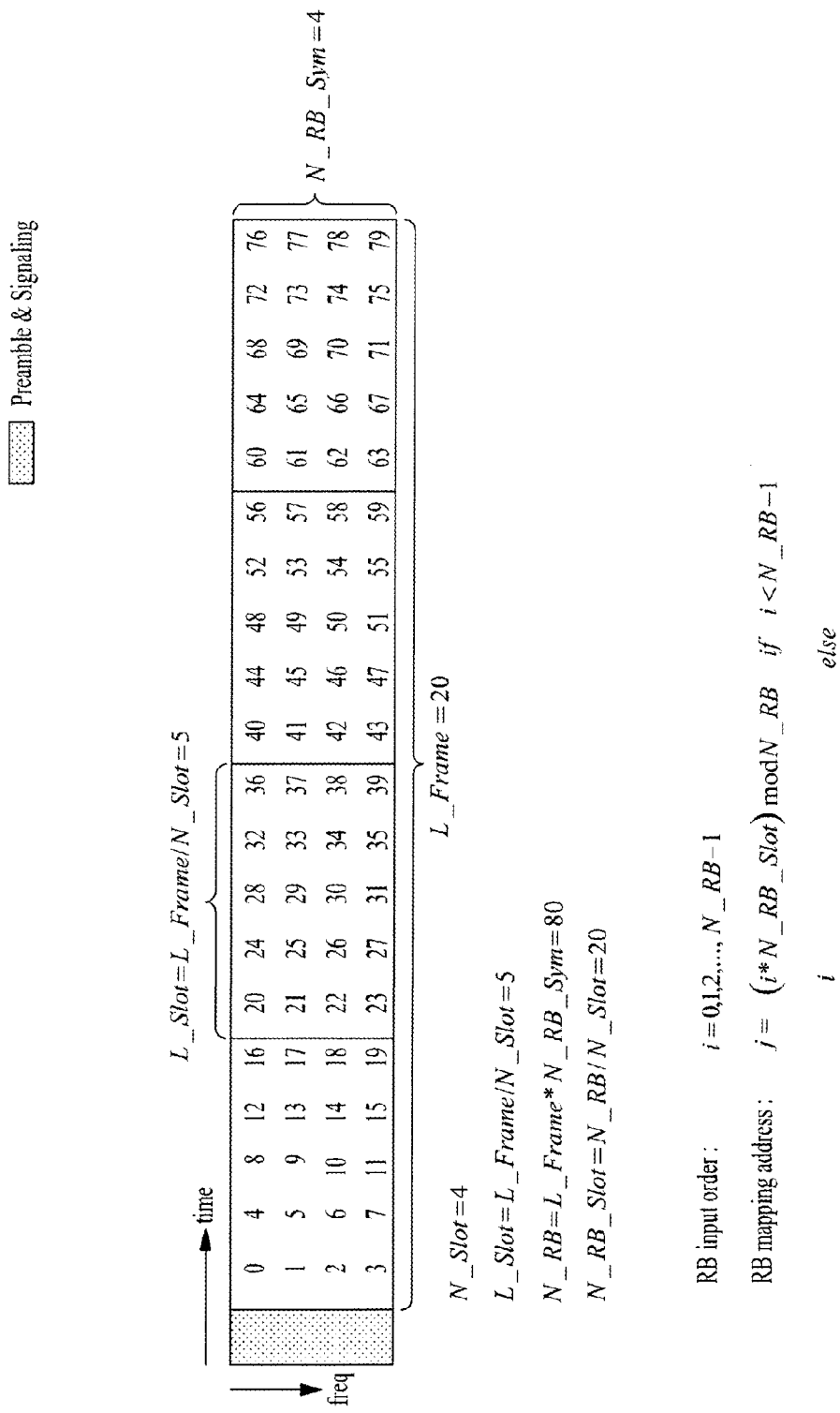
FIG. 23 illustrates an RB mapping of type1 DPs according to an embodiment of the present invention.
Figure 24:
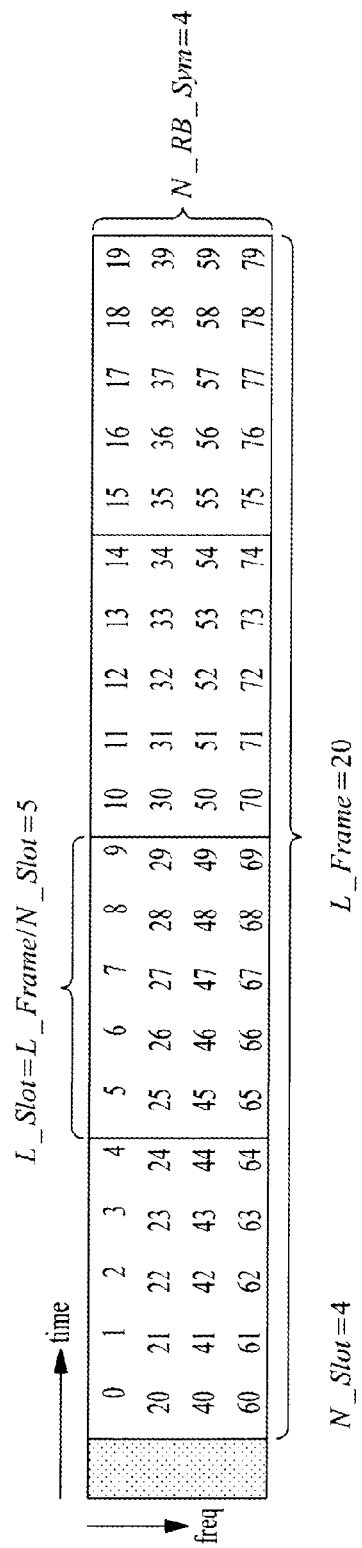
FIG. 24 illustrates an RB mapping of type2 DPs according to an embodiment of the present invention.
Figure 25:
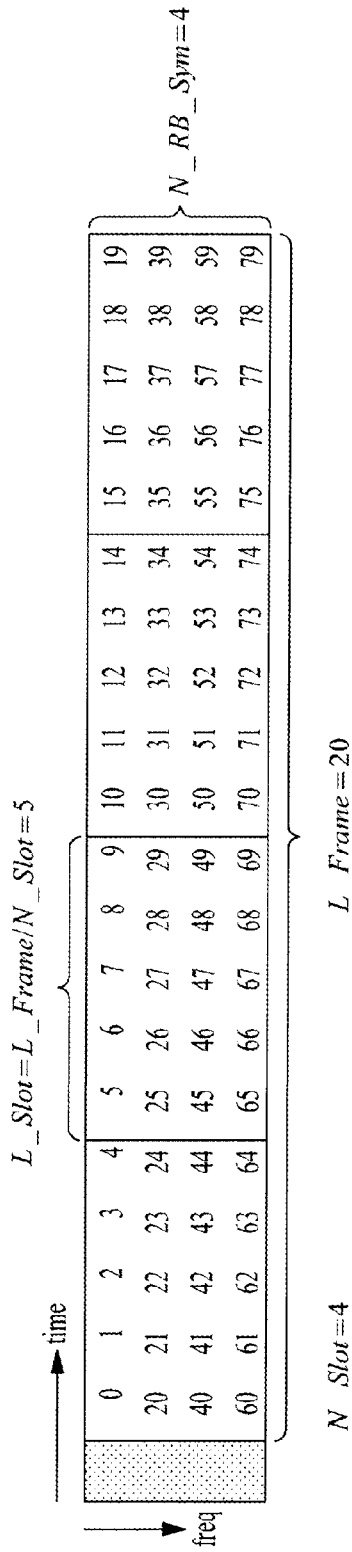
FIG. 25 illustrates an RB mapping of type3 DPs according to an embodiment of the present invention.

FIGS. 23 to 25 illustrate RB mapping according to the types of DPs.

The present invention may exemplarily define the following values to describe an RB mapping rule according to the type of each DP.

L_Frame: Number of OFDM symbols in a signal frame
N_Slot: Number of slots in a signal frame
L_Slot: Number of OFDM symbols in a slot
N_RB_Sym: Number of RBs in an OFDM symbol
N_RB: Number of RBs in a signal frame FIG. 23 is a view illustrating RB mapping of type1 DPs according to an embodiment of the present invention.

FIG. 23 illustrates a single signal frame, and a horizontal axis refers to a time axis while a vertical axis refers to a frequency axis. A colored block located at the very front of the signal frame on the time axis corresponds to a preamble and signaling portion. As described above, according to an embodiment of the present invention, a plurality of DPs may be mapped to a data symbol portion of the signal frame on a RB basis.

The signal frame illustrated in FIG. 23 consists of 20 OFMD symbols (L_Frame=20) and includes 4 slots (N_Slot=4). Further, each slot includes 5 OFDM symbols (L_Slot=5) and each OFDM symbol is equally partitioned into 4 RBs (N_RB_Sym=4). Accordingly, a total number of RBs in the signal frame is L_Frame*N_RB_Sym which corresponds to 80.

Numerals indicated in the signal frame of FIG. 23 refer to the order of allocating RBs in the signal frame. Since the type1 DPs are sequentially mapped in a frequency axis direction, it can be noted that the order of allocating RBs is sequentially increased on the frequency axis. If the order of allocating RBs is determined, corresponding DPs may be mapped to ultimately allocated RBs in the order of time. Assuming that an address to which each RB is actually mapped in the signal frame (i.e., RB mapping address) is j, j may have a value from 0 to N_RB−1. In this case, if an RB input order is defined as i, i may have a value of 0, 1, 2, ..., N_RB−1 as illustrated in FIG. 23. If N_Slot=1, since the RB mapping address and the RB input order are the same (j=i), input RBs may be sequentially mapped in ascending order of j. If N_Slot>1, RBs to be mapped to the signal frame may be partitioned and mapped according to the number of slots, N_Slot. In this case, the RBs may be mapped according to a mapping rule expressed as an equation illustrated at the bottom of FIG. 23.

FIG. 24 is a view illustrating RB mapping of type2 DPs according to an embodiment of the present invention.

Like the signal frame illustrated in FIG. 23, a signal frame illustrated in FIG. 24 consists of 20 OFMD symbols (L_Frame=20) and includes 4 slots (N_Slot=4). Further, each slot includes 5 OFDM symbols (L_Slot=5) and each OFDM symbol is equally partitioned into 4 RBs (N_RB_Sym=4). Accordingly, a total number of RBs in the signal frame is L_Frame*N_RB_Sym which corresponds to 80.

As described above in relation to FIG. 23, assuming that an address to which each RB is actually mapped in the signal frame (i.e., RB mapping address) is j, j may have a value from 0 to N_RB−1. Since the type2 DPs are sequentially mapped in a time axis direction, it can be noted that the order of allocating RBs is sequentially increased in a time axis direction. If the order of allocating RBs is determined, corresponding DPs may be mapped to ultimately allocated RBs in the order of time.

As described above in relation to FIG. 23, when an RB input order is defined as i, if N_Slot=1, since j=i, input RBs may be sequentially mapped in ascending order of j. If N_Slot>1, RBs to be mapped to the signal frame may be partitioned and mapped according to the number of slots, N_Slot. In this case, the RBs may be mapped according to a mapping rule expressed as an equation illustrated at the bottom of FIG. 24.

The equations illustrated in FIGS. 23 and 24 to express the mapping rules have no difference according to the types of DPs. However, since the type1 DPs are mapped in a frequency axis direction while the type2 DPs are mapped in a time axis direction, different RB mapping results are achieved due to the difference in mapping direction.

FIG. 25 is a view illustrating RB mapping of type3 DPs according to an embodiment of the present invention.

Like the signal frames illustrated in FIGS. 23 and 24, a signal frame illustrated in FIG. 25 consists of 20 OFMD symbols (L_Frame=20) and includes 4 slots (N_Slot=4). Further, each slot includes 5 OFDM symbols (L_Slot=5) and each OFDM symbol is equally partitioned into 4 RBs (N_RB_Sym=4). Accordingly, a total number of RBs in the signal frame is L_Frame*N_RB_Sym which corresponds to 80.

An RB mapping address of the type3 DPs may be calculated according to an equation illustrated at the bottom of FIG. 25. That is, if N_Slot=1, the RB mapping address of the type3 DPs is the same as the RB mapping address of the type2 DPs. The type2 and type3 DPs are the same in that they are sequentially mapped in a time axis direction but are different in that the type2 DPs are mapped to the end of a first frequency of the signal frame and then continuously mapped from a second frequency of a first OFDM symbol while the type3 DPs are mapped to the end of a first frequency of a slot and then continuously mapped from a second frequency of a first OFDM symbol of the slot in a time axis direction. Due to this difference, when the type3 DPs are used, time diversity may be restricted by L_Slot and power saving may be achieved on L_Slot basis.

Figure 26:
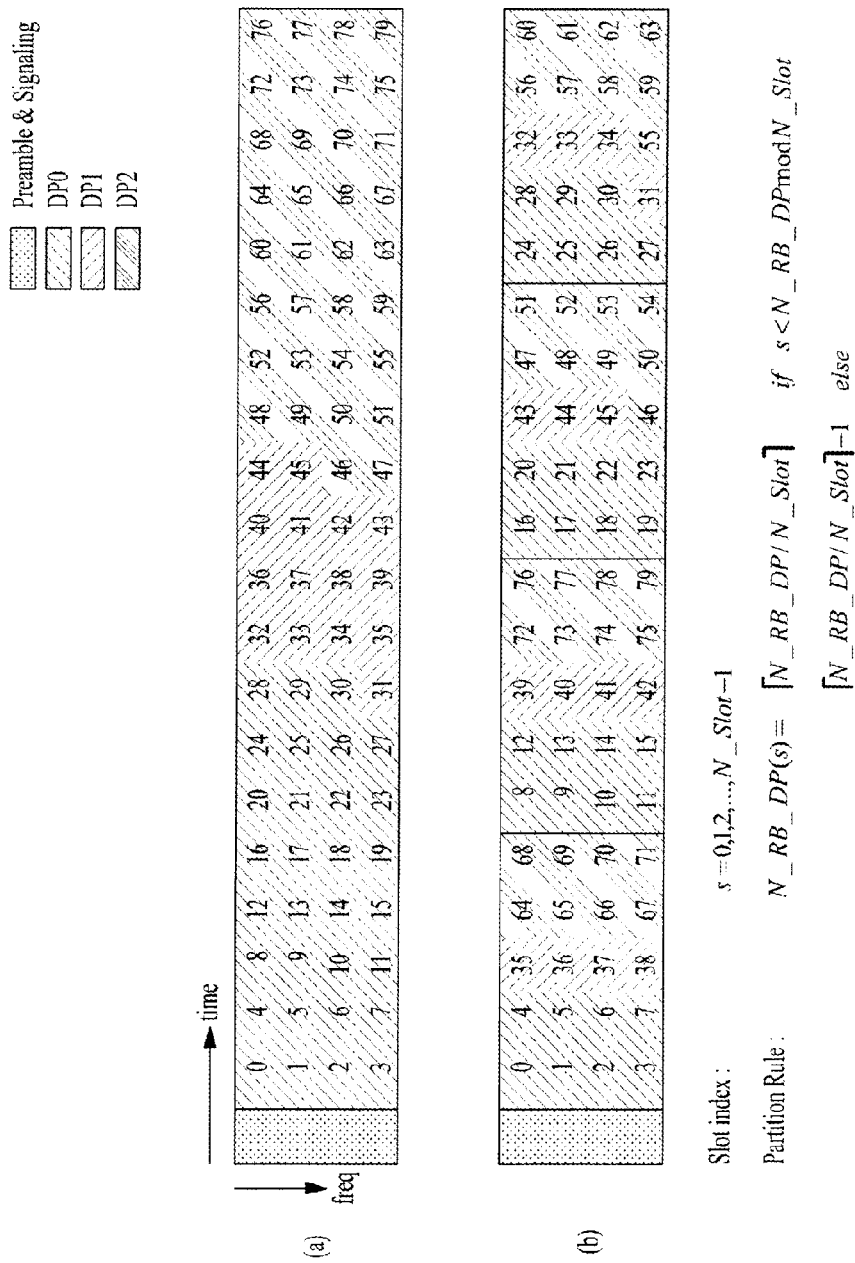
FIG. 26 illustrates an RB mapping of type1 DPs according to another embodiment of the present invention.

FIG. 26 is a view illustrating RB mapping of type1 DPs according to another embodiment of the present invention.

FIG. 26(a) illustrates an RB mapping order in a case when type1 DP0, DP1 and DP2 are allocated to available RBs in a signal frame, and FIG. 26(b) illustrates an RB mapping order in a case when each of type1 DP0, DP1 and DP2 is partitioned and allocated to RBs included in different slots in a signal frame. Numerals indicated in the signal frame refer to the order of allocating RBs. If the order of allocating RBs is determined, corresponding DPs may be mapped to ultimately allocated RBs in the order of time.

FIG. 26(a) illustrates an RB mapping order in a case when N_Slot=1 and {DP0, DP1, DP2}={31,15,34}.

Specifically, DP0 may be mapped to RBs in a frequency axis direction according to the order of the RBs and, if an OFDM symbol is completely filled, move to a next OFDM symbol on the time axis to be continuously mapped in a frequency axis direction. Accordingly, if DP0 is mapped to RB0 to RB30, DP1 may be continuously mapped to RB31 to RB45 and DP2 may be mapped to RB46 to RB79.

To extract RBs to which a corresponding DP is mapped, the broadcast signal reception apparatus according to an embodiment of the present invention needs type information of each DP (DP_Type) and the number of equally partitioned slots (N_Slot), and needs signaling information including DP start address information of each DP (DP_RB_St), FEC block number information of each DP to be mapped to a signal frame (DP_N_Block), start address information of an FEC block mapped in a first RB (DP_FEC_St), etc.

Accordingly, the broadcast signal transmission apparatus according to an embodiment of the present invention may also transmit the above-described signaling information.

FIG. 26(b) illustrates an RB mapping order in a case when N_Slot=4 and {DP0, DP1, DP2}={31,15,34}.

Specifically, FIG. 26(b) shows a result of partitioning DP0, DP1 and DP2 and then sequentially mapping the partitions of each DP to slots on an RB basis in the same manner as the case in which N_Slot=1. An equation expressing a rule for partitioning RBs of each DP is illustrated at the bottom of FIG. 26. In the equation illustrated in FIG. 26, parameters s, N_RB_DP and N_RB_DP(s) may be defined as follows.

s: Slot index, s=0, 1, 2, . . . , N_Slot−1

N_RB_DP: Number of RBs of a DP to be mapped to a signal frame

N_RB_DP(s): Number of RBs of a DP to be mapped to a slot of slot index s

According to an embodiment of the present invention, since N_RB_DP=31 for DP0, according to the equation illustrated in FIG. 26, the number of RBs of DP0 to be mapped to a first slot may be N_RB_DP(0)=8, the number of RBs of DP0 to be mapped to a second slot may be N_RB_DP(1)=8, the number of RBs of DP0 to be mapped to a third slot may be N_RB_DP(2)=8, and the number of RBs of DP0 to be mapped to a fourth slot may be N_RB_DP(3)=7. In the present invention, the numbers of RBs of DP0 partitioned to be mapped to the slots may be expressed as {8,8,8,7}.

In the same manner, DP1 may be partitioned into {4,4,4,3} and DP2 may be partitioned into {9,9,8,8}.

The RBs of each partition of a DP may be sequentially mapped in each slot using the method of the above-described case in which N_Slot=1. In this case, to equally fill all slots, the partitions of each DP may be sequentially mapped from a slot having a smaller slot index s among slots to which a smaller number of RBs of other DPs are allocated.

In the case of DP1, since RBs of DP0 are partitioned into {8,8,8,7} and mapped to the slots in the order of s=0,1,2,3, it can be noted that the smallest number of RBs of DP0 are mapped to the slot having a slot index s=3. Accordingly, RBs of DP1 may be partitioned into {4,4,4,3} and mapped to the slots in the order of s=3,0,1,2. In the same manner, since the smallest number of RBs of DP0 and DP1 are allocated to slots having slot index s=2 and 3 but s=2 is smaller, RBs of DP2 may be partitioned into {9,9,8,8} and mapped to the slots in the order of s=2,3,0,1.

Figure 27:
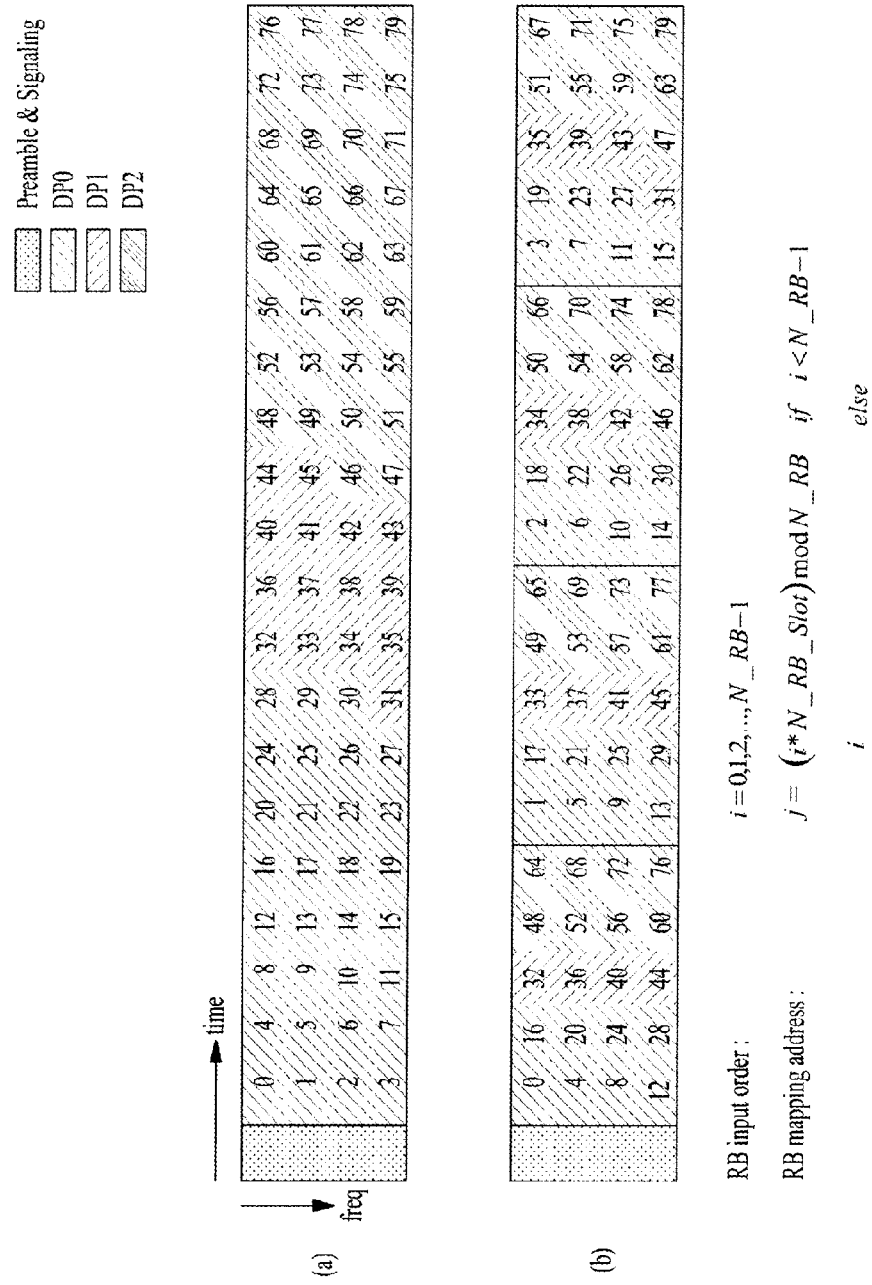
FIG. 27 illustrates an RB mapping of type1 DPs according to another embodiment of the present invention.

FIG. 27 is a view illustrating RB mapping of type1 DPs according to another embodiment of the present invention.

FIG. 27 illustrates an embodiment in which the above-described RB mapping address of the type1 DPs is equally applied. An equation expressing the above-described RB mapping address is illustrated at the bottom of FIG. 27. Although a mapping method and procedure in FIG. 27 are different from those described above in relation to FIG. 26, since mapping results thereof are the same, the same mapping characteristics may be achieved. According to the mapping method of FIG. 27, RB mapping may be performed using a single equation irrespective of the value of N_Slot.

Figure 28:
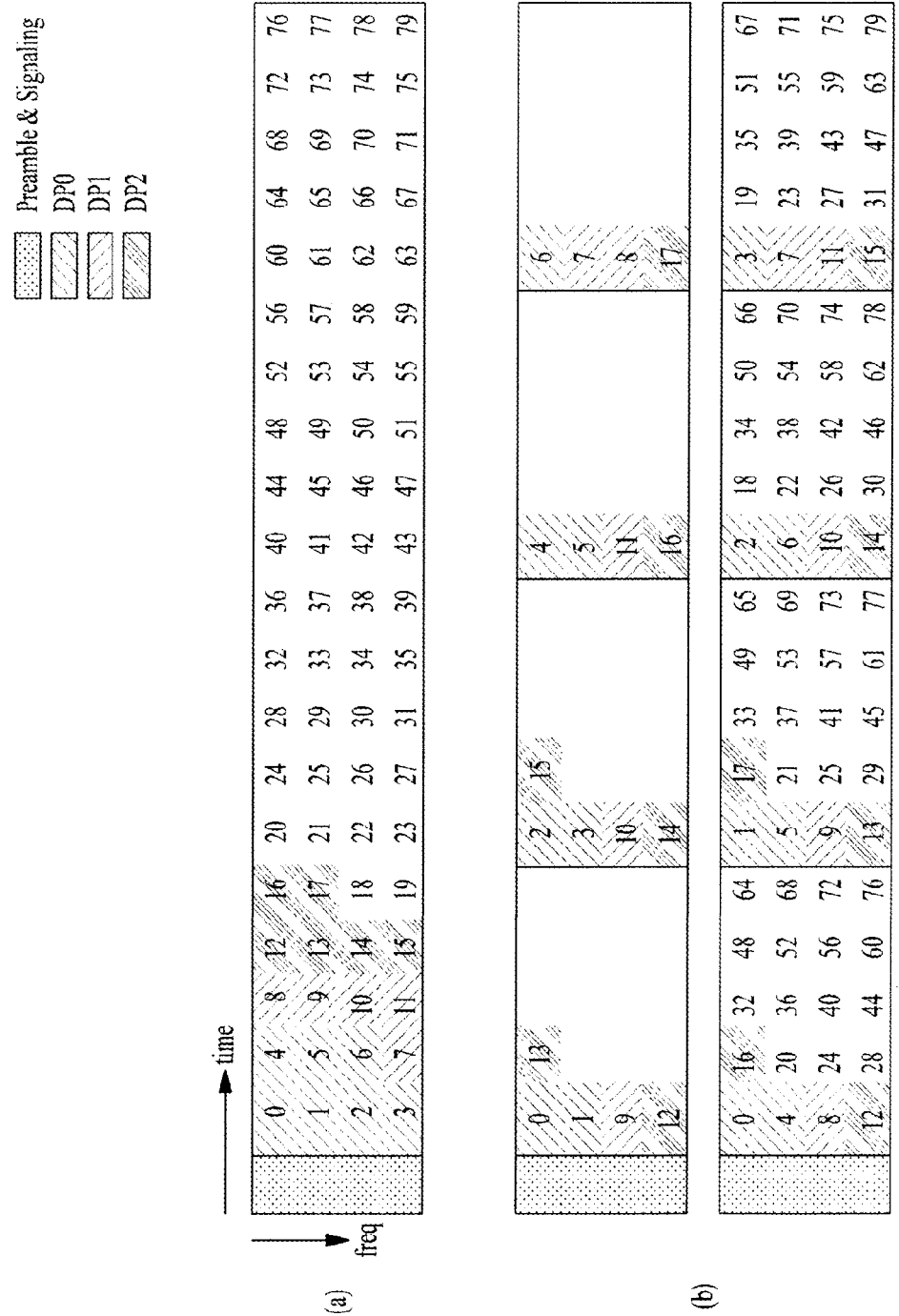
FIG. 28 illustrates an RB mapping of type1 DPs according to another embodiment of the present invention.

FIG. 28 is a view illustrating RB mapping of type1 DPs according to another embodiment of the present invention.

FIG. 28(a) illustrates an RB mapping order in a case when type1 DP0, DP1 and DP2 are allocated to only some RBs in a signal frame, and FIG. 28(b) illustrates an RB mapping order in a case when each of type1 DP0, DP1 and DP2 is partitioned and allocated to only some RBs included in different slots in a signal frame. Numerals indicated in the signal frame refer to the order of allocating RBs. If the order of allocating RBs is determined, corresponding DPs may be mapped to ultimately allocated RBs in the order of time.

FIG. 28(a) illustrates an RB mapping order in a case when N_Slot=1 and {DP0, DP1, DP2}={7,5,6}.

Specifically, DP0 may be mapped to RBs in a frequency axis direction according to the order of the RBs and, if an OFDM symbol is completely filled, move to a next OFDM symbol on the time axis to be continuously mapped in a frequency axis direction. Accordingly, if DP0 is mapped to RB0 to RB6, DP1 may be continuously mapped to RB7 to RB 11 and DP2 may be mapped to RB 12 to RB 17.

FIG. 28(h) illustrates an RB mapping order in a case when N_Slot=4 and {DP0, DP1, DP2}={7,5,6}.

FIG. 28(b) illustrates embodiments in which RBs of each DP are partitioned according to the RB partitioning rule described above in relation to FIG. 26 and are mapped to a signal frame. Detailed procedures thereof have been described above and thus are not described here.

Figure 29:
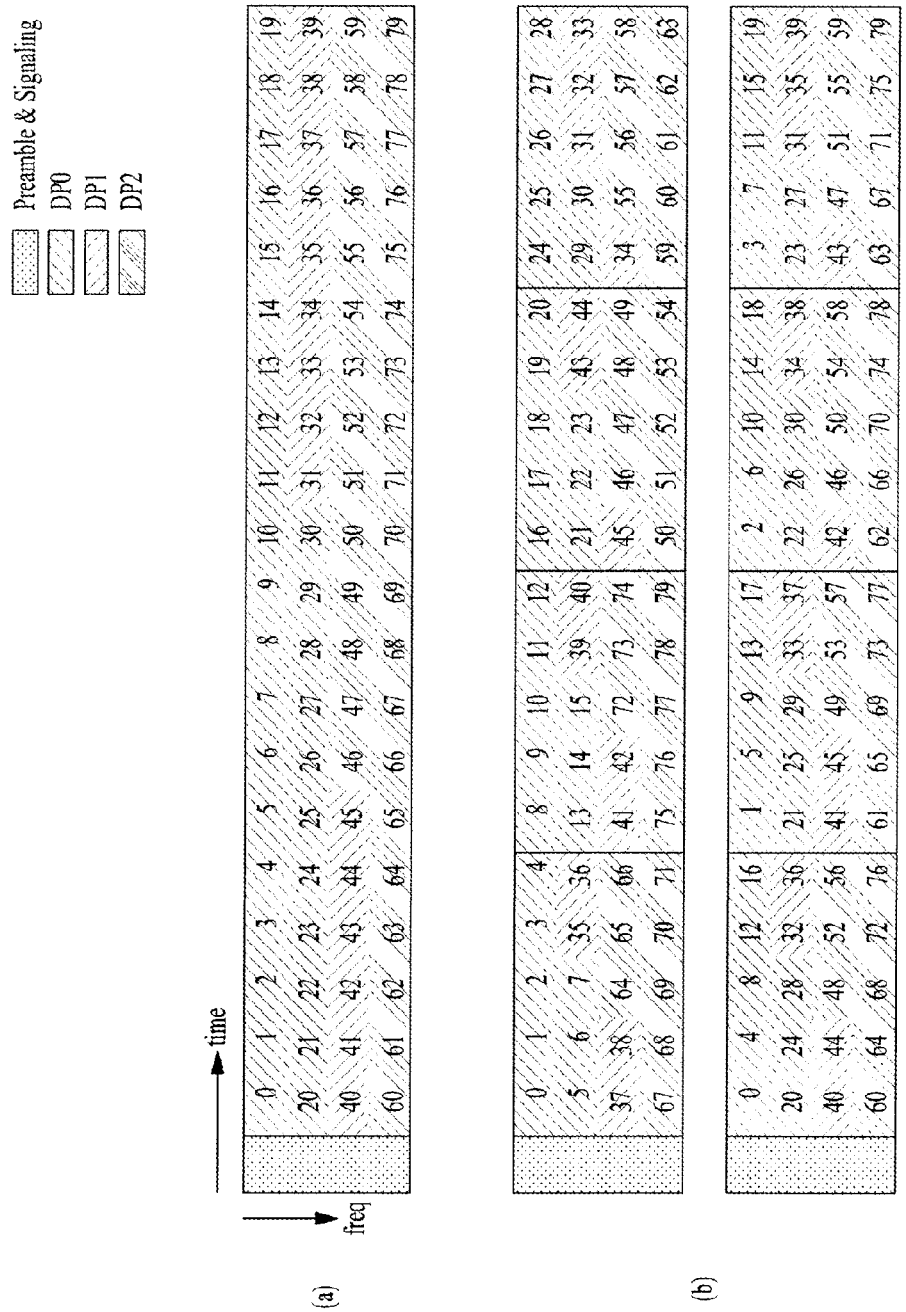
FIG. 29 illustrates an RB mapping of type2 DPs according to another embodiment of the present invention.

FIG. 29 is a view illustrating RB mapping of type2 DPs according to another embodiment of the present invention.

FIG. 29(a) illustrates an RB mapping order in a case when type2 DP0, DP1 and DP2 are allocated to available RBs in a signal frame, and FIG. 29(h) illustrates an RB mapping order in a case when each of type2 DP0, DP1 and DP2 is partitioned and allocated to RBs included in different slots in a signal frame. Numerals indicated in the signal frame refer to the order of allocating RBs. If the order of allocating RBs is determined, corresponding DPs may be mapped to ultimately allocated RBs in the order of time.

FIG. 29(a) illustrates an RB mapping order in a case when N_Slot=1 and {DP0, DP1, DP2}={31,15,34}.

Since RBs of type2 DPs are mapped to the end of a first frequency of the signal frame and then continuously mapped from a second frequency of a first OFDM symbol, time diversity may be achieved. Accordingly, if DP0 is mapped to RB0 to RB19 on a time axis and then continuously mapped to RB20 to RB30 of the second frequency, DP1 may be mapped to RB31 to RB45 in the same manner and DP2 may be mapped to RB46 to RB79.

To extract RBs to which a corresponding DP is mapped, the broadcast signal reception apparatus according to an embodiment of the present invention needs type information of each DP (DP_Type) and the number of equally partitioned slots (N_Slot), and needs signaling information including DP start address information of each DP (DP_RB_St), FEC block number information of each DP to be mapped to a signal frame (DP_N_Block), start address information of an FEC block mapped in a first RB (DP_FEC_St), etc.

Accordingly, the broadcast signal transmission apparatus according to an embodiment of the present invention may also transmit the above-described signaling information.

FIG. 29(b) illustrates an RB mapping order in a case when N_Slot=4 and {DP0, DP1, DP2}={31,15,34}.

A first signal frame of FIG. 29(b) shows a result of performing RB mapping according to the RB partitioning rule described above in relation to FIG. 26, and a second signal frame of FIG. 29(b) shows a result of performing RB mapping by equally applying the above-described RB mapping address of the type2 DPs. Although mapping methods and procedures of the above two cases are different, since mapping results thereof are the same, the same mapping characteristics may be achieved. In this case, RB mapping may be performed using a single equation irrespective of the value of N_Slot.

Figure 30:
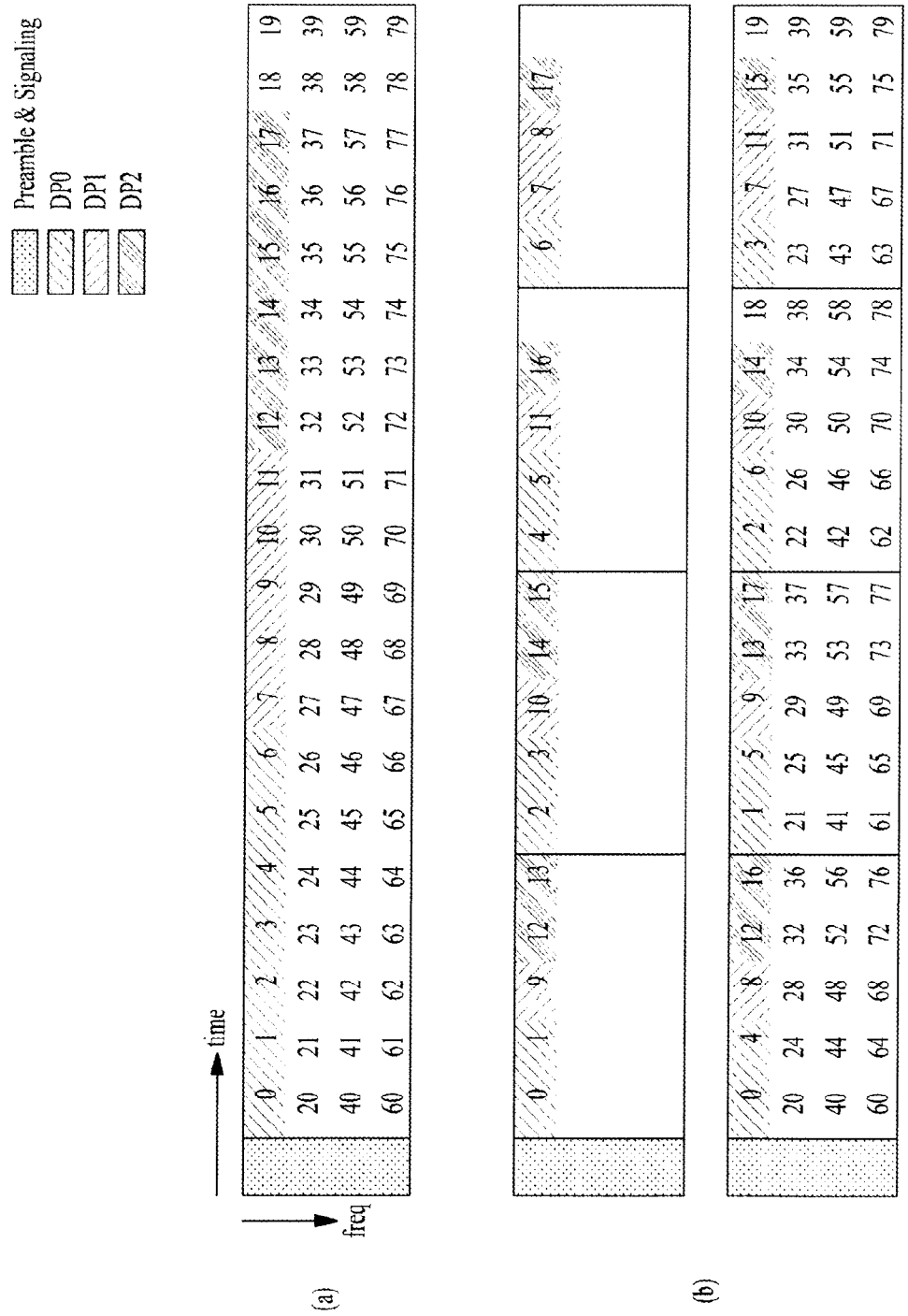
FIG. 30 illustrates an RB mapping of type2 DPs according to another embodiment of the present invention.

FIG. 30 is a view illustrating RB mapping of type2 DPs according to another embodiment of the present invention.

FIG. 30(a) illustrates an RB mapping order in a case when type2 DP0, DP1 and DP2 are allocated to only some RBs in a signal frame, and FIG. 30(b) illustrates an RB mapping order in a case when each of type2 DP0, DP1 and DP2 is partitioned and allocated to only some RBs included in different slots in a signal frame. Numerals indicated in the signal frame refer to the order of allocating RBs. If the order of allocating RBs is determined, corresponding DPs may be mapped to ultimately allocated RBs in the order of time.

FIG. 30(a) illustrates an RB mapping order in a case when N_Slot=1 and {DP0, DP1, DP2}={7,5,6}.

Specifically, DP0 may be mapped to RBs in a time axis direction according to the order of the RBs and, if DP0 is mapped to RB0 to RB6, DP1 may be continuously mapped to RB7 to RB11 and DP2 may be mapped to RB12 to RB17.

FIG. 30(b) illustrates an RB mapping order in a case when N_Slot=4 and {DP0, DP1, DP2}={7,5,6}.

FIG. 30(b) illustrates embodiments in which RBs of each DP are partitioned according to the RB partitioning rule described above in relation to FIG. 26 and are mapped to a signal frame. Detailed procedures thereof have been described above and thus are not described here.

Figure 31:
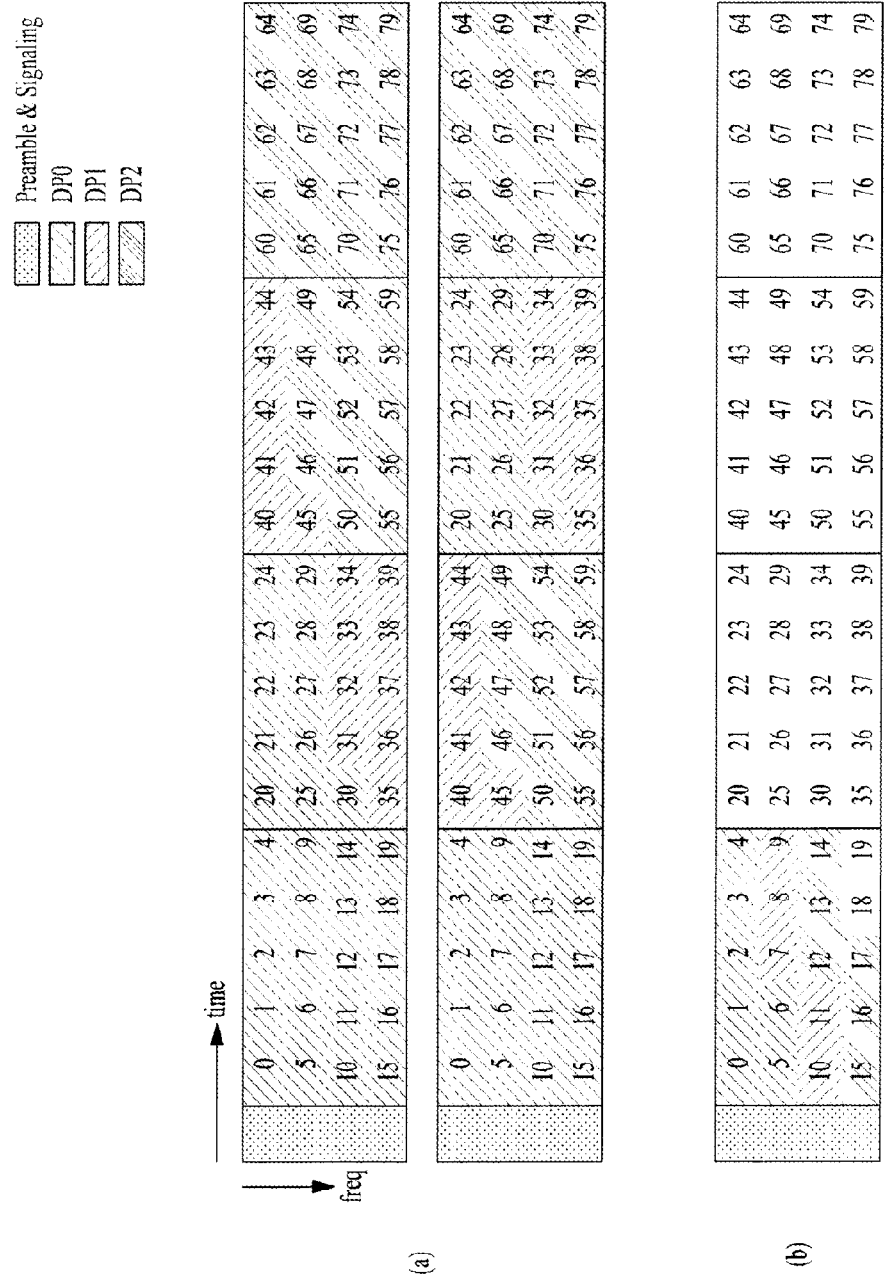
FIG. 31 illustrates an RB mapping of type3 DPs according to another embodiment of the present invention.

FIG. 31 is a view illustrating RB mapping of type3 DPs according to another embodiment of the present invention.

FIG. 31(a) illustrates an RB mapping order in a case when each of type3 DP0, DP1 and DP2 is partitioned and allocated to RBs included in different slots in a signal frame, and FIG. 31(b) illustrates an RB mapping order in a case when each of type3 DP0, DP1 and DP2 is partitioned and allocated to only some RBs included in a slot in a signal frame. Numerals indicated in the signal frame refer to the order of allocating RBs. If the order of allocating RBs is determined, corresponding DPs may be mapped to ultimately allocated RBs in the order of time.

FIG. 31(a) illustrates an RB mapping order in a case when N_Slot=4 and {DP0, DP1, DP2}={31,15,34}.

A first signal frame of FIG. 31(a) illustrates an embodiment in which the above-described RB mapping address of the type3 DPs is equally applied. A second signal frame of FIG. 31(a) illustrates an embodiment in which, when the number of RBs of a DP is greater than that of a slot, time diversity is achieved by changing a slot allocation order. Specifically, the second signal frame of FIG. 31(a) corresponds to an embodiment in which, when the number of RBs of DP0 allocated to a first slot of the first signal frame is greater than that of the first slot, the remaining RBs of DP0 are allocated to a third slot.

FIG. 31(b) illustrates an RB mapping order in a case when N_Slot=4 and {DP0, DP1, DP2}={7,5,6}.

Further, to extract RBs to which a corresponding DP is mapped, the broadcast signal reception apparatus according to an embodiment of the present invention needs type information of each DP (DP_Type) and the number of equally partitioned slots (N_Slot), and needs signaling information including DP start address information of each DP (DP_RB_St), FEC block number information of each DP to be mapped to a signal frame (DP_N_Block), start address information of an FEC block mapped in a first RB (DP_FEC_St), etc.

Accordingly, the broadcast signal transmission apparatus according to an embodiment of the present invention may also transmit the above-described signaling information.

Figure 32:
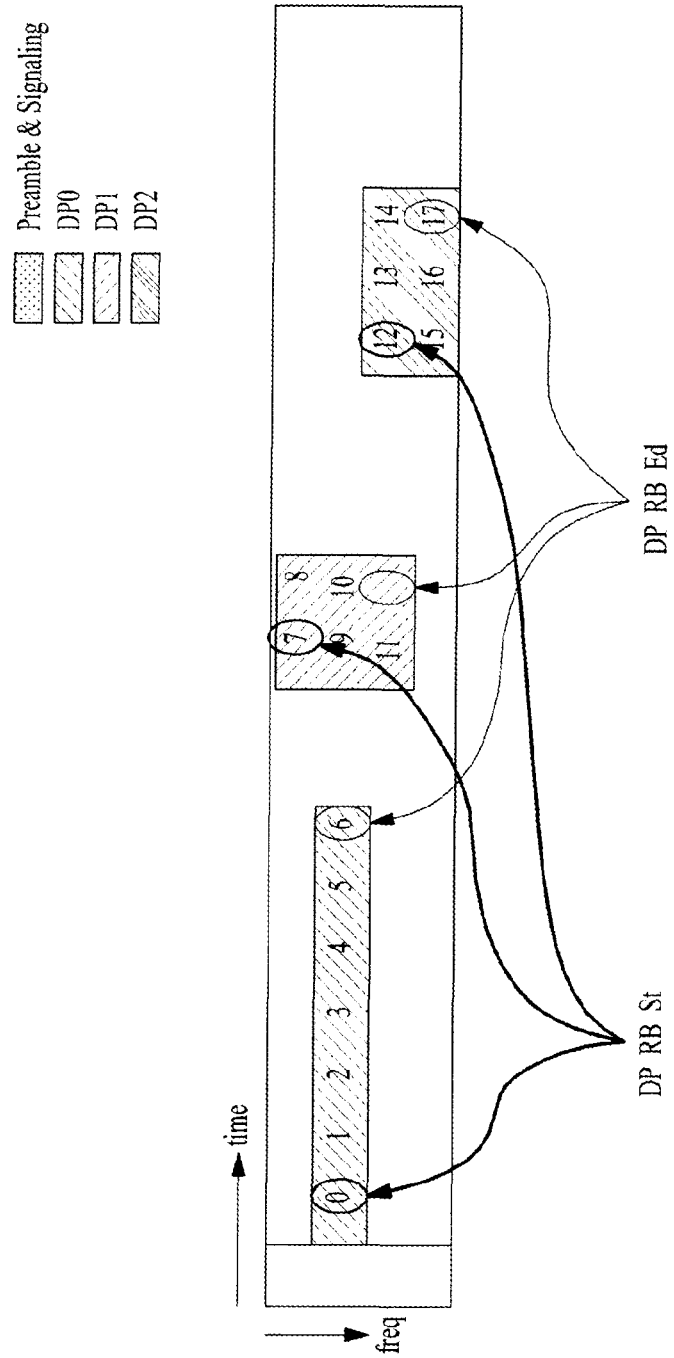
FIG. 32 illustrates an RB mapping of type3 DPs according to another embodiment of the present invention.

FIG. 32 is a view illustrating RB mapping of type3 DPs according to another embodiment of the present invention.

FIG. 32 illustrates RB mapping in a case when N_Slot=1 and {DP0, DP1, DP2}={7,5,6}. As illustrated in FIG. 32, RBs of each DP may be mapped on an arbitrary block basis in a signal frame. In this case, the broadcast signal reception apparatus according to an embodiment of the present invention needs additional signaling information as well as the above-described signaling information to extract RBs to which a corresponding DP is mapped.

As such, the present invention may exemplarily describe a case in which DP end address information of each DP (DP_RB_Ed) is additionally transmitted. Accordingly, the broadcast signal transmission apparatus according to an embodiment of the present invention may map RBs of the DP on an arbitrary block basis and transmit the above-described signaling information, and the broadcast signal reception apparatus according to an embodiment of the present invention may detect and decode the RBs of the DP mapped on an arbitrary block basis, using DP_RB_St information and DP_RB_Ed information included in the above-described signaling information. When this method is used, free RB mapping is enabled and thus DPs may be mapped with different RB mapping characteristics.

Specifically, as illustrated in FIG. 32, RBs of DP0 may be mapped in a corresponding block in a time axis direction to achieve time diversity like type2 DPs, RBs of DP1 may be mapped in a corresponding block in a frequency axis direction to achieve the power saving effect like type1 DPs.

Besides, RBs of DP2 may be mapped in a corresponding block in consideration of time diversity and power saving like type3 DPs.

Further, even in a case when RBs are not mapped in the whole corresponding block like DP1, the broadcast signal reception apparatus may accurately detect the locations of RBs to be acquired, using the above-described signaling information, e.g., DP_FEC_St information, DP_N_Block information, DP_RB_St information and DP_RB_Ed information, and thus a broadcast signal may be efficiently transmitted and received.

Figure 33:
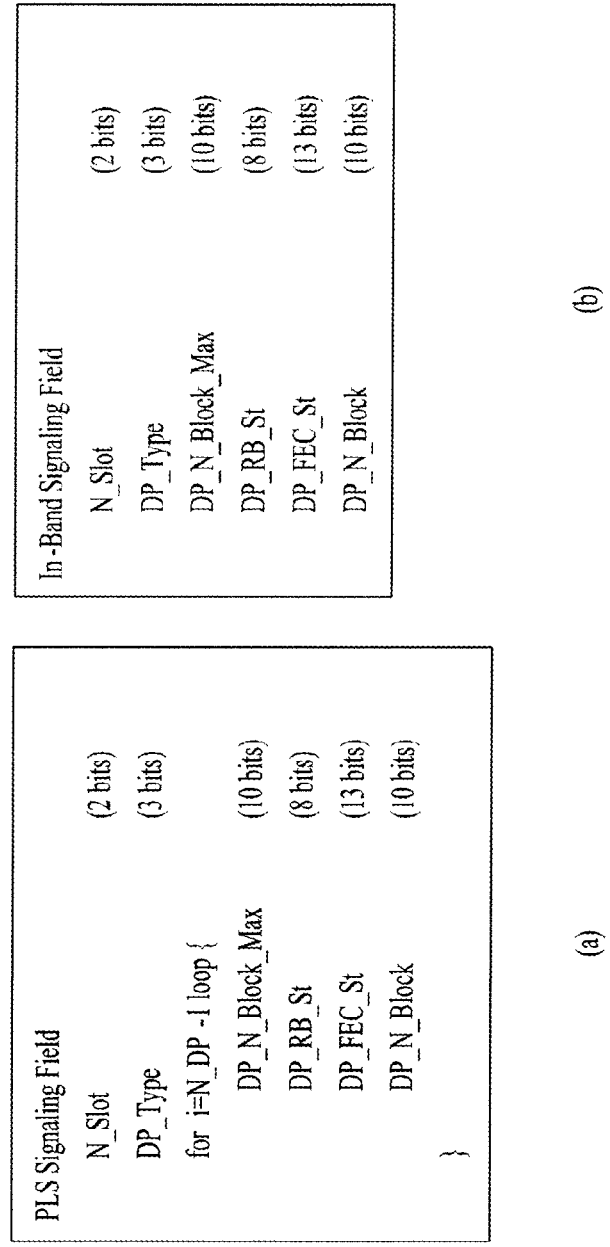
FIG. 33 illustrates a signaling information according to an embodiment of the present invention.

FIG. 33 is a view illustrating signaling information according to an embodiment of the present invention.

FIG. 33 illustrates the above-described signaling information related to RB mapping according to DP types, and the signaling information may be transmitted using signaling through a PLS (hereinafter referred to as PLS signaling) or in-band signaling.

Specifically, FIG. 33(a) illustrates signaling information transmitted through a PLS, and FIG. 33(b) illustrates signaling information transmitted through in-band signaling.

As illustrated in FIG. 33, the signaling information related to RB mapping according to DP types may include N_Slot information, DP_Type information, DP_N_Block information, DP_RB_St information, DP_FEC_St information and DP_N_Block information.

The signaling information transmitted through PLS signaling is the same as the signaling information transmitted through in-hand signaling. However, a PLS includes information about all DPs included in a corresponding signal frame for service acquisition and thus the signaling information other than N_Slot information and DP_Type information may be defined within a DP loop for defining information about every DP. On the other hand, in-band signaling is used to acquire a corresponding DP and thus is transmitted for each DP. As such, in-band signaling is different from PLS signaling in that a DP loop for defining information about every DP is not necessary. A brief description is now given of the signaling information.

N_Slot information: Information indicating the number of slots partitioned form a signal frame, which may have the size of 2 bits. According to an embodiment of the present invention, the number of slots may be 1,2,4,8.

DP_Type information: Information indicating the type of a DP, which may be one of type 1, type 2 and type 3 as described above. This information is extensible according to the intention of a designer and may have the size of 3 bits.

DP_N_Block Max information: Information indicating the maximum number of FEC blocks of a corresponding DP or a value equivalent thereto, which may have a size of 10 bits.

DP_RB_St information: Information indicating an address of a first RB of a corresponding DP, and the address of an RB may be expressed on an RB basis. This information may have a size of 8 bits.

DP_FEC_St information: Information indicating a first address of an FEC block of a corresponding DP to be mapped to a signal frame, and the address of an FEC block may be expressed on a cell basis. This information may have a size of 13 bits.

DP_N_Block information: Information indicating the number of FEC blocks of a corresponding DP to be mapped to a signal frame or a value equivalent thereto, which may have a size of 10 bits.

The above-described signaling information may vary name, size, etc. thereof according to the intention of a designer in consideration of the length of a signal frame, the size of time interleaving, the size of RB, etc.

Since PLS signaling and in-band signaling have a difference according to uses thereof as described above, for more efficient transmission, signaling information may be omitted for PLS signaling and in-band signaling as described below.

First, a PLS includes information about all DPs included in a corresponding signal frame. Accordingly, DPs are completely and sequentially mapped to the signal frame in the order of DP0, DP1, DP2, . . . , the broadcast signal reception apparatus may perform calculation to achieve DP_RB_St information. In this case, DP_RB_St information may be omitted.

Second, in the case of in-band signaling, the broadcast signal reception apparatus may acquire DP_FEC_St information of a next signal frame using DP_N_Block information of a corresponding DP. Accordingly, DP_FEC_St information may be omitted.

Third, in the case of in-band signaling, when N_Slot information, DP_Type information and DP_N_Block Max information which influence mapping of a corresponding DP are changed, a 1-bit signal indicating whether the corresponding information is changed may be used, or the change may be signaled. In this case, additional N_Slot information, DP_Type information and DP_N_Block Max information may be omitted.

That is, DP_RB_St information may be omitted in the PLS, and signaling information other than DP_RB_St information and DP_N_Block information may be omitted in in-band signaling. This is variable according to the intention of a designer.

Figure 34:
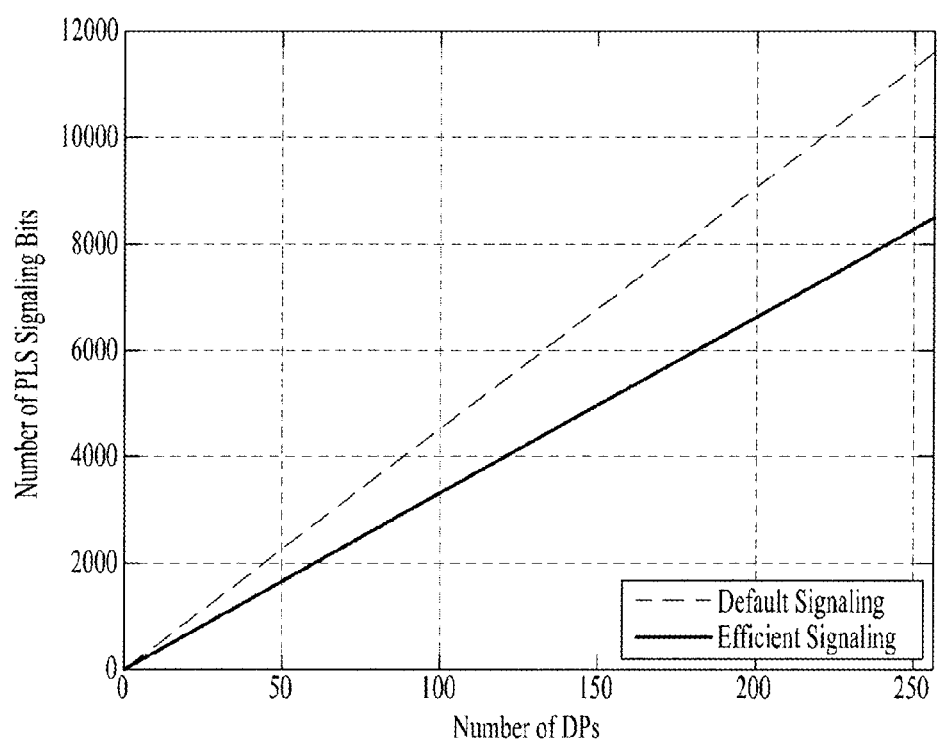
FIG. 34 illustrates a graph showing the number of bits of a PLS according to the number of DPs according to an embodiment of the present invention.

FIG. 34 is a graph showing the number of bits of a PLS according to the number of DPs according to an embodiment of the present invention.

Specifically, FIG. 34 shows an increase in number of bits for PLS signaling in a case when signaling information related to RB mapping according to DP types is transmitted through a PLS, as the number of DPs is increased.

A dashed line refers to a case in which every related signaling information is transmitted (Default signaling), and a solid line refers to a case in which the above-described types of signaling information are omitted (Efficient signaling). As the number of DPs is increased, if certain types of signaling information are omitted, it is noted that the number of saved bits is linearly increased.

Figure 35:
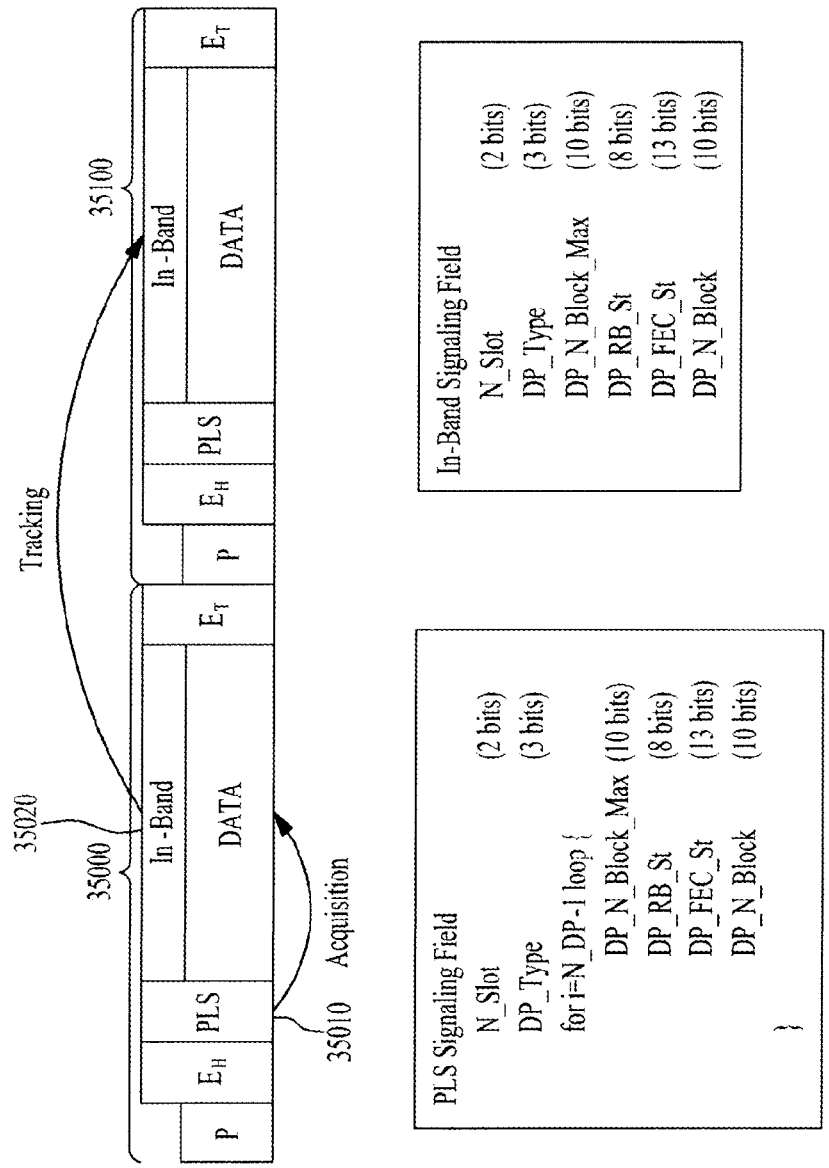
FIG. 35 illustrates a procedure for demapping DPs according to an embodiment of the present invention.

FIG. 35 is a view illustrating a procedure for demapping DPs according to an embodiment of the present invention.

As illustrated in the top of FIG. 35, the broadcast signal transmission apparatus according to an embodiment of the present invention may transmit contiguous signal frames 35000 and 35100. The configuration of each signal frame is as described above.

As described above, when the broadcast signal transmission apparatus maps DPs of different types to a corresponding signal frame on an RB basis and transmits the signal frame, the broadcast signal reception apparatus may acquire a corresponding DP using the above-described signaling information related to RB mapping according to DP types.

As described above, the signaling information related to RB mapping according to DP types may be transmitted through a PLS 35010 of the signal frame or through in-band signal 35020. FIG. 35(a) illustrates signaling information related to RB mapping according to DP types, which is transmitted through the PLS 35010, and FIG. 35(b) illustrates signaling information related to RB mapping according to DP types, which is transmitted through in-band signaling 35020. In-band signaling 35020 is processed, e.g., coded, modulated, and time-interleaved, together with data included in the corresponding DP, and thus may be indicated as being included as parts of data symbols in the signal frame. Each type of signaling information has been described above and thus is not described here.

As illustrated in FIG. 35, the broadcast signal reception apparatus may acquire the signaling information related to RB mapping according to DP types, which is included in the PLS 35010, and thus may demap and acquire DPs mapped to the corresponding signal frame 35000. Further, the broadcast signal reception apparatus may acquire the signaling information related to RB mapping according to DP types, which is transmitted through in-band signaling 35020, and thus may demap DPs mapped to the next signal frame 35100.

Figure 36:
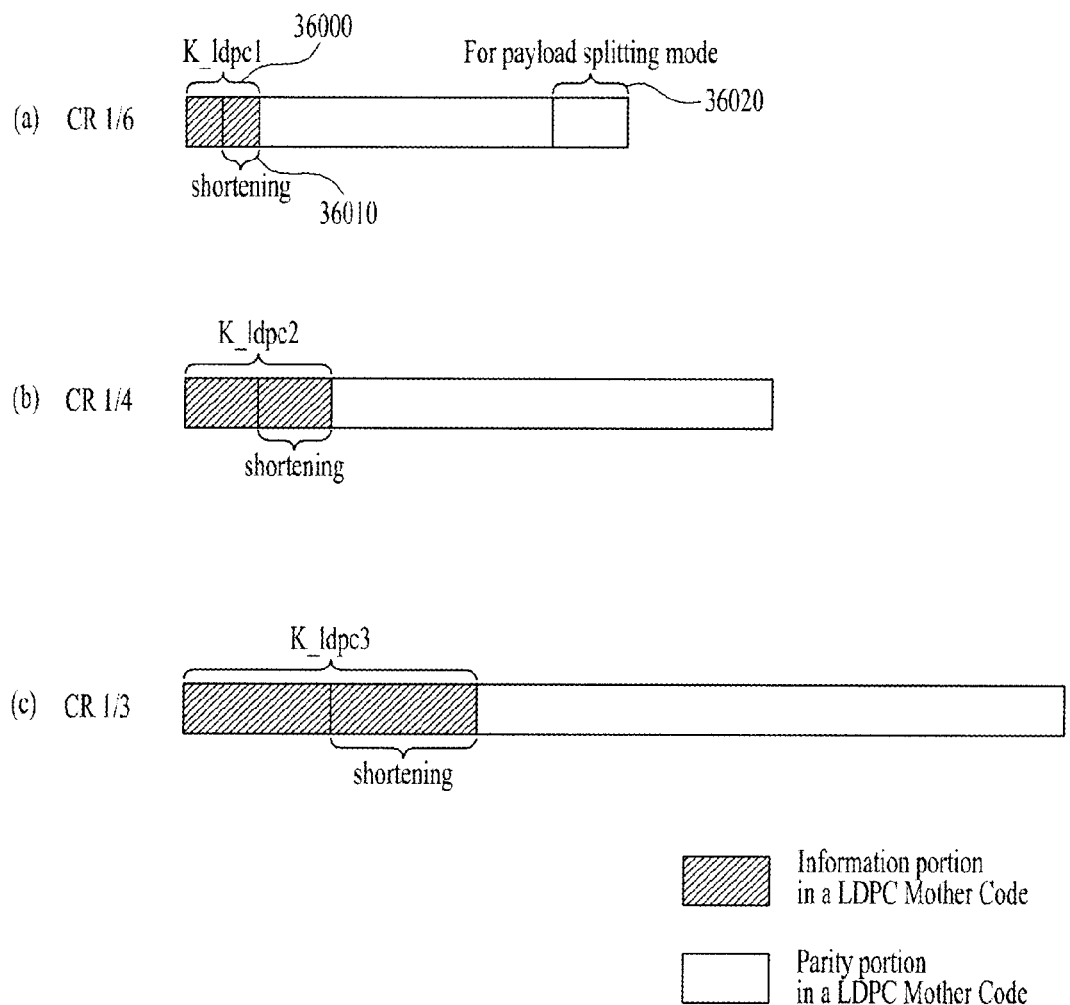
FIG. 36 illustrates exemplary structures of three types of mother codes applicable to perform LDPC encoding on PLS data in an FEC encoder module according to another embodiment of the present invention.

FIG. 36 is a view illustrating exemplary structures of three types of mother codes applicable to perform LDPC encoding on PLS data in an FEC encoder module according to another embodiment of the present invention.

PLS-pre data and PLS-post data output from the above-described PLS generation module 4300 are independently input to the BB scrambler module 4400. In the following description, the PLS-pre data and the PLS-post data may be collectively called PLS data. The BB scrambler module 4400 may perform initialization to randomize the input PLS data. The BB scrambler module 4400 may initialize the PLS data located and to be transmitted in frame, on a frame basis.

If the PLS located and to be transmitted in frame includes information about a plurality of frames, the BB scrambler module 4400 may initialize the PLS data on a frame basis. An example thereof is the case of a PLS repetition frame structure to be described below. According to an embodiment of the present invention, PLS repetition refers to a frame configuration scheme for transmitting PLS data for a current frame and PLS data for a next frame together in the current frame. When PLS repetition is applied, the BB scrambler module 4400 may independently initialize the PLS data for the current frame and the PLS data for the next frame. A detailed description of PLS repetition will be given below.

The BB scrambler module 4400 may randomize the PLS-pre data and the PLS-post data initialized on a frame basis.

The randomized PLS-pre data and the PLS-post data are input to the coding & modulation module 5300. The randomized PLS-pre data and the randomized PLS-post data may be respectively input to the FEC encoder modules 5310 included in the coding & modulation module 5300. The FEC encoder modules 5310 may respectively perform BCH encoding and LDPC encoding on the input PLS-pre data and the PLS-post data. Accordingly, the FEC encoder modules 5310 may respectively perform LDPC encoding on the randomized PLS-pre data and the randomized PLS-post data input to the FEC encoder modules 5310.

BCH parity may be added to the randomized PLS data input to the FEC encoder modules 5310 due to BCH encoding, and then LDPC encoding may be performed on the BCH-encoded data. LDPC encoding may be performed based on one of mother code types having different sizes in information portion (hereinafter, the size of information portion is called K_ldpc) according to the size of input data including BCH parity (hereinafter, the size of data input to an LDPC encoder module is called N_BCH). The FEC encoder module 5310 may shorten data of an information portion of an LDPC mother code corresponding to the difference 36010 in size between K_ldpc and N_BCH, to 0 or 1, and may puncture a part of data included in a parity portion, thereby outputting a shortened/punctured LDPC code. The LDPC encoder module may perform LDPC encoding on the input PLS data or the BCH-encoded PLS data based on the shortened/punctured LDPC code and output the LDPC-encoded PLS data.

Here, BCH encoding is omittable according to the intention of a designer. If BCH encoding is omitted, the FEC encoder module 5310 may generate an LDPC mother code by encoding the PLS data input to the FEC encoder module 5310. The FEC encoder module 5310 may shorten data of an information portion of the generated LDPC mother code corresponding to the difference 36010 in size between K_ldpc and PLS data, to 0 or 1, and may puncture a part of data included in a parity portion, thereby outputting a shortened/punctured LDPC code. The FEC encoder module 5310 may perform LDPC encoding on the input PLS data based on the shortened/punctured LDPC code and output the LDPC-encoded PLS data.

FIG. 36(a) illustrates an exemplary structure of mother code type1. Here, mother code type1 has a code rate of 1/6. FIG. 36(b) illustrates an exemplary structure of mother code type2. Here, mother code type2 has a code rate of 1/4. FIG. 36(c) illustrates an exemplary structure of mother code type3. Here, mother code type3 has a code rate of 1/3.

The code rate of each mother code is variable according to the intention of a designer. For example, mother code type3 may have a code rate of 3/10.

As illustrated in FIG. 36, each mother code may include an information portion and a parity portion. According to an embodiment of the present invention, the size of data corresponding to an information portion 3600 of a mother code may be defined as K_ldpc. K_ldpc of mother code type1, mother code type2 and mother code type3 may be respectively called k_ldpc1, k_ldpc2 and k_ldpc3.

A description is now given of an LDPC encoding procedure performed by an FEC encoder module based on mother code type1 illustrated in FIG. 36(a). In the following description, encoding may refer to LDPC encoding.

When BCH encoding is applied, the information portion of the mother code may include BCH-encoded PLS data including BCH parity bits and input to the LDPC encoder module of the FEC encoder module.

When BCH encoding is not applied, the information portion of the mother code may include PLS data input to the LDPC encoder module of the FEC encoder module.

The size of the PLS data input to the FEC encoder module may vary according to the size of additional information (management information) to be transmitted and the size of data of transmission parameters. The FEC encoder module may insert "0" bits to the BCH-encoded PLS data. If BCH encoding is not performed, the FEC encoder module may insert "0" bits to the PLS data.

The present invention may provide three types of dedicated mother codes used to perform the above-described LDPC encoding according to another embodiment. The FEC encoder module may select a mother code according to the size of PLS data, and the mother code selected by the FEC encoder module according to the size of PLS data may be called a dedicated mother code. The FEC encoder module may perform LDPC encoding based on the selected dedicated mother code.

According to an embodiment of the present invention, the size 36000 of K_ldpc1 of mother code type1 may be assumed as ½ of the size of K_ldpc2 of mother code type2 and ¼ of the size of K_ldpc3 of mother code type3. The relationship among the sizes of K_ldpc of mother code types is variable according to the intention of a designer. The designer may design a mother code having a small size of K_ldpc to have a low code rate. To maintain a constant signaling protection level of PLS data having various sizes, an effective code rate after shortening and puncturing should be lowered as the size of PLS data is small. To reduce the effective code rate, a parity ratio of a mother code having a small size of K_ldpc may be increased.

If the PLS data has an excessively large size and thus cannot be encoded based on one of a plurality of mother code types by the FEC encoder module, the PLS data may be split into a plurality of pieces for encoding. Here, each piece of the PLS data may be called fragmented PLS data. The above-described procedure for encoding the PLS data by the FEC encoder module may be replaced with a procedure for encoding each fragmented PLS data if the PLS data has an excessively large size and thus cannot be encoded based on one of a plurality of mother code types by the FEC encoder module.

When the FEC encoder module encodes mother code type1, to secure a signaling protection level in a very low signal to noise ratio (SNR) environment, payload splitting may be performed. The length of parity of mother code type1 may be increased due to a portion 36020 for executing a payload splitting mode. A detailed description of the mother code selection method and the payload splitting mode will be given below.

If the FEC encoder module encodes PLS data having various sizes based on a single mother code type having a large size of K_ldpc, a coding gain may be rapidly reduced. For example, when the above-described FEC encoder module performs shortening using a method for determining a shortening data portion (e.g., K_ldpc−N_BCH), since K_ldpc is constant, small-sized PLS data is shortened more than large-sized PLS data.

To solve the above-described problem, the FEC encoder module according to an embodiment of the present invention may apply a mother code type capable of achieving an optimal coding gain among a plurality of mother code types differently according to the size of PLS data.

The FEC encoder module according to an embodiment of the present invention may restrict the size of a portion to be shortened by the FEC encoder module to achieve an optimal coding gain. Since the FEC encoder module restricts the size 36010 of a shortening portion to be shortened to a certain ratio of K_ldpc 36000 of each mother code, a coding gain of a dedicated mother code of each PLS data may be constantly maintained. The current embodiment shows an example in which shortening can be performed up to 50% of the size of K_ldpc. Accordingly, when the above-described FEC encoder module determines a shortening data portion as the difference between K_ldpc and N_BCH, if the difference between K_ldpc and N_BCH is greater than ½ of K_ldpc, the FEC encoder module may determine the size of a data portion to be shortened by the FEC encoder module as K_ldpc*½ instead of K_ldpc−N_BCH.

LDPC encoding procedures performed by the FEC encoder module based on mother code type2 and mother code type3 illustrated in FIGS. 36(*b*) and 36(*c*) may be performed in the same manner as the above-described LDPC encoding procedure performed by the FEC encoder module based on mother code type1 illustrated in FIG. 36(*a*).

The FEC encoder module may perform encoding based on an extended LDPC code by achieving an optimal coding gain by encoding PLS data having various sizes based on a single mother code.

However, a coding gain achievable when encoding is performed based on an extended LDPC code is approximately 0.5 dB lower than the coding gain achievable when encoding is performed based on dedicated mother codes optimized to different sizes of PLS data as described above. Thus, if the FEC encoder module according to an embodiment of the present invention encodes PLS data by selecting a mother code type structure according to the size of PLS data, redundancy data may be reduced and PLS signaling protection capable of ensuring the same reception performance may be designed.

Figure 37:
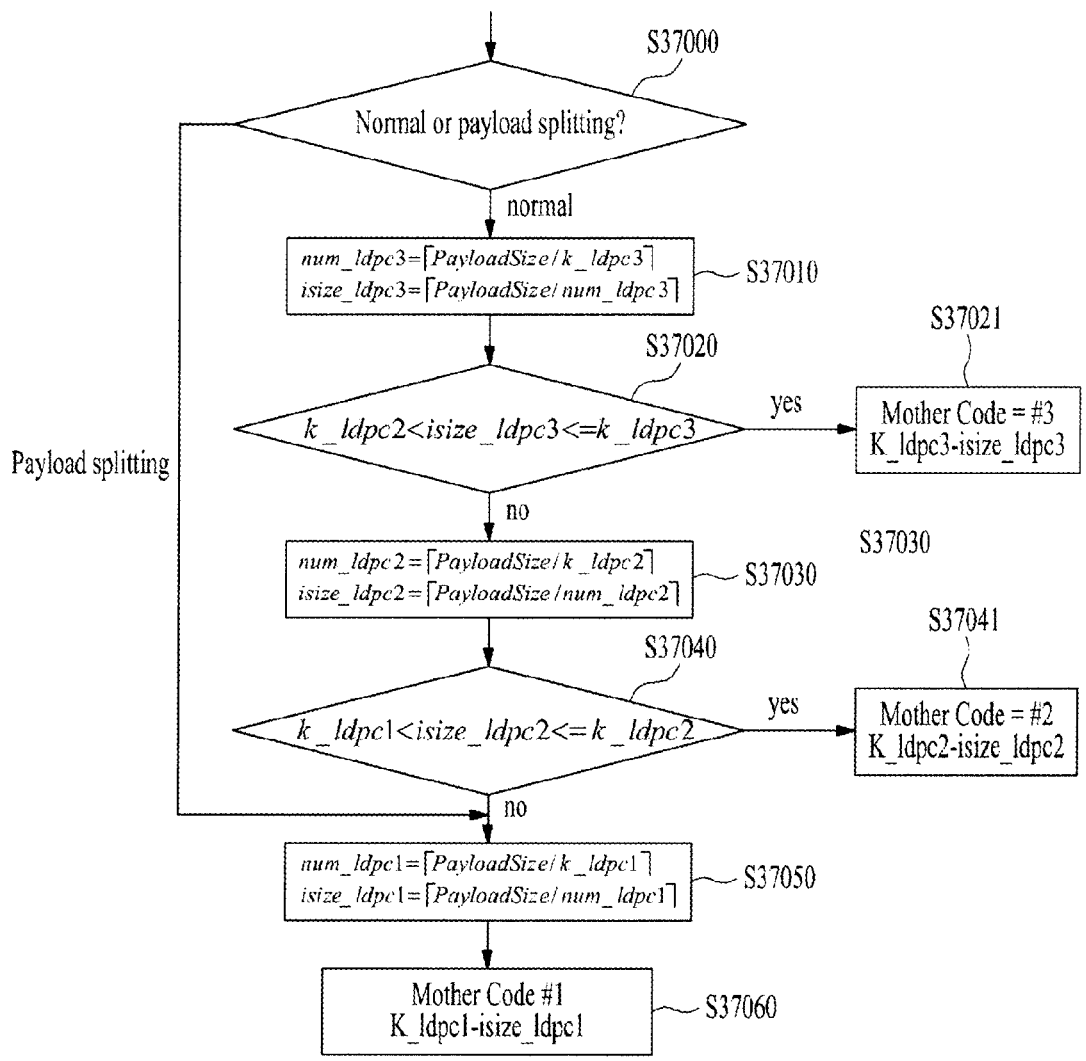
FIG. 37 illustrates a flowchart of a procedure for selecting a mother code type used for LDPC encoding and determining the size of shortening according to another embodiment of the present invention.

FIG. 37 is a flowchart of a procedure for selecting a mother code type used for LDPC encoding and determining the size of shortening according to another embodiment of the present invention.

A description is now given of a procedure for selecting a mother code type according to the size of PLS data (payload size) to be LDPC-encoded and determining the size of shortening by the FEC encoder module. The following description is assumed that all operations below are performed by the FEC encoder module.

It is checked whether an LDPC encoding mode is a normal mode or a payload splitting mode (S37000). If the LDPC encoding mode is a payload splitting mode, mother code1 may be selected irrespective of the size of PLS data and the size of shortening is determined based on the size of K_ldpc of mother code type1 (k_ldpc1) (S37060). A detailed description of the payload splitting mode will be given below.

If the LDPC encoding mode is a normal mode, the FEC encoder module selects a mother code type according to the size of PLS data. A description is now given of the procedure for selecting a mother code type in the normal mode by the FEC encoder module.

Num_ldpc refers to the number of fragmented PLS data which can be included in a single piece of PLS data. Isize_ldpc refers to the size of fragmented PLS data input to the FEC encoder module. Num_ldpc3 may be determined as a rounded-up value of a value obtained by dividing the size of input PLS data (payload size) by k_ldpc3 for encoding. The value of isize_ldpc3 may be determined as a rounded-up value of a value obtained by dividing the size of PLS data (payload size) by the determined num_ldpc3 (S37010). It is determined whether the value of isize_ldpc3 is in a range greater than k_ldpc2 and equal to or less than k_ldpc3 (S37020). If the size of isize_ldpc3 is in a range greater than k_ldpc2 and equal to or less than k_ldpc3, mother code type3 is determined. In this case, the size of shortening may be determined based on a difference value between k_ldpc3 and isize_ldpc3 (S37021).

If the value of isize_ldpc3 is not in a range greater than k_ldpc2 and equal to or less than k_ldpc3, a rounded-up value of a value obtained by dividing the size of PLS data (marked as "payload size" in FIG. 37) by k_ldpc2 is determined as num_ldpc2. The value of isize_ldpc2 may be determined as a rounded-up value of a value obtained by dividing the size of PLS data (payload size) by the determined num_ldpc2 (S37030). It is determined whether the value of isize_ldpc2 is in a range greater than k_ldpc1 and equal to or less than k_ldpc2 (S37040). If the value of isize_ldpc2 is in a range greater than k_ldpc1 and equal to or less than k_ldpc2, mother code type2 is determined. In this case, the size of shortening may be determined based on a difference value between k_ldpc2 and isize_ldpc2 (S37041).

If the value of isize_ldpc2 is in not a range greater than k_ldpc1 and equal to or less than k_ldpc2, a rounded-up value of a value obtained by dividing the size of PLS data (payload size) by k_ldpc1 is determined as num_ldpc1. The value of isize_ldpc1 may be determined as a rounded-up value of a value obtained by dividing the size of PLS data (payload size) by the determined num_ldpc1 (S37050). In this case, mother code type1 is determined and the size of shortening may be determined based on a difference value between k_ldpc1 and isize_ldpc1 (S37060).

The above-described num_ldpc and isize_ldpc may have different values according to the size of PLS data. However, k_ldpc1, k_ldpc2 and k_ldpc3 according to the mother code type are not influenced by the size of PLS data and have constant values.

FIG. 38 is a view illustrating a procedure for encoding adaptation parity according to another embodiment of the present invention.

FIG. 38(a) illustrates an example of PLS data input to the FEC encoder module for LDPC encoding.

FIG. 38(b) illustrates an exemplary structure of an LDPC code after performing LDPC encoding and before performing shortening and puncturing.

FIG. 38(c) illustrates an exemplary structure of an LDPC code after performing LDPC encoding, shortening and puncturing (38010) (hereinafter referred to as a shortened/punctured LDPC code), which is output from the FEC encoder module.

FIG. 38(d) illustrates an exemplary structure of a code output by adding adaptation parity (38011) to the LDPC code which is LDPC-encoded, shortened and punctured by the FEC encoder module, according to another embodiment of the present invention. Here, a scheme for outputting the code by adding adaptation parity (38011) to the shortened/punctured LDPC code by the FEC encoder module is called an adaptation parity scheme.

To maintain a signaling protection level, the FEC encoder module may perform LDPC-encode and then shorten the PLS data, puncture (38010) some of parity bits, and thus output the shortened/punctured LDPC code. In a poor reception environment, the signaling protection level needs to be strengthened compared to the robustness constantly supported by a broadcast system, i.e., a constant target threshold of visibility (TOV). According to an embodiment of the present invention, to strengthen the signaling protection level, an LDPC code may be output by adding adaptation parity bits to the shortened/punctured LDPC code. The adaptation parity bits may be determined as some parity bits (38011) of the parity bits (38010) punctured after LDPC encoding.

FIG. 38(c) illustrates a basic target TOV in a case when an effective code rate is approximately 1/3. According to an embodiment of the present invention, if the FEC encoder module adds the adaptation parity bits (38011), actually punctured parity bits may be reduced. The FEC encoder module may adjust the effective code rate to approximately 1/4 by adding adaptation parity bits as illustrated in FIG. 38(d). According to an embodiment of the present invention, a mother code used for LDPC encoding may additionally include a certain number of parity bits to acquire the adaptation parity bits 38011. Accordingly, the coding rate of a mother code used for adaptation parity encoding may be designed to be lower than the code rate of an original mother code.

The FEC encoder module may output the added parity (38011) included in the LDPC code by arbitrarily reducing the number of punctured parity bits. A diversity gain may be achieved by including the output added parity (38011) included in the LDPC code, in a temporally previous frame and transmitting the previous frame via a transmitter. The end of an information portion of a mother code is shortened and the end of a parity portion of the mother code is punctured in FIG. 38(b). However, this merely corresponds to an exemplary embodiment and the shortening and puncturing portions in the mother code may vary according to the intention of a designer.

Figure 39:
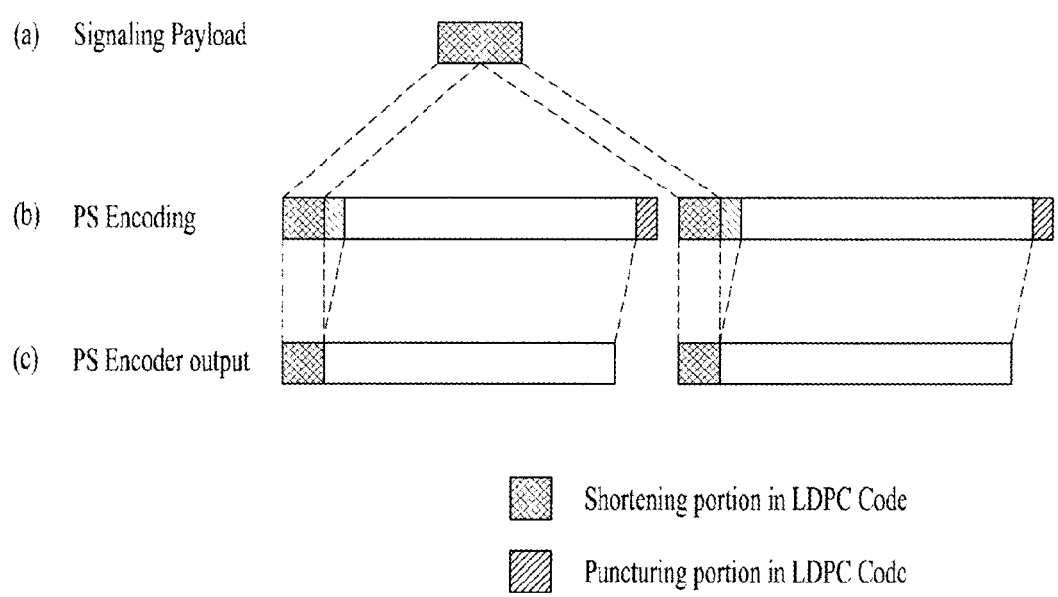
FIG. 39 illustrates a payload splitting mode for splitting PLS data input to the FEC encoder module before LDPC-encoding the input PLS data according to another embodiment of the present invention.

FIG. 39 is a view illustrating a payload splitting mode for splitting PLS data input to the FEC encoder module before LDPC-encoding the input PLS data according to another embodiment of the present invention. In the following description, the PLS data input to the FEC encoder module may be called payload.

FIG. 39(a) illustrates an example of PLS data input to the FEC encoder module for LDPC encoding.

FIG. 39(b) illustrates an exemplary structure of an LDPC code obtained by LDPC-encoding each split piece of payload. The structure of the LDPC code illustrated in FIG. 39(b) is the structure before performing shortening/puncturing.

FIG. 39(c) illustrates an exemplary structure of a shortened/punctured LDPC code output from the FEC encoder module according to another embodiment of the present invention. The structure of the shortened/punctured LDPC code illustrated in FIG. 39(c) is the structure of the shortened/punctured LDPC code output when a payload splitting mode is applied to the FEC encoder module.

Payload splitting is performed by the FEC encoder module to achieve the robustness strengthened compared to a constant target TOV for signaling.

As illustrated in FIG. 39(b), the payload splitting mode is a mode for splitting PLS data before LDPC encoding and performing LDPC encoding on each split piece of the PLS data by the FEC encoder module.

As illustrated in FIG. 39(c), in the payload splitting mode, the input PLS data may be encoded and shortened/punctured using only a mother code type having the lowest code rate among mother code types provided by the FEC encoder module (e.g., mother code type1 according to the current embodiment).

A method for selecting one of three mother code types based on the size of PLS data and performing LDPC encoding on the LDPC encoding based on the selected mother code type to adjust a signaling protection level by FEC encoder module has been described above. However, if a mother code type having the highest code rate is selected among mother code types provided by the FEC encoder module (e.g., mother code type3 according to the current embodiment), the signaling protection level may be restricted. In this case, the FEC encoder module may apply the payload splitting mode to the PLS data and LDPC-encode every piece of the PLS data using only a mother code type having the lowest code rate among mother code types provided by the FEC encoder module, thereby adjusting the signaling protection level to be low. When the payload splitting mode is used, the FEC encoder module may adjust the size of punctured data according to a strengthened target TOV after shortening.

According to the previous embodiment of the present invention, when the FEC encoder module does not use the payload splitting mode for LDPC encoding, the effective code rate of the shortened/punctured LDPC code was approximately 1/3. However, in FIG. 39(c), the effective code rate of the output LDPC code to which the payload splitting mode is applied by the FEC encoder module is approximately 11/60. Accordingly, the effective code rate of the output LDPC code to which the payload splitting mode is applied may be reduced.

The end of an information portion of an LDPC code is shortened and the end of a parity portion of the LDPC code is punctured in FIG. 39(b). However, this merely corresponds to an exemplary embodiment and the shortening and puncturing portions in the LDPC code may vary according to the intention of a designer.

Figure 40:
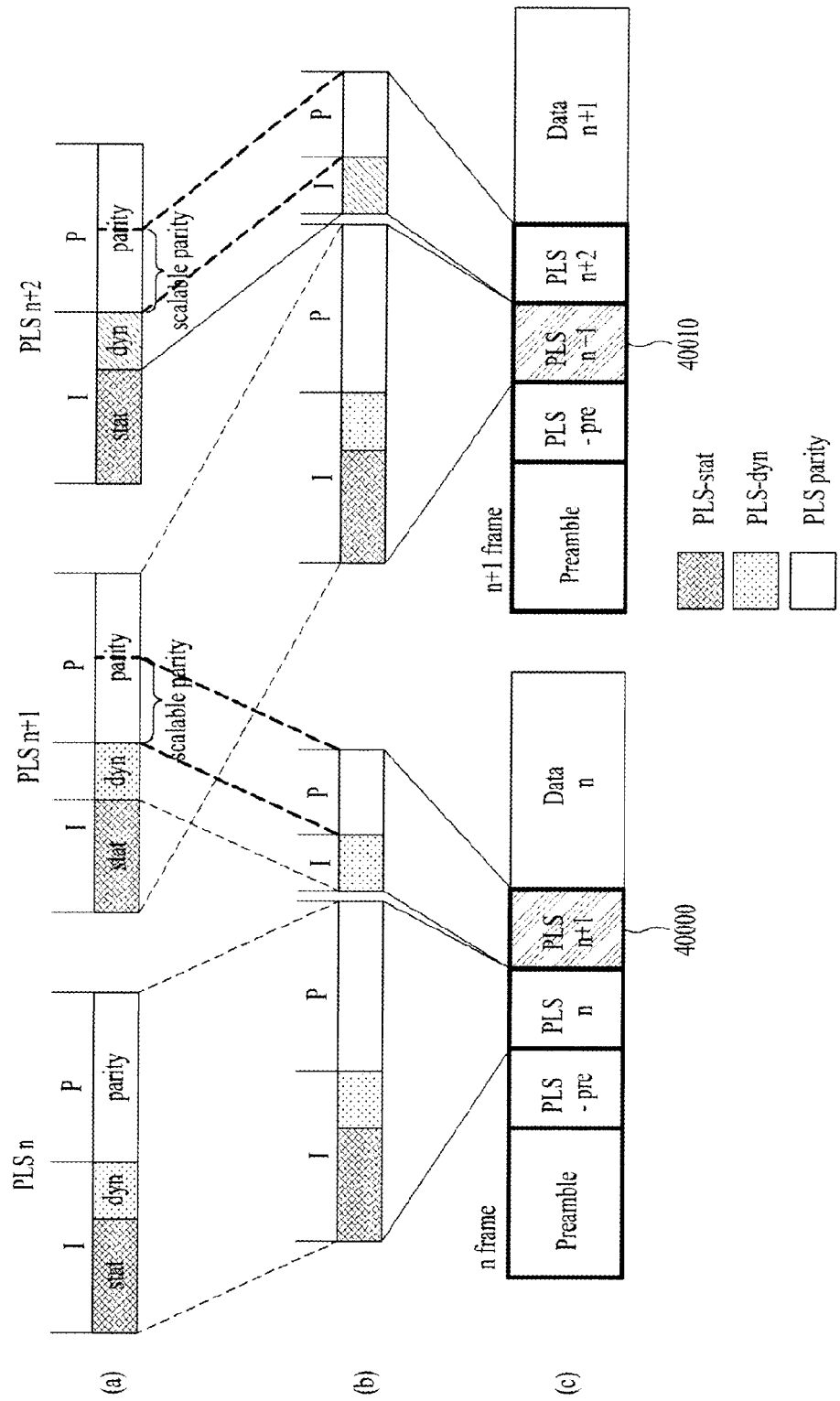
FIG. 40 illustrates a procedure for performing PLS repetition and outputting a frame by the frame structure module 1200 according to another embodiment of the present invention.

FIG. 40 is a view illustrating a procedure for performing PLS repetition and outputting a frame by the frame structure module 1200 according to another embodiment of the present invention.

According to another embodiment of the present invention, PLS repetition performed by the frame structure module corresponds to a frame structure scheme for including two or more pieces of PLS data including information about two or more frames in a single frame.

A description is now given of PLS repetition according to an embodiment of the present invention.

FIG. 40(a) illustrates an exemplary structure of a plurality of pieces of PLS data encoded by the FEC encoder module.

FIG. 40(b) illustrates an exemplary structure of a frame including a plurality of pieces of encoded PLS data due to PLS repetition by the frame structure module.

FIG. 40(c) illustrates an exemplary structure of a current frame including PLS data of the current frame and PLS data of a next frame.

Specifically, FIG. 40(c) illustrates an exemplary structure of an nth frame (current frame) including PLS data (PLS n) of the nth frame and PLS data 40000 of an (n+1)th frame (next frame), and the (n+1)th frame (current frame) including PLS data (PLS n+1) of the (n+1)th frame and PLS data of an (n+2)th frame (next frame). A detailed description is now given of FIG. 40.

FIG. 40(a) illustrates the structure in which PLS n for the nth frame, PLS n+1 for the (n+1)th frame, and PLS n+2 for the (n+2)th frame are encoded. The FEC encoder module according to another embodiment of the present invention may output an LDPC code by encoding static PLS signaling data and dynamic PLS signaling data together. PLS n including physical signaling data of the nth frame may include static PLS signaling data (marked as "stat"), dynamic PLS signaling data (marked as "dyn"), and parity data (marked as "parity"). Likewise, each of PLS n+1 and PLS n+2 including physical signaling data of the (n+1)th frame and the (n+2)th frame may include static PLS signaling data (marked as "stat"), dynamic PLS signaling data (marked as "dyn"), and parity data (marked as "parity"). In FIG. 40(a), I includes static PLS signaling data and dynamic PLS signaling data, and P includes parity data.

FIG. 40(b) illustrates an example of PLS formatting for splitting the data illustrated in FIG. 40(a) to locate the data in frames.

If PLS data transmitted by a transmitter is split according to whether the PLS data is changed for each frame and then transmitted by excluding redundancy data which is not changed in every frame, a receiver may have a higher PLS decoding performance. Accordingly, PLS n and PLS n+1 are mapped to the nth frame using PLS repetition, the frame structure module according to an embodiment of the present invention may split PLS n+1 to include the dynamic PLS signaling data of PLS n+1 and the parity data of PLS n+1 excluding the static PLS signaling data of PLS n+1 which is repeated from the static PLS signaling data of PLS n. A splitting scheme for transmitting PLS data of a next frame in a current frame by the frame structure module may be called PLS formatting.

Here, when the frame structure module splits PLS n+1 to be mapped to the nth frame, the parity data of PLS n+1 may be determined as a part of parity data (marked as "P") illustrated in FIG. 40(a), and the size thereof can scalably vary. Parity bits of PLS data of a next frame to be transmitted in a current frame, which are determined by the frame structure module due to PLS formatting, may be called scalable parity.

FIG. 40(c) illustrates an example in which data split in FIG. 40(b) is located in the nth frame and the (n+1)th frame.

Each frame may include a preamble, PLS-pre, PLS and service data (marked as "Data n"). A description is now given of the detailed stricture of each frame illustrated in FIG. 40(c). The nth frame illustrated in FIG. 40(c) may include a preamble, PLS-pre, encoded PLS n, a part of encoded PLS n+1 40000, and service data (marked as "Data n"). Likewise, the (n+1)th frame may include a preamble, PLS-pre, encoded PLS n+1 40010, a part of encoded PLS n+2, and service data (marked as "Data n+1"). In the following description according to an embodiment of the present invention, a preamble may include PLS-pre.

PLS n+1 included in the nth frame is different from that included in the (n+1)th frame in FIG. 40(c). PLS n+1 40000 included in the nth frame is split due to PLS formatting and does not include static PLS signaling data while PLS n+1 40010 includes static PLS signaling data.

When scalable parity is determined, the frame structure module may maintain the robustness of PLS n+1 40000 included in the nth frame in such a manner that a receiver can decode PLS n+1 included in the nth frame before receiving the (n+1)th frame and may consider a diversity gain achievable when PLS n+1 40000 included in the nth frame and PLS n+1 40010 included in the (n+1)th frame are decoded in the (n+1)th frame.

If parity bits of PLS n+1 40000 included in the nth frame are increased, data (Data n+1) included in the (n+1)th frame may be rapidly decoded based on data achieved by decoding PLS n+1 40000 included in the nth frame before the (n+1)th frame is received. On the other hand, scalable parity included in PLS n+1 40000 may be increased and thus data transmission may be inefficient. Further, if small scalable parity of PLS n+1 40000 is transmitted in the n frame to achieve a diversity gain for decoding PLS n+1 40010 included in the (n+1)th frame, the effect of rapidly decoding service data (Dana n+1) included in the (n+1)th frame by previously decoding PLS n+1 40000 included in the n frame before the (n+1)th frame is received may be reduced.

To achieve an improved diversity gain by a receiver, the frame structure module according to an embodiment of the present invention may determine the configuration of parity of PLS n+1 40000 included in the nth frame to be different from that of parity of PLS n+1 40010 included in the (n+1)th frame as much as possible in the PLS formatting procedure.

For example, if parity P of PLS n+1 includes 5 bits, the frame structure module may determine scalable parity of PLS n+1 which can be included in the nth frame as second and fourth bits and determine scalable parity of PLS n+1 which can be included in the (n+1)th frame as first, third and fifth bits. As such, if the frame structure module determines scalable parity bits not to overlap, a coding gain as well as a diversity gain may be achieved. According to another embodiment of the present invention, when the frame structure module performs PLS formatting, a diversity gain of a receiver may be maximized by soft-combining repeatedly transmitted information before LDPC decoding.

The frame structure illustrated in FIG. 40 is merely an exemplary embodiment of the present invention and may vary according to the intention of a designer. The order of PLS n and PLS n+1 40000 in the nth frame merely an example and PLS n+1 40000 may be located prior to PLS n according to the intention of a designer. This may be equally applied to the (n+1)th frame.

Figure 41:
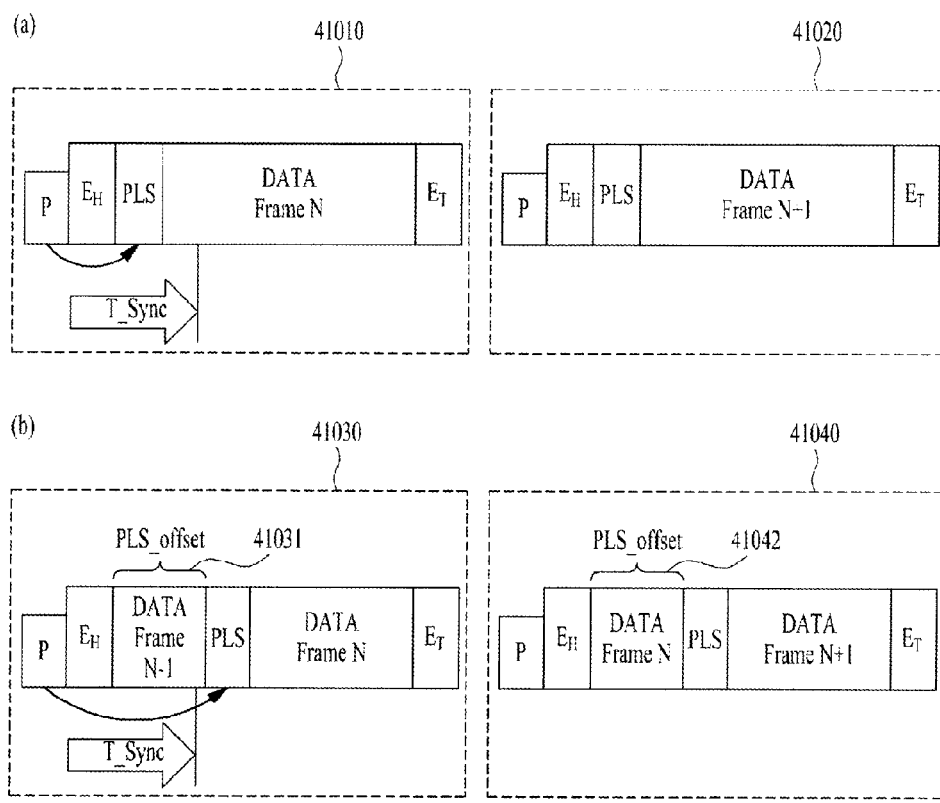
FIG. 41 illustrates signal frame structures according to another embodiment of the present invention.

FIG. 41 is a view illustrating signal frame structures according to another embodiment of the present invention.

Each of signal frames 41010 and 41020 illustrated in FIG. 41(*a*) may include a preamble P, head/tail edge symbols EH/ET, one or more PLS symbols PLS and a plurality of data symbols (marked as "DATA Frame N" and "DATA Frame N+1"). This is variable according to the intention of a designer. "T_Sync" marked in each signal frame of FIGS. 41(*a*) and 41(*b*) refers to a time necessary to achieve stable synchronization for PLS decoding based on information acquired from a preamble by a receiver. A description is now given of a method for allocating a PLS offset portion by the frame structure module to ensure T_Sync time.

The preamble is located at the very front of each signal frame and may transmit a basic transmission parameter for identifying a broadcast system and the type of signal frame, information for synchronization, information about modulation and coding of a signal included in the frame, etc. The basic transmission parameter may include FFT size, guard interval information, pilot pattern information, etc. The information for synchronization may include carrier and phase, symbol timing and frame information. Accordingly, a broadcast signal reception apparatus according to another embodiment of the present invention may initially detect the preamble of the signal frame, identify the broadcast system and the frame type, and selectively receive and decode a broadcast signal corresponding to a receiver type.

Further, the receiver may acquire system information using information of the detected and decoded preamble, and may acquire information for PLS decoding by additionally performing a synchronization procedure. The receiver may perform PLS decoding based on the information acquired by decoding the preamble.

To perform the above-described function of the preamble, the preamble may be transmitted with a robustness several dB higher than that of service data. Further, the preamble should be detected and decoded prior to the synchronization procedure.

FIG. 41(*a*) illustrates the structure of signal frames in which PLS symbols are mapped subsequently to the preamble symbol or the edge symbol EH. Since the receiver completes synchronization after a time corresponding to T_Sync, the receiver may not decode the PLS symbols immediately after the PLS symbols are received. In this case, a time for receiving one or more signal frames may be delays until the receiver decodes the received PLS data. Although a buffer may be used for a case in which synchronization is not completed before PLS symbols of a signal frame are received, a problem in which a plurality of buffers are necessary may be caused.

Each of signal frames 41030 and 41040 illustrated in FIG. 41(*b*) may also include the symbols P, EH, ET, PLS and DATA Frame N illustrated in FIG. 41(*a*).

The frame structure module according to another embodiment of the present invention may configure a PLS offset portion 41031 or 41042 between the head edge symbol EH and the PLS symbols PLS of the signal frame 41030 or 41040 for rapid service acquisition and data decoding. If the frame structure module configures the PLS offset portion 41031 or 41042 in the signal frame, the preamble may include PLS offset information PLS_offset. According to an embodiment of the present invention, the value of PLS_offset may be defined as the length of OFDM symbols used to configure the PLS offset portion.

Due to the PLS offset portion configured in the signal frame, the receiver may ensure T_Sync corresponding to a time for detecting and decoding the preamble.

A description is now given of a method for determining the value of PLS_offset.

The length of an OFDM symbol in the signal frame is defined as T_Symbol. If the signal frame does not include the edge symbol EH, the length of OFDM symbols including the PLS_offset (the value of PLS_offset) may be determined as a value equal to or greater than a ceiling value (or rounded-up value) of T_Sync/T_Symbol.

If the signal frame includes the edge symbol EH, the length of OFDM symbols including PLS_offset may be determined as a value equal to or greater than (a ceiling value (or rounded-up value) of T_Sync/T_Symbol)−1.

Accordingly, the receiver may know of the structure of the received signal frame based on data including the value of PLS_offset which is acquired by detecting and decoding the preamble. If the value of PLS_offset is 0, it can be noted that the signal frame according to an embodiment of the present invention has a structure in which the PLS symbols are sequentially mapped subsequently to the preamble symbol. Alternatively, if the value of PLS_offset is 0 and the signal frame includes the edge symbol, the receiver may know of the signal frame has a structure in which the edge symbol and the PLS symbols are sequentially mapped subsequently to the preamble symbol.

The frame structure module may configure the PLS offset portion 41031 to be mapped to the data symbols DATA Frame N or the PLS symbols PLS. Accordingly, as illustrated in FIG. 41(*b*), the frame structure module may allocate data symbols to which data of a previous frame (e.g., Frame N−1) is mapped, to the PLS offset portion. Alternatively, although not shown in FIG. 41(*b*), the frame structure module may allocate PLS symbols to which PLS data of a next frame is mapped, to the PLS offset portion.

The frame structure module may perform one or more quantization operations on PLS_offset to reduce signaling bits of the preamble.

A description is now given of an example in which the frame structure module allocates 2 bits of PLS_offset to the preamble to be signaled.

If the value of PLS_offset is "00", the length of the PLS offset portion is 0. This means that the PLS data is mapped in the signal frame immediately next to the preamble or immediately next to the edge symbol if the edge symbol is present.

If the value of PLS_offset is "01", the length of the PLS_offset portion is ¼*L_Frame. Here, L_Frame refers to the number of OFDM symbols which can be included in a frame.

If the value of PLS_offset is "10", the length of the PLS offset portion is 2/4*L_Frame.

If the value of PLS_offset is "11", the length of the PLS offset portion is ¾*L_Frame.

The above-described method for determining the value of PLS_offset and the length of the PLS offset portion by the frame structure module is merely an exemplary embodiment, and terms and values thereof may vary according to the intention of a designer.

As described above, FIG. 41 illustrates a frame structure in a case when a time corresponding to a plurality of OFDM symbols (PLS_offset) is taken for synchronization after the preamble is detected and decoded. After the preamble is detected and decoded, the receiver may compensate integer frequency offset, fractional frequency offset and sampling frequency offset for a time for receiving a plurality of OFDM symbols (PLS_offset) based on information such as a continual pilot and a guard interval.

A description is now given of an effect achievable when the frame structure module according to an embodiment of the present invention ensures T_Sync by allocating the PLS offset portion to the signal frame.

If the signal frame includes the PLS offset portion, a reception channel scanning time and a service data acquisition time taken by the receiver may be reduced.

Specifically, PLS information in the same frame as the preamble detected and decoded by the receiver may be decoded within a time for receiving the frame, and thus the channel scanning time may be reduced. In future broadcast systems, various systems can transmit data in a physical frame using TDM and thus the complexity of channel scanning is increased. As such, if the structure of the signal frame to which the PLS offset portion is allocated according to an embodiment of the present invention is used, the channel scanning time may be reduced more.

Further, compared to the structure of the signal frame to which the PLS offset portion is not allocated (FIG. 41(*a*)), in the structure of the signal frame to which the PLS offset portion is allocated (FIG. 41(*b*)), the receiver may expect a service data acquisition time gain corresponding to the difference between the length of the signal frame and the length of the PLS_offset portion.

The above-described effect of allocating the PLS offset portion may be achieved in a case when the receiver cannot decode PLS data in the same frame as the received preamble symbol. If the frame structure module can be designed to decode the preamble and the edge symbol without allocating the PLS offset portion, the value of PLS_offset may be set to 0.

Figure 42:
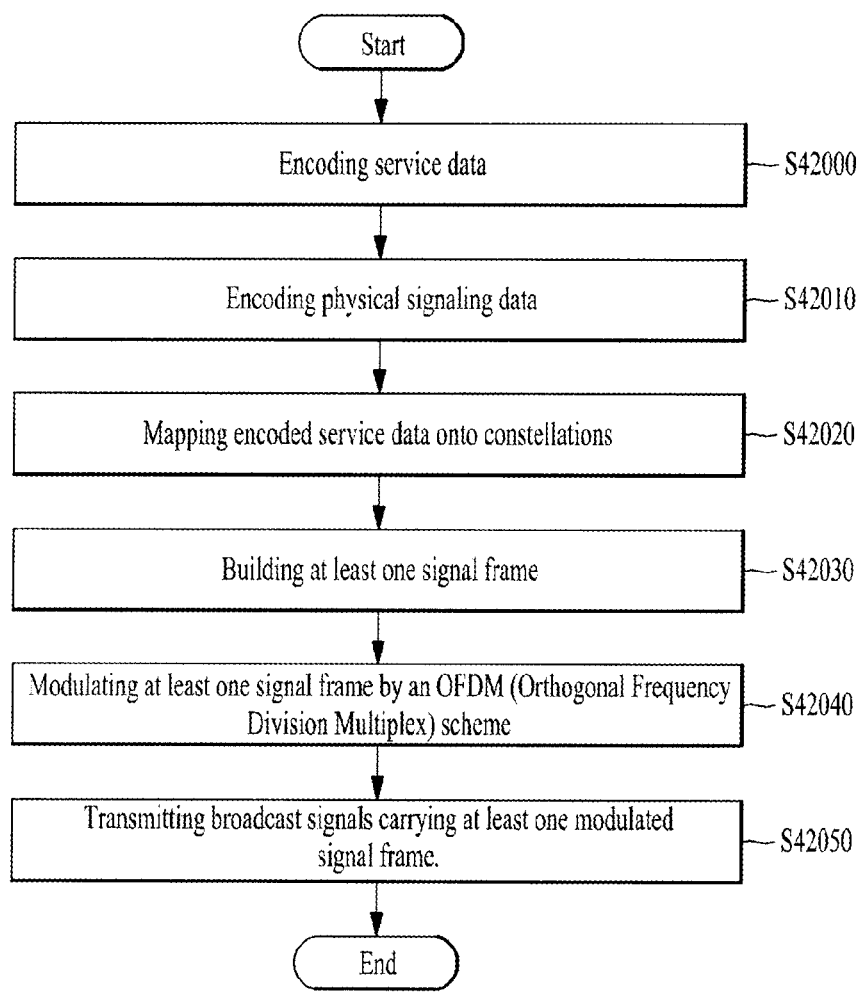
FIG. 42 illustrates a flowchart of a broadcast signal transmission method according to another embodiment of the present invention.

FIG. 42 is a flowchart of a broadcast signal transmission method according to another embodiment of the present invention.

A broadcast signal transmission apparatus according to an embodiment of the present invention may encode service data for transmitting one or more broadcast service components (S42000). The broadcast service components may correspond to broadcast service components for a fixed receiver and each broadcast service component may be transmitted on a frame basis. The encoding method is as described above.

Then, the broadcast signal transmission apparatus according to an embodiment of the present invention may encode physical signaling data into an LDPC code based on shortening and puncturing. Here, the physical signaling data is encoded based on a code rate determined based on the size of physical signaling data (S42010). To determine the code rate and encode the physical signaling data by the broadcast signal transmission apparatus according to an embodiment of the present invention, as described above in relation to FIGS. 36 to 39, the LDPC encoder module may LDPC-encode input PLS data or BCH-encoded PLS data based on a shortened/punctured LDPC code and output the LDPC-encoded PLS data. LDPC encoding may be performed based on one of mother code types having different code rates according to the size of input physical signaling data including BCH parity.

Then, the broadcast signal transmission apparatus according to an embodiment of the present invention may map the encoded service data onto constellations (S42020). The mapping method is as described above in relation to FIGS. 16 to 35.

Then, the broadcast signal transmission apparatus according to an embodiment of the present invention builds at least one signal frame including preamble data, the physical signaling data and the mapped service data (S42030). To build the signal frame by the broadcast signal transmission apparatus according to an embodiment of the present invention, as described above in relation to FIGS. 40 and 41, PLS repetition for including two or more pieces of physical signaling data including information about two or more frames in a single frame may be used. Further, the broadcast signal transmission apparatus according to an embodiment of the present invention may configure an offset portion in a front part of physical signaling data for a current frame mapped to the signal frame, and map service data of a previous frame or physical signaling data of a next frame to the offset portion.

Then, the broadcast signal transmission apparatus according to an embodiment of the present invention may modulate the built signal frame using OFDM (S42040).

Then, the broadcast signal transmission apparatus according to an embodiment of the present invention may transmit one or more broadcast signals carrying the modulated signal frame (S42050).

FIG. 43 is a flowchart of a broadcast signal reception method according to another embodiment of the present invention.

The broadcast signal reception method of FIG. 43 corresponds to an inverse procedure of the broadcast signal transmission method described above in relation to FIG. 42.

The broadcast signal reception apparatus according to an embodiment of the present invention may receive one or more broadcast signals (S43000). Then, the broadcast signal reception apparatus according to an embodiment of the present invention may demodulate the received broadcast signals using OFDM (S43010).

Then, the broadcast signal reception apparatus according to an embodiment of the present invention may parse at least one signal frame from the demodulated broadcast signals. Here, the signal frame parsed from the broadcast signals may include preamble data, physical signaling data and service data (S43020). To build the signal frame by the broadcast signal transmission apparatus according to an embodiment of the present invention, as described above in relation to FIGS. 40 and 41, PLS repetition for including two or more pieces of physical signaling data including information about two or more frames in a single frame may be used. Further, the broadcast signal transmission apparatus according to an embodiment of the present invention may configure an offset portion in a front part of physical signaling data for a current frame mapped to the signal frame, and map service data of a previous frame or physical signaling data of a next frame to the offset portion. Then, the broadcast signal reception apparatus according to an embodiment of the present invention may decode the physical signaling data based on LDPC. Here, the physical signaling data is a shortened/punctured LDPC code encoded based on a code rate determined based on the size of the physical signaling data (S43030). To determine the code rate and decode the physical signaling data, as described above in relation to FIGS. 36 to 39, the LDPC decoder module may LDPC-decode input PLS data or BCH-encoded PLS data based on a shortened/punctured LDPC code and output the LDPC-decoded PLS data. LDPC decoding may be performed based on different code rates according to the size of physical signaling data including BCH parity.

Then, the broadcast signal reception apparatus according to an embodiment of the present invention may demap the service data included in the signal frame (S43040).

Then, the broadcast signal reception apparatus according to an embodiment of the present invention may decode the service data for transmitting one or more broadcast service components (S43050).

While the present invention has been described with reference to separate drawings for convenience's sake, a new embodiment may be implemented by combining embodiments described in the drawings. When needed, designing a computer-readable recording medium having recorded thereon a program for executing the afore-described embodiments of the present invention may fall within the scope of the present invention.

The apparatus and method according to the present invention are not limited to the above-described embodiments. The whole or part of each embodiment may be selectively combined with that of another embodiment so as to make various modifications to the embodiments.

The broadcast signal transmission/reception method according to the present invention can also be embodied as processor-readable code on a processor-readable recording medium. The processor-readable recording medium is any data storage device that can store data which can be thereafter read by a processor. Examples of the processor-readable recording medium include read-only memory (ROM), random-access memory (RAM), magnetic tapes, floppy disks, optical data storage devices and carrier waves (e.g., transmission through the Internet). The processor-readable recording medium can also be distributed over network coupled computer systems so that the processor-readable code is stored and executed in a distributed fashion.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

In addition, the disclosure describes both a product invention as well as a method invention, and descriptions of both inventions may be complementarily applied as needed.

What is claimed is:

1. A method for transmitting broadcast signals by an apparatus for transmitting broadcast signals, the method comprising:
encoding service data corresponding to each of data transmission units;
encoding physical signaling data with a shortening scheme and a puncturing scheme;
interleaving the encoded service data;
building at least one signal frame including preamble symbols including preamble data and data symbols including the interleaved service data;
modulating data of the at least one signal frame by an Orthogonal Frequency Division Multiplex (OFDM) scheme; and
transmitting the broadcast signals carrying the modulated data of the at least one signal frame,
wherein the preamble data of a current signal frame includes the encoded physical signaling data for the service data of the current signal frame,
wherein a part of parity data of the encoded physical signaling data for the service data of a next signal frame following the current signal frame is appended separately after the encoded physical signaling data for the service data of the current signal frame, and
wherein the at least one signal frame further includes a first edge symbol preceding the data symbols and a second edge symbol following the data symbols.

2. The method of claim 1, the method further comprising:
adding additional parity bits to the encoded physical signaling data, wherein the additional parity bits are generated based on punctured parity bits according to the puncturing scheme.

3. The method of claim 1, wherein pilots of the first and second edge symbols are denser than pilots of the data symbols.

4. A method for receiving broadcast signals by an apparatus for receiving broadcast signals, the method comprising:
receiving the broadcast signals;
demodulating the received broadcast signals by an Orthogonal Frequency Division Multiplex (OFDM);
parsing at least one signal frame from the demodulated broadcast signals including preamble symbols including preamble data and data symbols including service data;
decoding the preamble data with a shortening scheme and a puncturing scheme;
deinterleaving the service data; and
decoding the deinterleaved service data corresponding to each of data transmission units,
wherein the preamble data of a current signal frame includes physical signaling data for the service data of the current signal frame,
wherein a part of parity data of the physical signaling data for the service data of a next signal frame following the current signal frame is appended separately after the physical signaling data for the service data of the current signal frame, and
wherein the at least one signal frame further includes a first edge symbol preceding the data symbols and a second edge symbol following the data symbols.

5. The method of claim 4, wherein the physical signaling data includes additional parity bits, wherein the additional parity bits are generated based on punctured parity bits according to the puncturing scheme.

6. The method of claim 4, wherein pilots of the first and second edge symbols are denser than pilots of the data symbols.

7. An apparatus for transmitting broadcast signals, the apparatus comprising:
an encoder to encode service data corresponding to each of data transmission units;
an encoder to encode physical signaling data with a shortening scheme and a puncturing scheme;
an interleaver to interleave the encoded service data;
a frame builder to build at least one signal frame including preamble symbols including preamble data and data symbols including the interleaved service data;
a modulator to modulate data of the at least one signal frame by an Orthogonal Frequency Division Multiplex (OFDM) scheme; and
a transmitter to transmit the broadcast signals carrying the modulated data of the at least one signal frame,
wherein the preamble data of a current signal frame includes the encoded physical signaling data for the service data of the current signal frame,
wherein a part of parity data of the encoded physical signaling data for the service data of a next signal frame following the current signal frame is appended separately after the encoded physical signaling data for the service data of the current signal frame, and wherein the at least one signal frame further includes a first edge symbol preceding the data symbols and a second edge symbol following the data symbols.

8. The apparatus of claim 7, wherein the encoded physical signaling data includes additional parity bits, wherein the additional parity bits are generated based on punctured parity bits according to the puncturing scheme.

9. The apparatus of claim 7, wherein pilots of the first and second edge symbols are denser than pilots of the data symbols.

10. An apparatus for receiving broadcast signals, the apparatus comprising:
a receiver to receive the broadcast signals;
a demodulator to demodulate the received broadcast signals by an Orthogonal Frequency Division Multiplex (OFDM) scheme;
a frame parser to parse at least one signal frame from the demodulated broadcast signals including preamble symbols including preamble data and data symbols including service data;
a decoder to decode the preamble data with a shortening scheme and a puncturing scheme;
a deinterleaver to deinterleave the service data; and
a decoder to decode the deinterleaved service data corresponding to each of data transmission units,
wherein the preamble data of a current signal frame includes physical signaling data for the service data of the current signal frame,
wherein a part of parity data of the physical signaling data for the service data of a next signal frame following the current signal frame is appended separately after the physical signaling data for the service data of the current signal frame, and
wherein the at least one signal frame further includes a first edge symbol preceding the data symbols and a second edge symbol following the data symbols.

11. The apparatus of claim 10, wherein the physical signaling data comprises additional parity bits, wherein the additional parity bits are generated based on punctured bits according to the puncturing scheme.

12. The apparatus of claim 10, wherein pilots of the first and second edge symbols are denser than pilots of the data symbols.

* * * * *

UNITED STATES PATENT AND TRADEMARK OFFICE
CERTIFICATE OF CORRECTION

| | |
|---|---|
| PATENT NO. | : 9,832,056 B2 |
| APPLICATION NO. | : 15/379150 |
| DATED | : November 28, 2017 |
| INVENTOR(S) | : Jinwoo Kim et al. |

It is certified that error appears in the above-identified patent and that said Letters Patent is hereby corrected as shown below:

In the Claims
Column 49, Lines 63-64, of Claim 1, replace "the encoded physical signaling data" with --encoded physical signaling data--.
Column 49, Line 64, of Claim 1, replace "the service data" with --service data--.
Column 50, Lines 29-30, of Claim 4, replace "the current signal frame, wherein a part of parity data" with --the current signal frame, and a part of parity data--.
Column 50, Line 30, of Claim 4, replace "the physical signaling data" with --physical signaling data--.
Column 50, Line 31, of Claim 4, replace "for the service data" with --for service data--.
Column 50, Line 32, of Claim 4, replace "current signal frame is appended separately" with --current signal frame appended separately--.
Column 50, Lines 63-64, of Claim 7, replace "the encoded physical signaling data" with --encoded physical signaling data--.
Column 50, Line 64, of Claim 7, replace "the service data" with --service data--.
Column 52, Lines 6-7, of Claim 10, replace "the current signal frame, wherein a part of parity data" with --the current signal frame, and a part of parity data--.
Column 52, Line 7, of Claim 10, replace "the physical signaling data" with --physical signaling data--.
Column 52, Line 8, of Claim 10, replace "for the service data" with --for service data--.
Column 52, Lines 9, of Claim 10, replace "current signal frame is appended separately" with --current signal frame appended separately--.

Signed and Sealed this
Second Day of August, 2022

Katherine Kelly Vidal
*Director of the United States Patent and Trademark Office*